US011444101B2

(12) United States Patent
Sato et al.

(10) Patent No.: US 11,444,101 B2
(45) Date of Patent: Sep. 13, 2022

(54) SPACERLESS SOURCE CONTACT LAYER REPLACEMENT PROCESS AND THREE-DIMENSIONAL MEMORY DEVICE FORMED BY THE PROCESS

(71) Applicant: SANDISK TECHNOLOGIES LLC, Addison, TX (US)

(72) Inventors: Jo Sato, Yokkaichi (JP); Kota Funayama, Yokkaichi (JP); Tatsuya Hinoue, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 63 days.

(21) Appl. No.: 17/038,870

(22) Filed: Sep. 30, 2020

(65) Prior Publication Data

US 2021/0408035 A1 Dec. 30, 2021

Related U.S. Application Data

(63) Continuation-in-part of application No. 16/916,476, filed on Jun. 30, 2020.

(51) Int. Cl.
*H01L 27/11582* (2017.01)
*H01L 27/1157* (2017.01)
(Continued)

(52) U.S. Cl.
CPC .... *H01L 27/11582* (2013.01); *H01L 23/5226* (2013.01); *H01L 27/1157* (2013.01);
(Continued)

(58) Field of Classification Search
CPC ......... H01L 27/11556; H01L 21/76877; H01L 21/76802; H01L 27/11582; G11C 5/025; G11C 5/06
See application file for complete search history.

(56) References Cited

U.S. PATENT DOCUMENTS 5,915,167 A 6/1999 Leedy
9,548,091 B2 1/2017 Shin et al.
(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Karen Kusumakar
(74) *Attorney, Agent, or Firm* — The Marbury Law Group PLLC

(57) ABSTRACT

A lower source-level dielectric etch-stop layer, a source-level sacrificial layer, and an upper source-level dielectric etch-stop layer are formed over a substrate. An alternating stack of insulating layers and sacrificial material layers is formed thereabove. Memory stack structures are formed through the alternating stack. Backside openings are formed through the alternating stack and into the in-process source-level material layers such that tapered surfaces are formed through the upper source-level dielectric etch-stop layer. A source cavity is formed by removing the source-level sacrificial layer, and a continuous source contact layer is formed in the source cavity and in peripheral portions of the backside openings. Portions of the continuous source contact layer overlying the tapered surfaces are removed by performing an isotropic etch process. Remaining portions of the continuous source contact layer comprise a source contact layer. The sacrificial material layers are replaced with electrically conductive layers.

21 Claims, 82 Drawing Sheets

(51) Int. Cl.

| | |
|---|---|
| ***H01L 27/11565*** | (2017.01) |
| ***H01L 27/11524*** | (2017.01) |
| ***H01L 27/11556*** | (2017.01) |
| ***H01L 27/11519*** | (2017.01) |
| ***H01L 23/522*** | (2006.01) |

(52) U.S. Cl.

CPC .. *H01L 27/11519* (2013.01); *H01L 27/11524* (2013.01); *H01L 27/11556* (2013.01); *H01L 27/11565* (2013.01)

(56) References Cited

U.S. PATENT DOCUMENTS

| | | | | |
|---|---|---|---|---|
| 9,922,987 | B1 | 3/2018 | Mizutani et al. | |
| 10,347,654 | B1 | 7/2019 | Iwai et al. | |
| 10,615,172 | B2 | 4/2020 | Nagata et al. | |
| 2006/0021665 | A1 | 2/2006 | Buyalsky | |
| 2015/0340074 | A1 | 11/2015 | Shin et al. | |
| 2016/0190155 | A1* | 6/2016 | Lee | H01L 27/1157 438/667 |
| 2018/0122904 | A1* | 5/2018 | Matsumoto | H01L 29/1037 |
| 2019/0006383 | A1 | 1/2019 | Matsuno | |
| 2019/0348435 | A1 | 11/2019 | Nagata et al. | |
| 2020/0020717 | A1 | 1/2020 | Lee et al. | |
| 2020/0027835 | A1 | 1/2020 | Hsu et al. | |
| 2020/0098780 | A1 | 3/2020 | Cui et al. | |

OTHER PUBLICATIONS

U.S. Appl. No. 16/394,233, filed Apr. 25, 2019, SanDisk Technologies LLC.

U.S. Appl. No. 16/800,078, filed Feb. 25, 2020, SanDisk Technologies LLC.

U.S. Appl. No. 16/800,097, filed Feb. 25, 2020, SanDisk Technologies LLC.

U.S. Appl. No. 16/916,476, filed Jun. 30, 2020, SanDisk Technologies LLC.

Notification of Transmittal of the International Search Report and the Written Opinion of the International Searching Authority for International Patent Application No. PCTUS2020/067134, dated Apr. 27, 2021, 12 pages.

* cited by examiner

SPACERLESS SOURCE CONTACT LAYER REPLACEMENT PROCESS AND THREE-DIMENSIONAL MEMORY DEVICE FORMED BY THE PROCESS

RELATED APPLICATIONS

This application is a continuation-in-part application of U.S. application Ser. No. 16/916,476 filed on Jun. 30, 2020, the entire contents of which are incorporated herein by reference.

FIELD

The present disclosure relates generally to the field of semiconductor devices, and particularly to a spacerless source contact layer replacement process and a three-dimensional memory device formed by the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: source-level material layers located over a substrate and comprising, from bottom to top, a lower source-level dielectric etch-stop layer, a source contact layer, and an upper source-level dielectric etch-stop layer; alternating stacks of insulating layers and electrically conductive layers located over the source-level material layers; backside trenches laterally extending along a first horizontal direction and vertically extending between the alternating stacks and through the upper source-level dielectric etch-stop layer, wherein segments of sidewalls of the backside trenches located on the upper source-level dielectric etch-stop layer are tapered at a first taper angle with respect to a vertical direction; memory openings vertically extending through the alternating stacks; and memory opening fill structures located in the memory openings and comprising a respective vertical semiconductor channel and a respective memory film, wherein the source contact layer laterally surrounds and contacts a bottom end portion of each of the vertical semiconductor channels.

According to another aspect of the present disclosure, a method of forming a three-dimensional memory device, which comprises: forming in-process source-level material layers comprising, from bottom to top, a lower source-level dielectric etch-stop layer, a source-level sacrificial layer, and an upper source-level dielectric etch-stop layer over a substrate; forming an alternating stack of insulating layers and sacrificial material layers over the in-process source-level material layers; forming memory openings through the alternating stack and into the in-process source-level material layers; forming memory opening fill structures in the memory openings, wherein each of the memory opening fill structures comprises a respective vertical semiconductor channel and a respective memory film; forming backside openings through the alternating stack and into the in-process source-level material layers; forming a source cavity by removing the source-level sacrificial layer selective to materials of the alternating stack, the upper source-level dielectric etch-stop layer, and the lower source-level dielectric etch-stop layer through the backside openings without sidewall spacers being located on the alternating stack in the backside openings; forming a continuous source contact layer in the source cavity and in peripheral portions of the backside openings; removing portions of the continuous source contact layer overlying the first tapered surfaces by performing an isotropic etch process, wherein remaining portions of the continuous source contact layer comprise a source contact layer; and replacing the sacrificial material layers with electrically conductive layers through the backside openings.

According to an embodiment of the present disclosure, a three-dimensional memory device is provided, which comprises: source-level material layers located over a substrate and comprising a source contact layer, wherein the source contact layer comprises a planar source contact layer portion and a plurality of source pillar portions laterally spaced apart from each other and adjoined to the planar source contact layer portion; alternating stacks of insulating layers and electrically conductive layers located over the source-level material layers, wherein a neighboring pair of alternating stacks is laterally spaced apart by a respective backside trench laterally extending along a first horizontal direction, and overlying top surfaces of the plurality of source pillar portions; memory openings vertically extending through a respective one of the alternating stacks; and memory opening fill structures located in the memory openings and comprising a vertical semiconductor channel and a memory film.

According to another embodiment of the present disclosure, a method of forming a three-dimensional memory device is provided, which comprises: forming in-process source-level material layers comprising a source-level sacrificial layer over a substrate; forming an alternating stack of insulating layers and sacrificial material layers over the in-process source-level material layers; forming memory openings and backside openings that extend through the alternating stack and into the in-process source-level material layers; forming memory opening fill structures in the memory openings, wherein each of the memory opening fill structures comprises a respective vertical semiconductor channel and a respective memory film; forming a source cavity by removing the source-level sacrificial layer employing an isotropic etch process that provides an isotropic etchant into the backside openings; forming a source contact layer in the source cavity and in lower portions of the backside openings; laterally expanding the backside openings, wherein each set of the backside openings that merges forms a respective backside trench; and replacing remaining portions of the sacrificial material layers with electrically conductive layers through the respective backside trench.

DETAILED DESCRIPTION

Figure 1A:
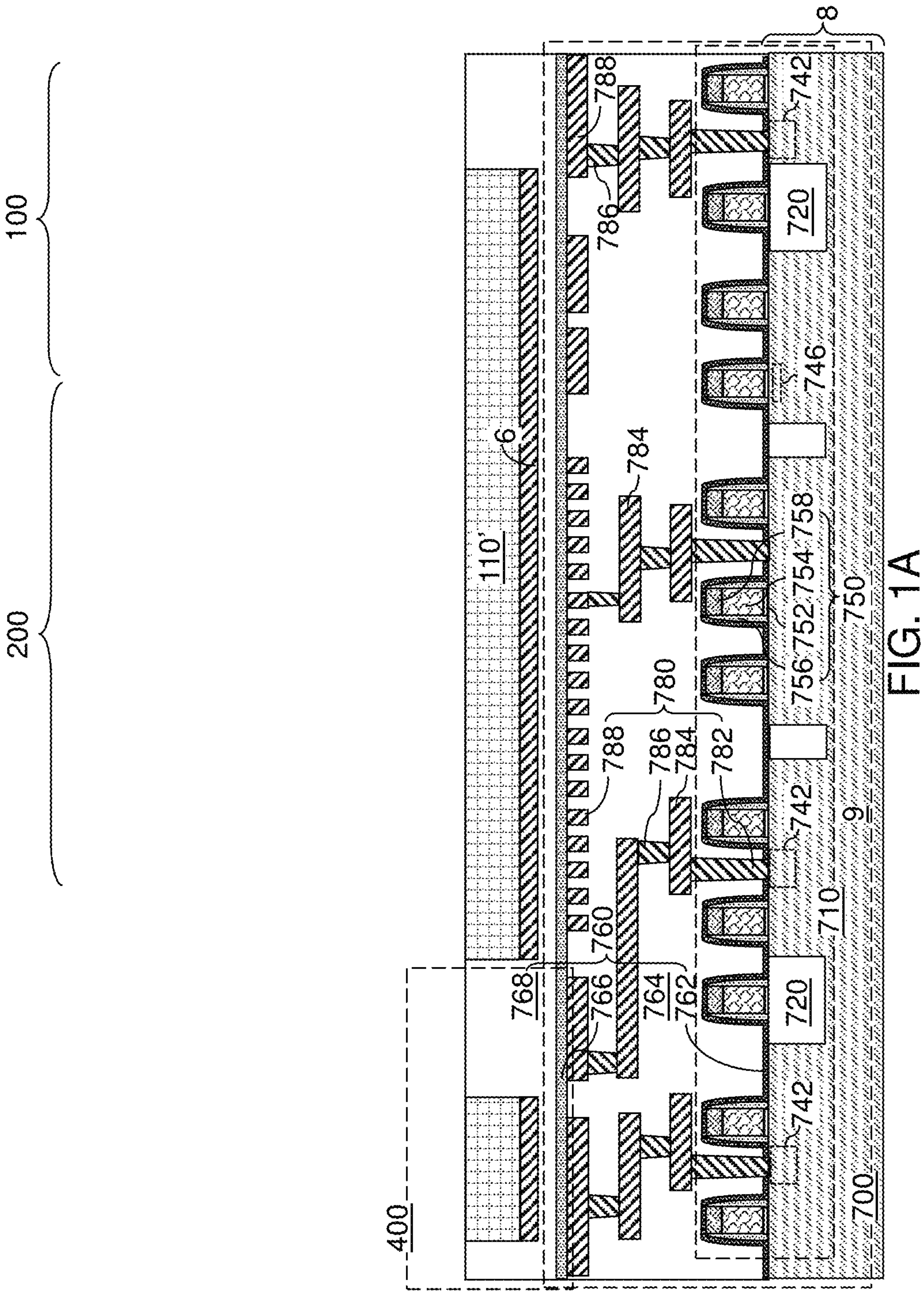
FIG. 1A is a vertical cross-sectional view of a first exemplary structure after formation of semiconductor devices, lower level dielectric layers, lower metal interconnect structures, and in-process source level material layers on a semiconductor substrate according to an embodiment of the present disclosure.

The embodiments of the present disclosure are directed to a spacerless source contact layer replacement process and a three-dimensional memory device formed by the same, the various aspects of which are described herein in detail. The drawings are not drawn to scale.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
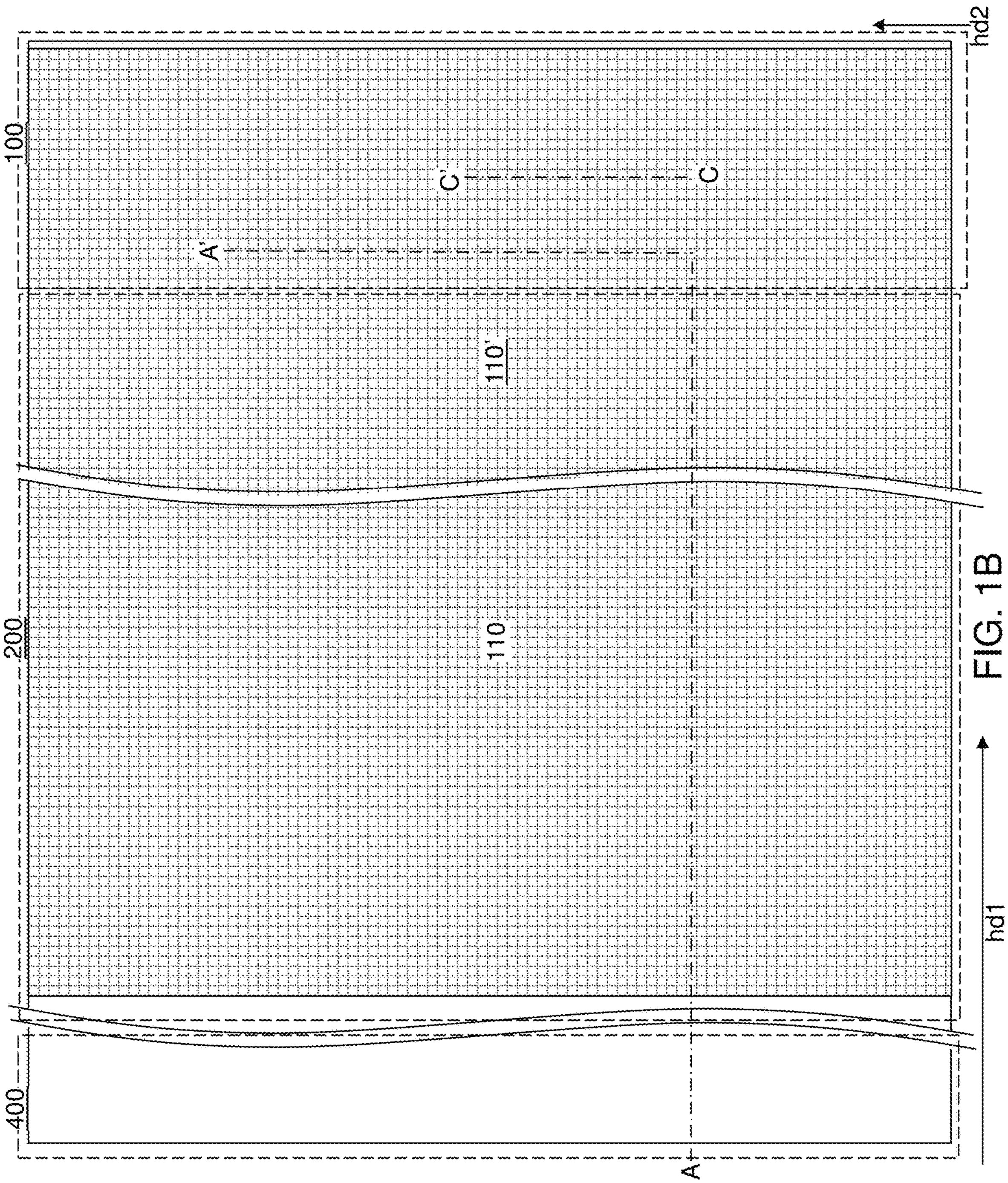
FIG. 1B is a top-down view of the first exemplary structure of FIG. 1A. The hinged vertical plane A-A' is the plane of the vertical cross-sectional view of FIG. 1A.
Figure 1C:
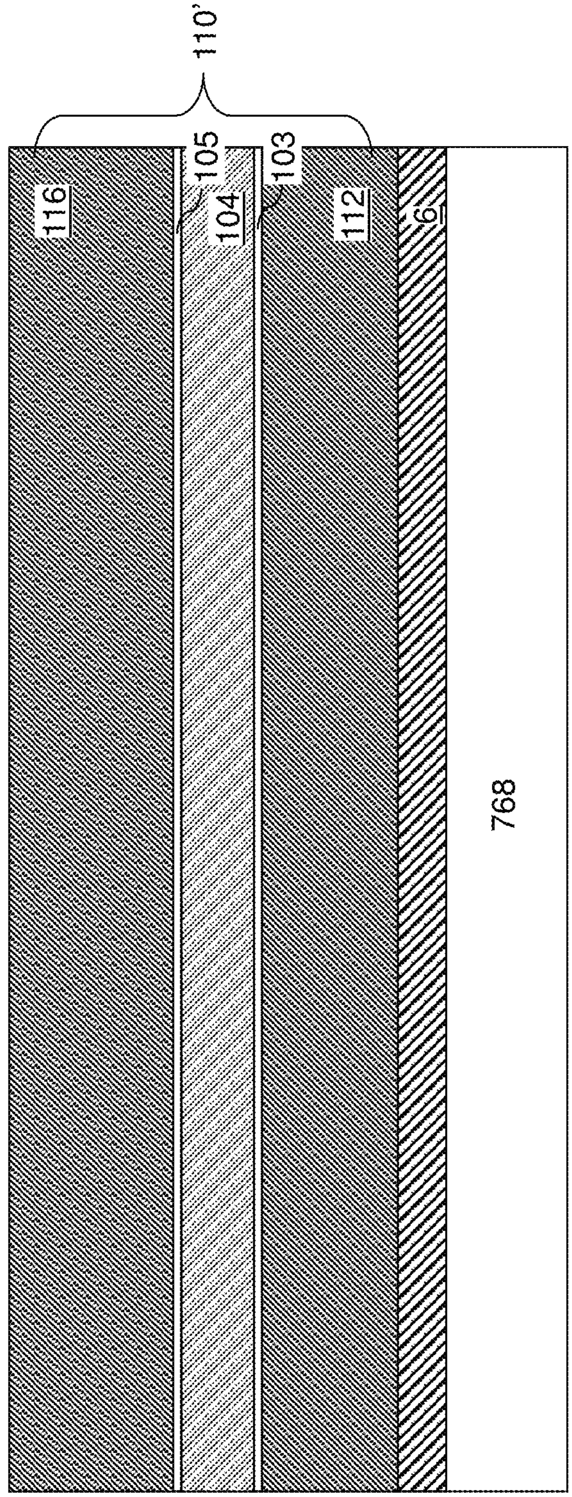
FIG. 1C is a magnified view of the in-process source level material layers along the vertical plane C-C' of FIG. 1B.

Referring to FIGS. 1A-1C, an first exemplary structure according to an embodiment of the present disclosure is illustrated. FIG. 1C is a magnified view of an in-process source-level material layers 110' illustrated in FIGS. 1A and 1B. The first exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric material layer 768, and is lithographically patterned to provide an optional conductive plate layer 6 and in-process source-level material layers 110'. The optional conductive plate layer 6, if present, provides a high conductivity conduction path for electrical current that flows into, or out of, the in-process source-level material layers 110'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch-stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, a lower sacrificial liner 103, a source-level sacrificial layer 104, an upper sacrificial liner 105, and an upper source-level semiconductor layer 116.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a doped silicate glass, such as borosilicate glass, phosphosilicate glass or borophosphosilicate glass. In another embodiment, the source-level sacrificial layer 104 may include a semiconductor material such as undoped amorphous silicon or a silicon-germanium alloy with an atomic concentration of germanium greater than 20%. In other embodiments, the source-level sacrificial layer 104 may include amorphous aluminum oxide (e.g., amorphous alumina) or titanium nitride. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide different from the material of the source-level sacrificial layer 104. In one embodiment, each of the lower sacrificial liner 103 and the upper sacrificial liner 105 may include a silicon oxide layer having a thickness in a range from 2 nm to 30 nm, although lesser and greater thicknesses may also be used.

The in-process source-level material layers 110' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 110' may be patterned to provide openings in areas in which through-memory-level contact via structures and through-dielectric contact via structures are to be subsequently formed. Patterned portions of the stack of the conductive plate layer 6 and the in-process source-level material layers 110' are present in each memory array region 100 in which three-dimensional memory stack structures are to be subsequently formed.

The optional conductive plate layer 6 and the in-process source-level material layers 110' may be patterned such that an opening extends over a staircase region 200 in which contact via structures contacting word line electrically conductive layers are to be subsequently formed. In one embodiment, the staircase region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 110' may be formed within the area of a memory array region 100, in which a three-dimensional memory array including memory stack structures is to be subsequently formed. A peripheral device region 400 that is subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

Figure 2:
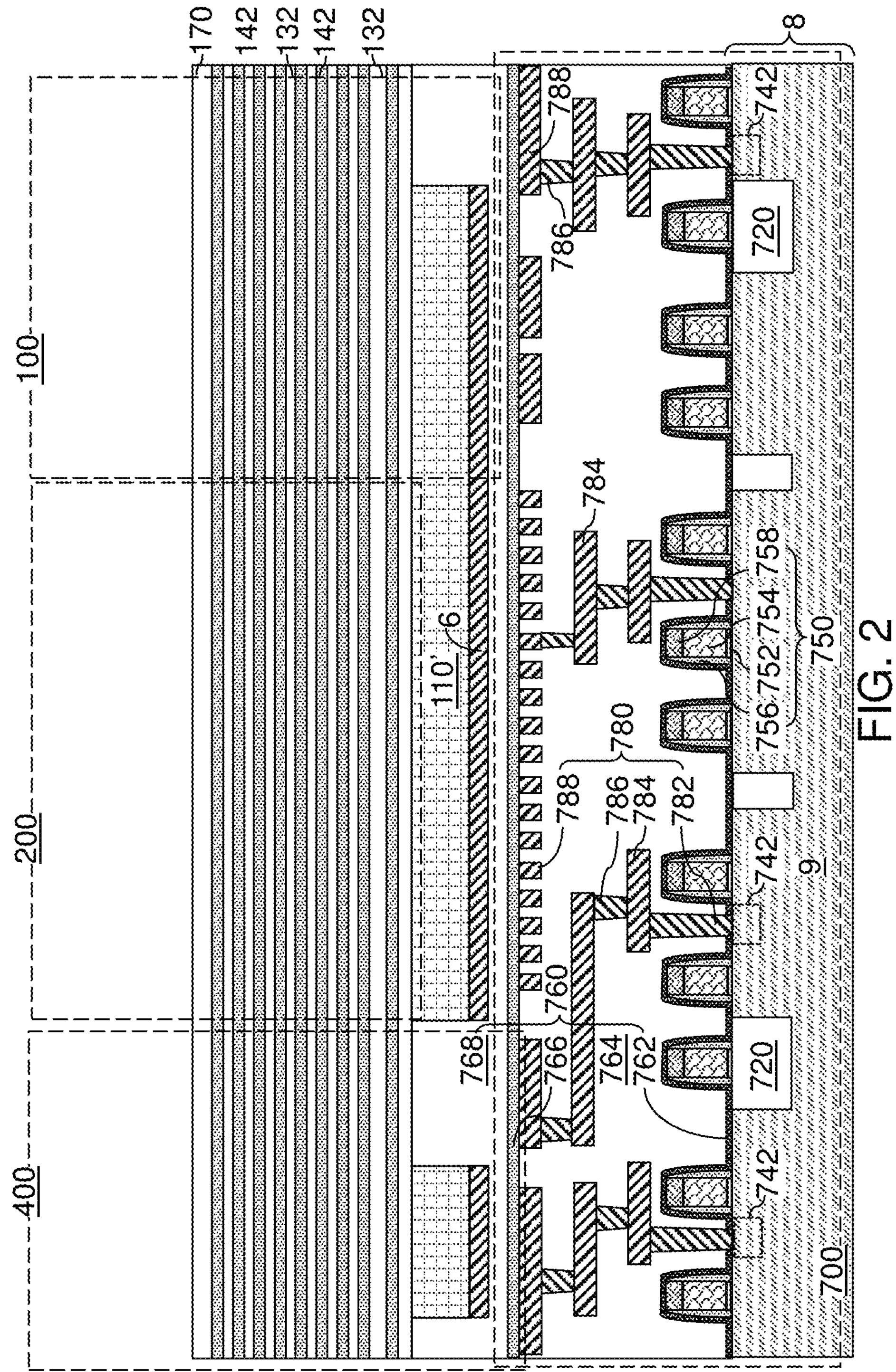
FIG. 2 is a vertical cross-sectional view of the first exemplary structure after formation of a first-tier alternating stack of first insulting layers and first spacer material layers according to an embodiment of the present disclosure.

Referring to FIG. 2, an alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 110'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first-tier alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 3:
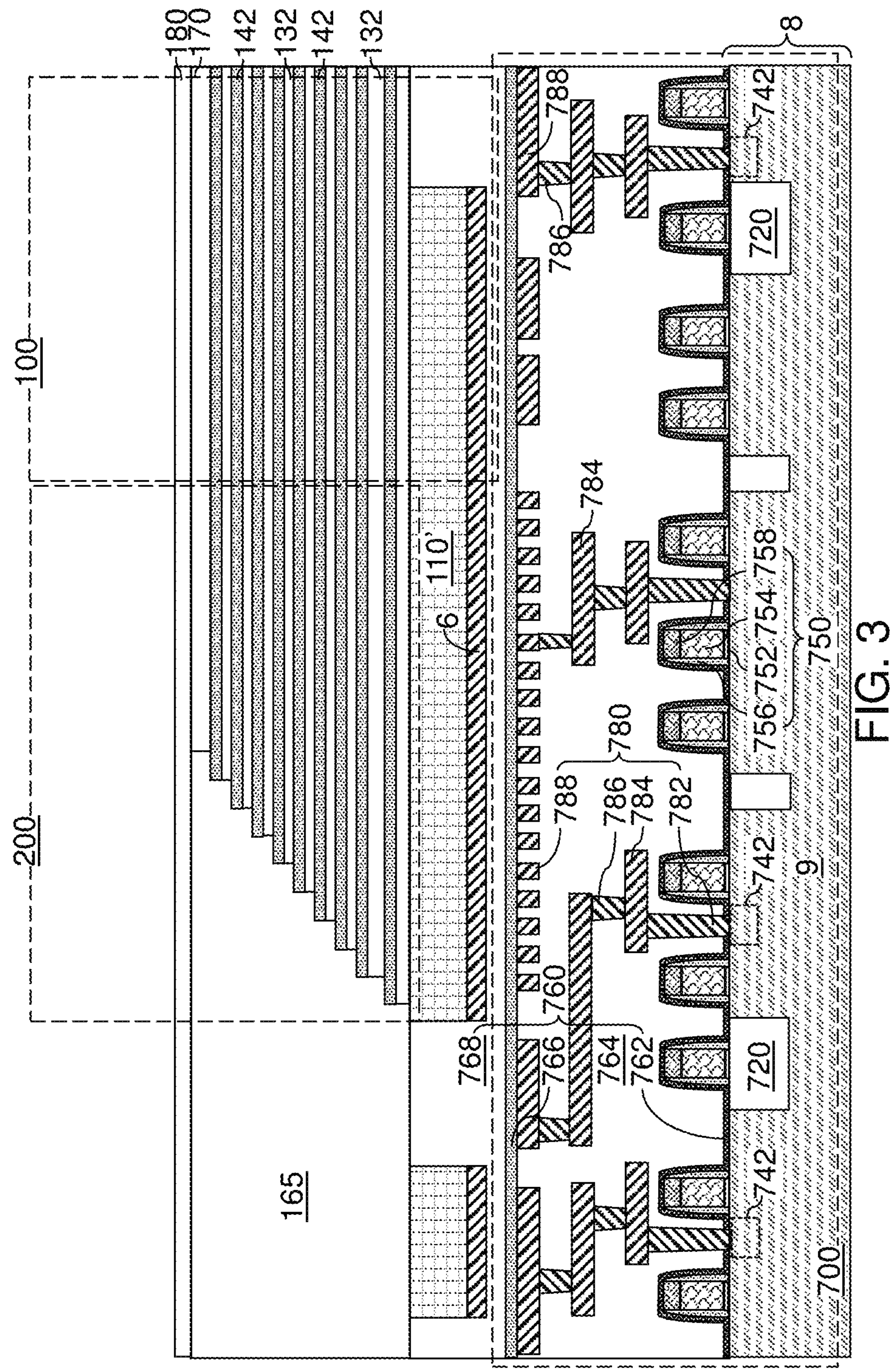
FIG. 3 is a vertical cross-sectional view of the first exemplary structure after patterning a first-tier staircase region, a first retro-stepped dielectric material portion, and an inter-tier dielectric layer according to an embodiment of the present disclosure.

Referring to FIG. 3, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
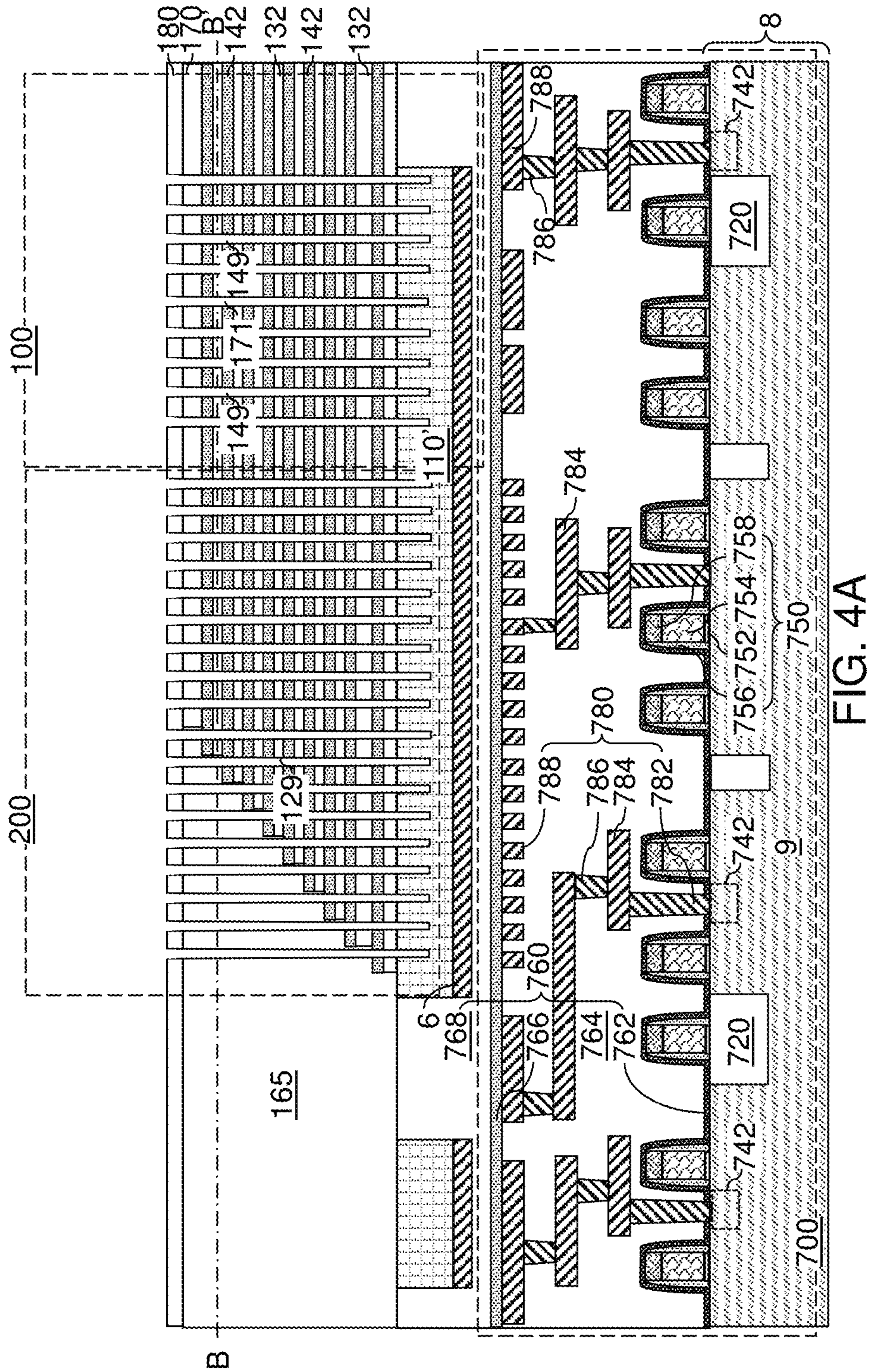
FIG. 4A is a vertical cross-sectional view of the first exemplary structure after formation of first-tier memory openings, first-tier support openings, and first-tier backside openings according to an embodiment of the present disclosure.
Figure 4B:
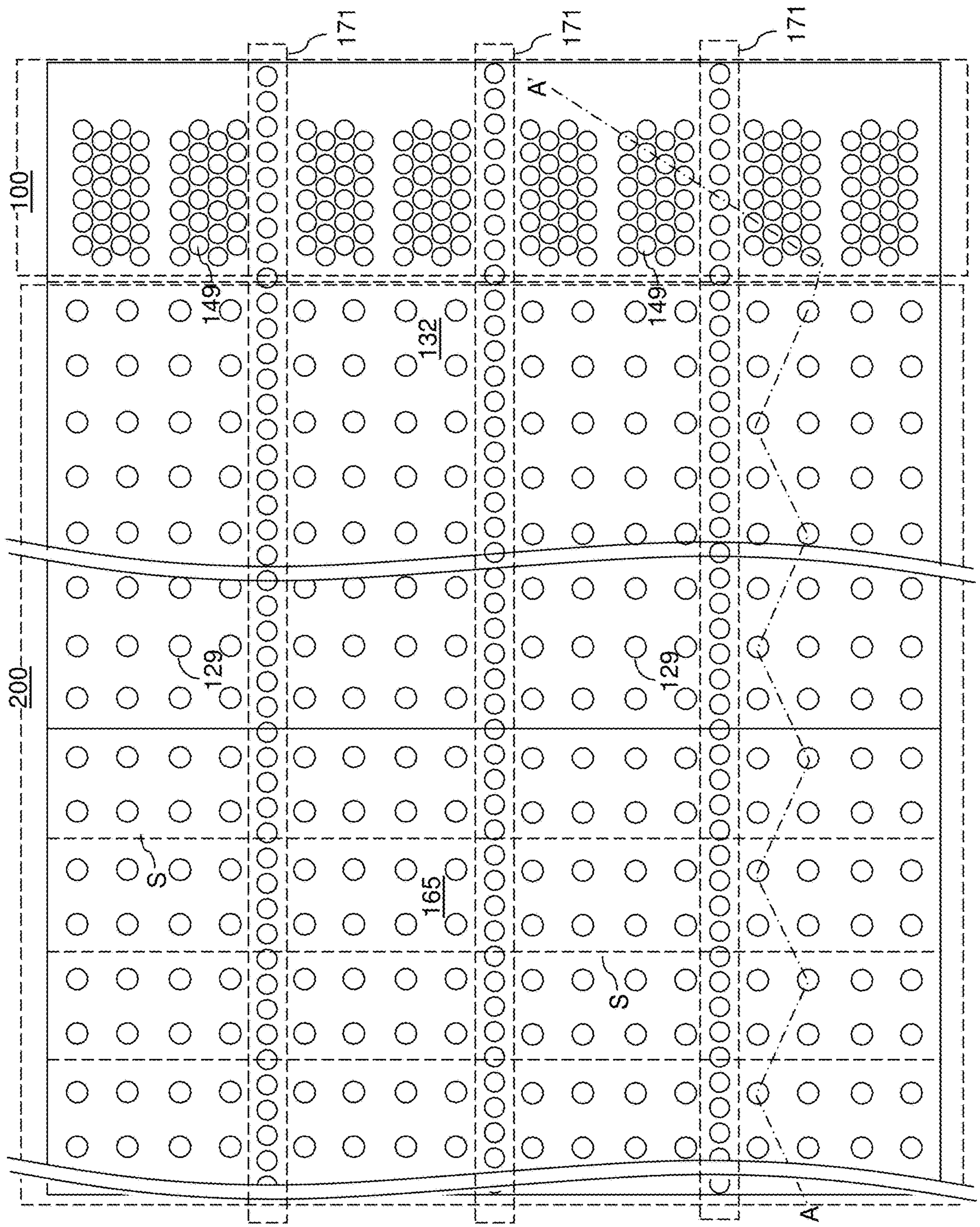
FIG. 4B is a horizontal cross-sectional view of the first exemplary structure of FIG. 4A. The hinged vertical plane A-A' corresponds to the plane of the vertical cross-sectional view of FIG. 4A.

Referring to FIGS. 4A and 4B, various first-tier openings (149, 129, 171) may be formed through the inter-tier dielectric layer 180 and the first-tier structure (132, 142, 170, 165) and into the in-process source-level material layers 110'. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the in-process source-level material layers 110' by a first anisotropic etch process to form the various first-tier openings (149, 129, 171) concurrently, i.e., during the first isotropic etch process. The various first-tier openings (149, 129, 171) may include first-tier memory openings 149, first-tier support openings 129, and first-tier backside openings 171. Locations of steps S in the first-tier alternating stack (132, 142) are illustrated as dotted lines in FIG. 4B. In an alternative embodiment, the first-tier backside openings 171 are not formed during this step and are instead formed during the step shown in FIGS. 12A and 12B and described in more detail below.

The first-tier memory openings 149 are openings that are formed in the memory array region 100 through each layer within the first-tier alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200, and are subsequently employed to form support pillar structures. A subset of the first-tier support openings 129 that is formed through the first retro-stepped dielectric material portion 165 may be formed through a respective horizontal surface of the first stepped surfaces.

The first-tier backside openings 171 are openings that are formed in the memory array region 100 and in the staircase region 200, and are subsequently employed to provide isotropic etchants for etching materials of the source-level sacrificial layer 104 and sacrificial material layers including the first sacrificial material layers 142. The first-tier backside openings 171 can be formed in rows that laterally extend along the first horizontal direction hd1. A cluster of first-tier memory openings 149 and a cluster of first-tier support openings 129 can be located between each laterally neighboring pair of rows of first-tier backside openings 171. The first-tier backside openings 171 can have circular or oval horizontal cross-sectional shapes. In an alternative embodiment, the first-tier backside openings 171 are not formed during this step and are instead formed during the step shown in FIGS. 12A and 12B and described in more detail below.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129, 171) may be substantially vertical, or may be tapered.

After etching through the alternating stack (132, 142) and the first retro-stepped dielectric material portion 165, the chemistry of a terminal portion of the first anisotropic etch process may be selected to etch through the dielectric material(s) of the at least one second dielectric layer 768 with a higher etch rate than an average etch rate for the in-process source-level material layers 110'. For example, the terminal portion of the anisotropic etch process may include a step that etches the dielectric material(s) of the at least one second dielectric layer 768 selective to a semiconductor material within a component layer in the in-process source-level material layers 110'. In one embodiment, the terminal portion of the first anisotropic etch process may etch through the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 110'. The photoresist layer may be subsequently removed, for example, by ashing.

Optionally, the portions of the first-tier memory openings 149. the first-tier support openings 129, and the first-tier backside openings 171 (if present) at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
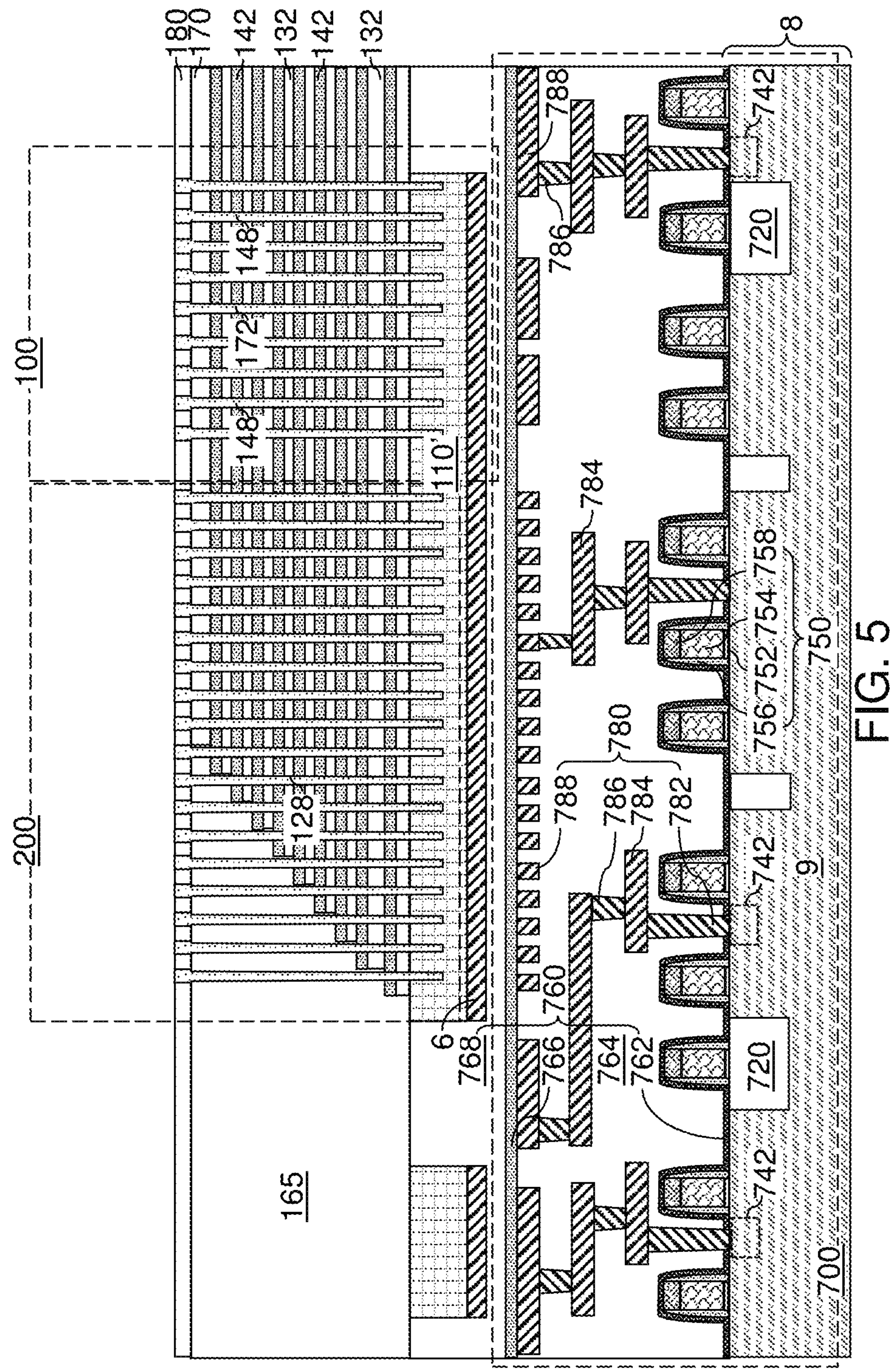
FIG. 5 is a vertical cross-sectional view of the first exemplary structure after formation of various first-tier opening fill structures according to an embodiment of the present disclosure.

Referring to FIG. 5, sacrificial first-tier opening fill structures (148, 128, 172) may be formed in the various first-tier openings (149, 129, 171). For example, a sacrificial first-tier fill material is deposited concurrently deposited in each of the first-tier openings (149, 129, 171). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., amorphous silicon or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include a carbon-containing material (such as amorphous carbon or diamond-like carbon) that may be subsequently removed by ashing, or a silicon-based polymer that may be subsequently removed selective to the materials of the first-tier alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch-stop layer or a planarization stop layer.

Remaining portions of the sacrificial first-tier fill material comprise sacrificial first-tier opening fill structures (148, 128, 172). Specifically, each remaining portion of the sacrificial first-tier fill material in a first-tier memory opening 149 constitutes a sacrificial first-tier memory opening fill structure 148. Each remaining portion of the sacrificial first-tier fill material in a first-tier support opening 129 constitutes a sacrificial first-tier support opening fill structure 128. Each remaining portion of the sacrificial first-tier fill material in a first-tier backside opening 171 (if present) constitutes a sacrificial first-tier backside opening fill structure 172. If first-tier backside openings 171 are not present at this step, then the sacrificial first-tier backside opening fill structure 172 is also omitted. The various sacrificial first-tier opening fill structures (148, 128, 172) are concurrently formed, i.e., during a same set of processes including the deposition process that deposits the sacrificial first-tier fill material and the planarization process that removes the first-tier deposition process from above the first-tier alternating stack (132, 142) (such as from above the top surface of the inter-tier dielectric layer 180). The top surfaces of the sacrificial first-tier opening fill structures (148, 128, 172) may be coplanar with the top surface of the inter-tier dielectric layer 180. Each of the sacrificial first-tier opening fill structures (148, 128, 172) may, or may not, include cavities therein.

Figure 6:
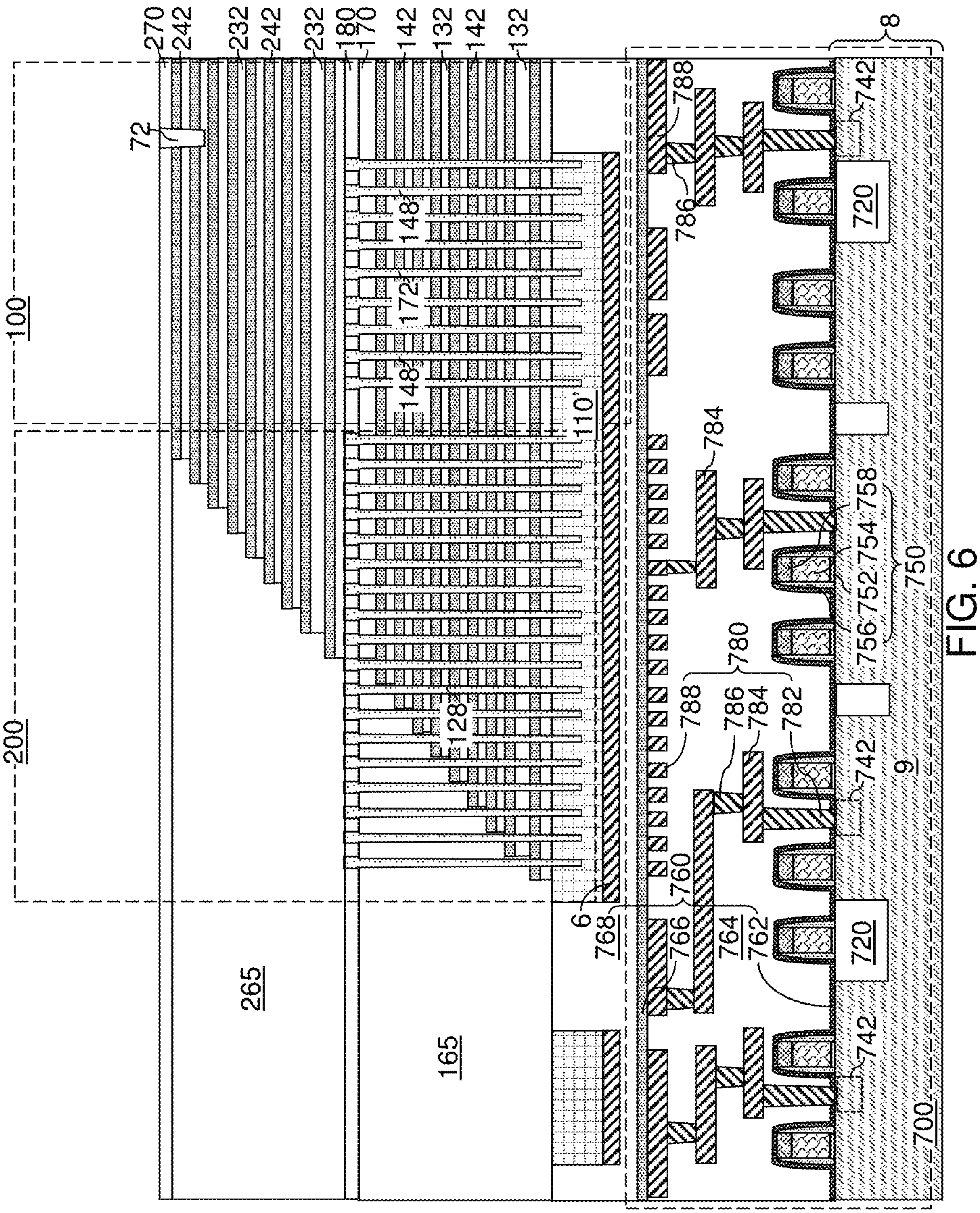
FIG. 6 is a vertical cross-sectional view of the first exemplary structure after formation of a second-tier alternating stack of second insulating layers and second spacer material layers, second stepped surfaces, and a second retro-stepped dielectric material portion according to an embodiment of the present disclosure.

Referring to FIG. 6, a second-tier structure may be formed over the first-tier structure (132, 142, 170, 148). The second-tier structure may include an additional alternating stack of insulating layers and spacer material layers, which may be sacrificial material layers. For example, a second-tier alternating stack (232, 242) of material layers may be subsequently formed on the top surface of the first-tier alternating stack (132, 142). The second-tier alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second-tier alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second-tier alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second-tier alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level material layers 110', and at least one retro-stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second-tier alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 7A:
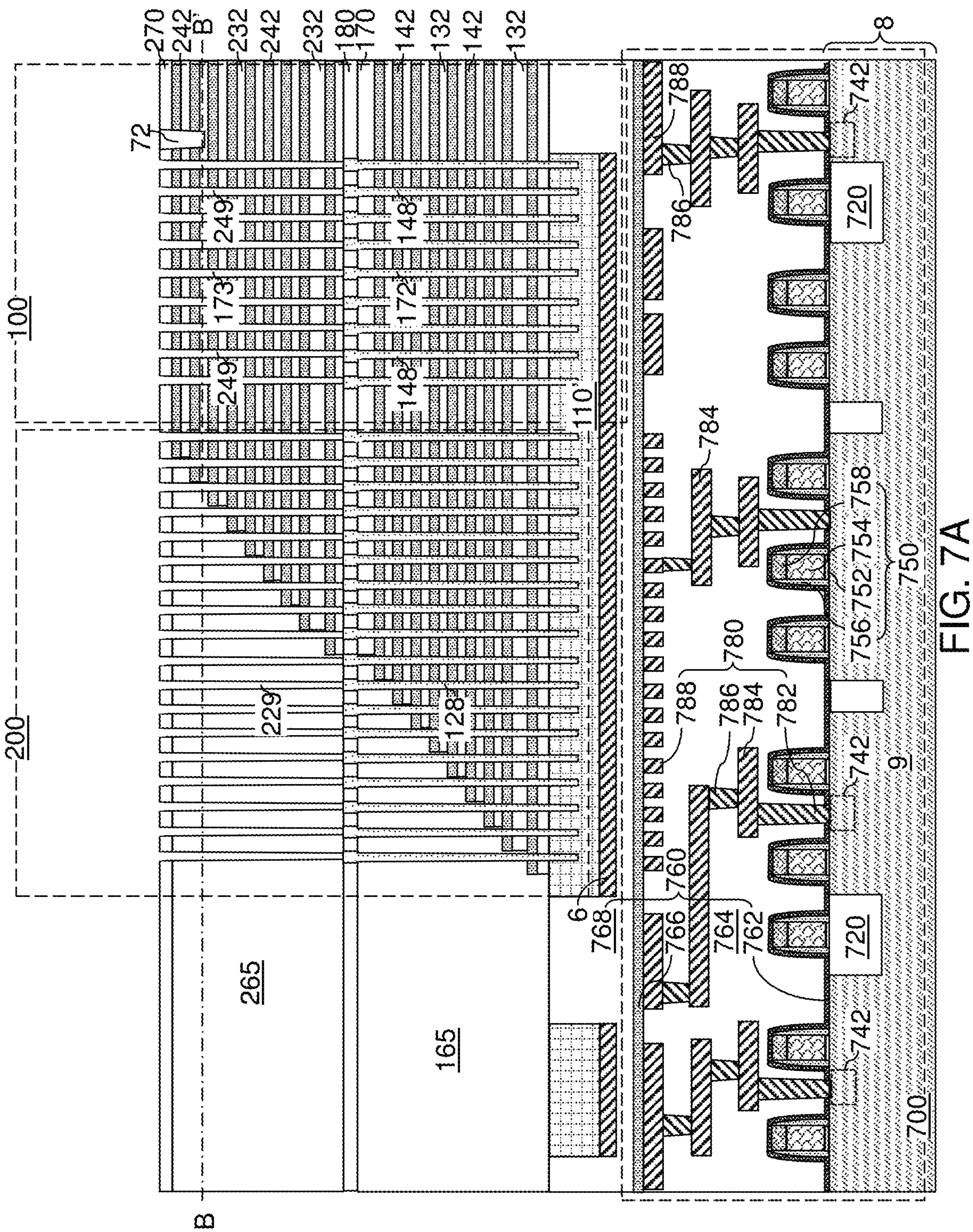
FIG. 7A is a vertical cross-sectional view of the first exemplary structure after formation of second-tier memory openings, second-tier support openings, and second-tier backside openings according to an embodiment of the present disclosure.
Figure 7B:
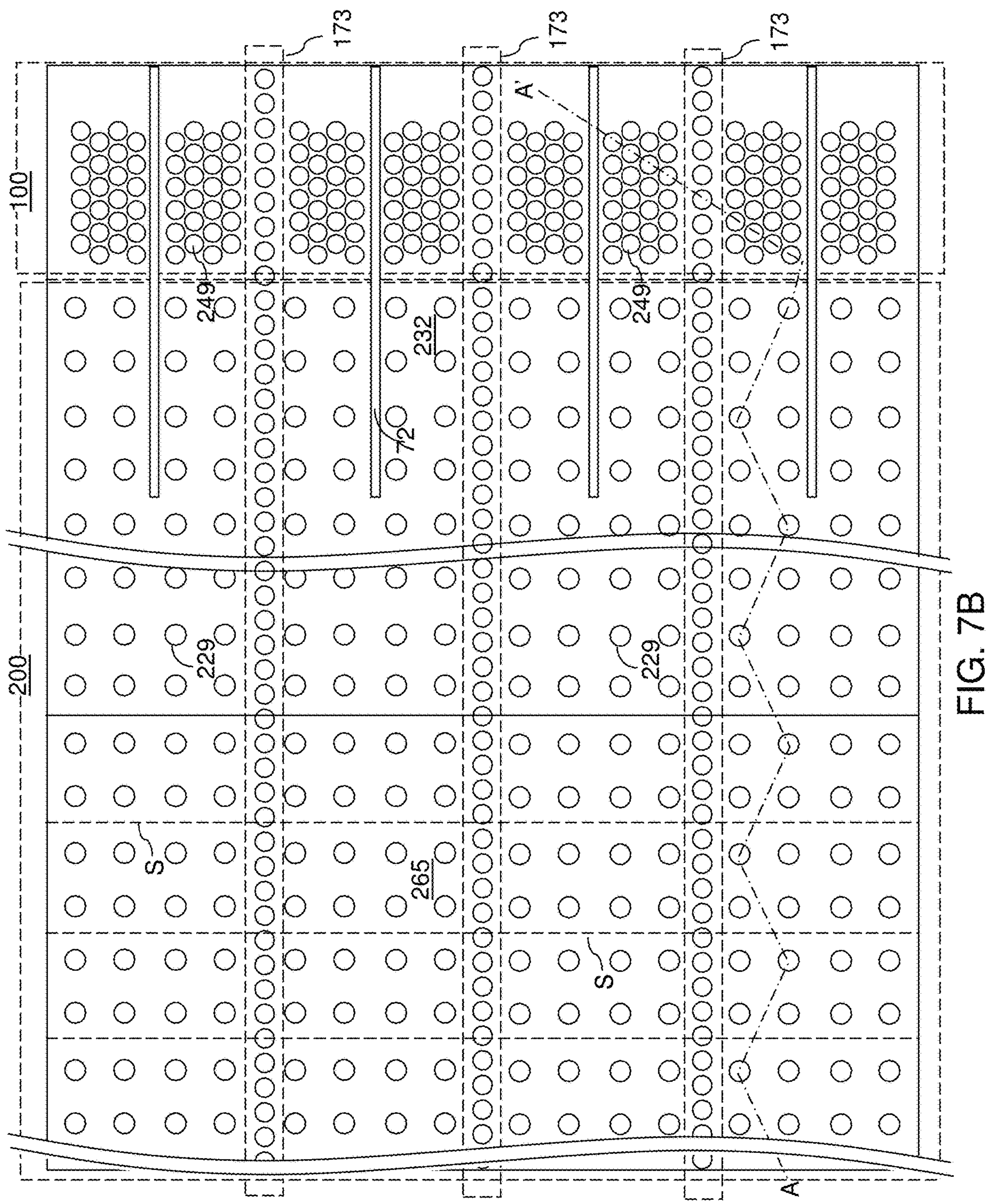
FIG. 7B is a horizontal cross-sectional view of the first exemplary structure along the horizontal plane B-B' of FIG. 7A. The hinged vertical plane A-A' corresponds to the plane of the vertical cross-sectional view of FIG. 7A.

Referring to FIGS. 7A and 7B, various second-tier openings (249, 229, 173) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129, 171), which is the same as the sacrificial first-tier opening fill structures (148, 128, 172). Thus, the lithographic mask used to pattern the first-tier openings (149, 129, 171) may be used to pattern the photoresist layer.

The pattern of openings in the photoresist layer may be transferred through the second-tier structure (232, 242, 265, 270, 72) by a second anisotropic etch process to form various second-tier openings (249, 229, 173) concurrently, i.e., during the second anisotropic etch process. The various second-tier openings (249, 229, 173) may include second-tier memory openings 249. second-tier support openings 229, and optionally second-tier backside openings 173. In an alternative embodiment, the second-tier backside openings 173 are not formed during this step and are instead formed during the step shown in FIGS. 12A and 12B and described in more detail below.

The second-tier memory openings 249 are formed directly on a top surface of a respective one of the sacrificial first-tier memory opening fill structures 148. The second-tier support openings 229 are formed directly on a top surface of a respective one of the sacrificial first-tier support opening fill structures 128. The second-tier backside openings 173 (if present) can be formed directly on a top surface of a respective sacrificial first-tier backside opening fill structure 172 (if present). Each second-tier support openings 229 may be formed through a horizontal surface within the second stepped surfaces, which include the interfacial surfaces between the second-tier alternating stack (232, 242) and the second retro-stepped dielectric material portion 265. Locations of steps S in the first-tier alternating stack (132, 142) and the second-tier alternating stack (232, 242) are illustrated as dotted lines in FIG. 7B.

The second-tier backside openings 173 are openings that are formed in the memory array region 100 and in the staircase region 200, and are subsequently employed to provide isotropic etchants for etching materials of the source-level sacrificial layer 104 and sacrificial material layers (142, 242). The second-tier backside openings 173 can be formed in rows that laterally extend along the second horizontal direction hd1. A cluster of second-tier memory openings 249 and a cluster of second-tier support openings 229 can be located between each laterally neighboring pair of rows of second-tier backside openings 173. The second-tier backside openings 173 can have circular or oval horizontal cross-sectional shapes. In an alternative embodiment, the second-tier backside openings 173 are not formed during this step and are instead formed during the step shown in FIGS. 12A and 12B and described in more detail below.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229, 173) may be substantially vertical, or may be tapered. A bottom periphery of each second-tier opening (249, 229, 173) may be laterally offset, and/or may be located entirely within, a periphery of a top surface of an underlying sacrificial first-tier opening fill structure (148, 128, 172). The photoresist layer may be subsequently removed, for example, by ashing.

Generally, at least one alternating stack of insulating layers (132, 232) and sacrificial material layers (142, 242) can be formed over the in-process source-level material layers 110'. Memory openings (such as the first-tier memory openings 149 and/or the second-tier memory openings 249), support openings (such as the first-tier support openings 129 and/or the second-tier support openings 229), and optionally the backside openings (such as the first-tier backside openings 171 and/or the second-tier backside openings 172) can be formed by applying and patterning a photoresist layer over the at least one alternating stack to provide discrete openings in the photoresist layer, and by etching unmasked portions of the at least one alternating stack and the in-process source-level material layers 110' by performing at least one anisotropic etch process. A first subset of openings formed through the at least one alternating stack and the in-process source-level material layers 110' by the anisotropic etch process comprise the memory openings, a second subset of the openings formed through the alternating stack and the in-process source-level material layers 110' by the anisotropic etch process comprise the backside openings, and an optional third subset of the openings formed through the alternating stack and the in-process source-level material layers 110' by the anisotropic etch process comprises the support openings.

Figure 8:
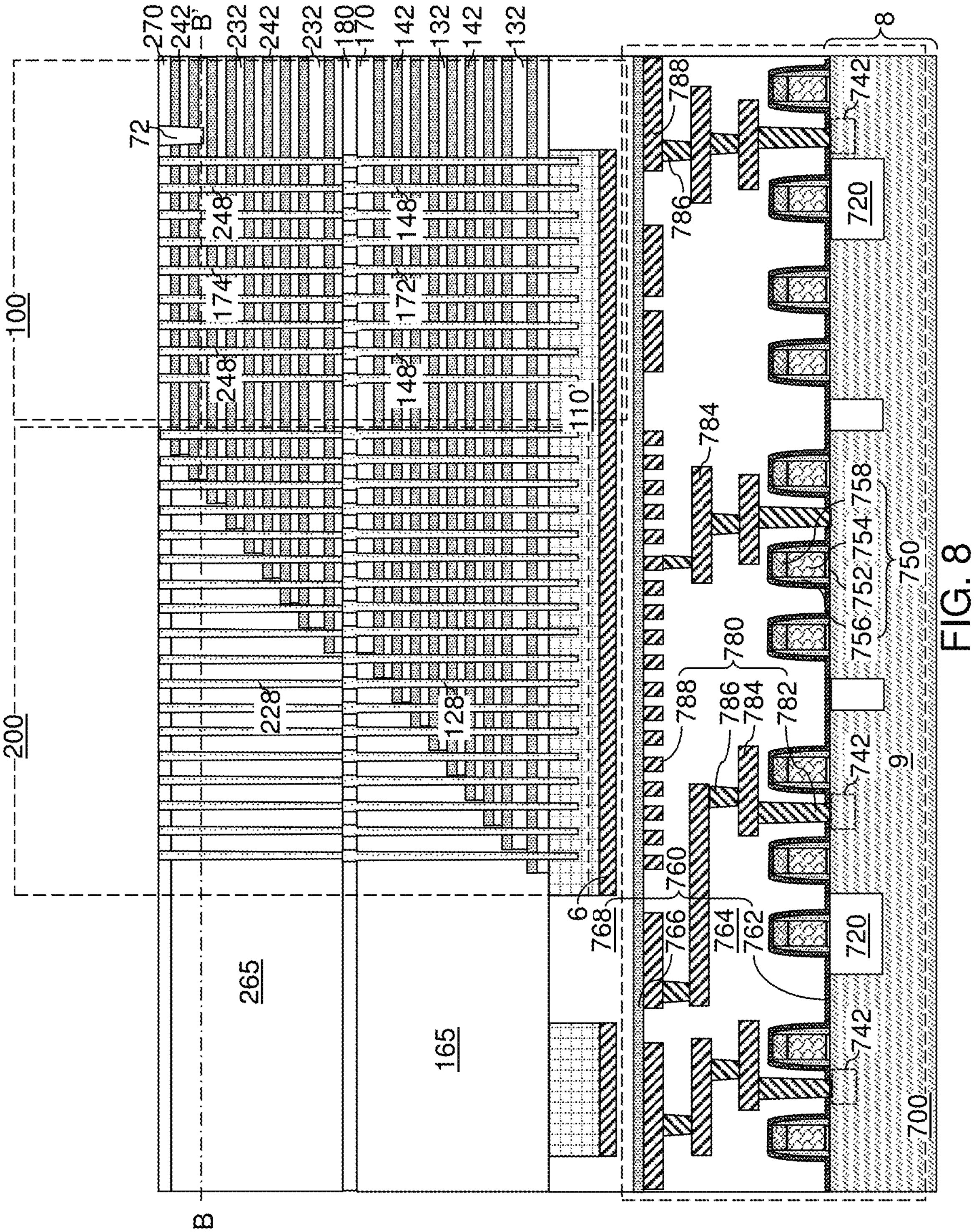
FIG. 8 is a vertical cross-sectional view of the first exemplary structure after formation of various second-tier opening fill structures according to an embodiment of the present disclosure.

Referring to FIG. 8, if the first-tier backside openings 171 and/or the second-tier backside openings 172 are present in the structure, then sacrificial second-tier opening fill structures (248, 228, 174) may be formed in the various second-tier openings (249, 229, 173). For example, a sacrificial second-tier fill material is deposited concurrently deposited in each of the second-tier openings (249, 229, 173). The sacrificial second-tier fill material includes a material that may be subsequently removed selective to the materials of the second insulating layers 232 and the second sacrificial material layers 242. The sacrificial second-tier fill material can include any material that can be employed for the sacrificial first-tier fill material.

Portions of the deposited sacrificial material may be removed from above the second insulating cap layer 270. For example, the sacrificial second-tier fill material may be recessed to a top surface of the second insulating cap layer 270 using a planarization process. The planarization process may include a recess etch, chemical mechanical planarization (CMP), or a combination thereof. The top surface of the second insulating cap layer 270 may be used as an etch-stop layer or a planarization stop layer.

Remaining portions of the sacrificial second-tier fill material comprise sacrificial second-tier opening fill structures (248, 228, 174). Specifically, each remaining portion of the sacrificial second-tier fill material in a second-tier memory opening 249 constitutes a sacrificial second-tier memory opening fill structure 248. Each remaining portion of the sacrificial second-tier fill material in a second-tier support opening 229 constitutes a sacrificial second-tier support opening fill structure 228. Each remaining portion of the sacrificial second-tier fill material in a second-tier backside opening 173 constitutes a sacrificial second-tier backside opening fill structure 174. The various sacrificial second-tier opening fill structures (248, 228, 174) are concurrently formed, i.e., during a same set of processes including the deposition process that deposits the sacrificial second-tier fill material and the planarization process that removes the second-tier deposition process from above the second-tier alternating stack (232, 242) (such as from above the top surface of the second insulating cap layer 270). The top surfaces of the sacrificial second-tier opening fill structures (248, 228, 174) may be coplanar with the top surface of the second insulating cap layer 270. Each of the sacrificial second-tier opening fill structures (248, 228, 174) may, or may not, include cavities therein. In an alternative embodiment, if the first-tier backside openings 171 and/or the second-tier backside openings 172 are not present in the structure, then the sacrificial second-tier opening fill structures (248, 228, 174) may be omitted and the process proceeds to the step shown in FIG. 10A.

Figure 9A:
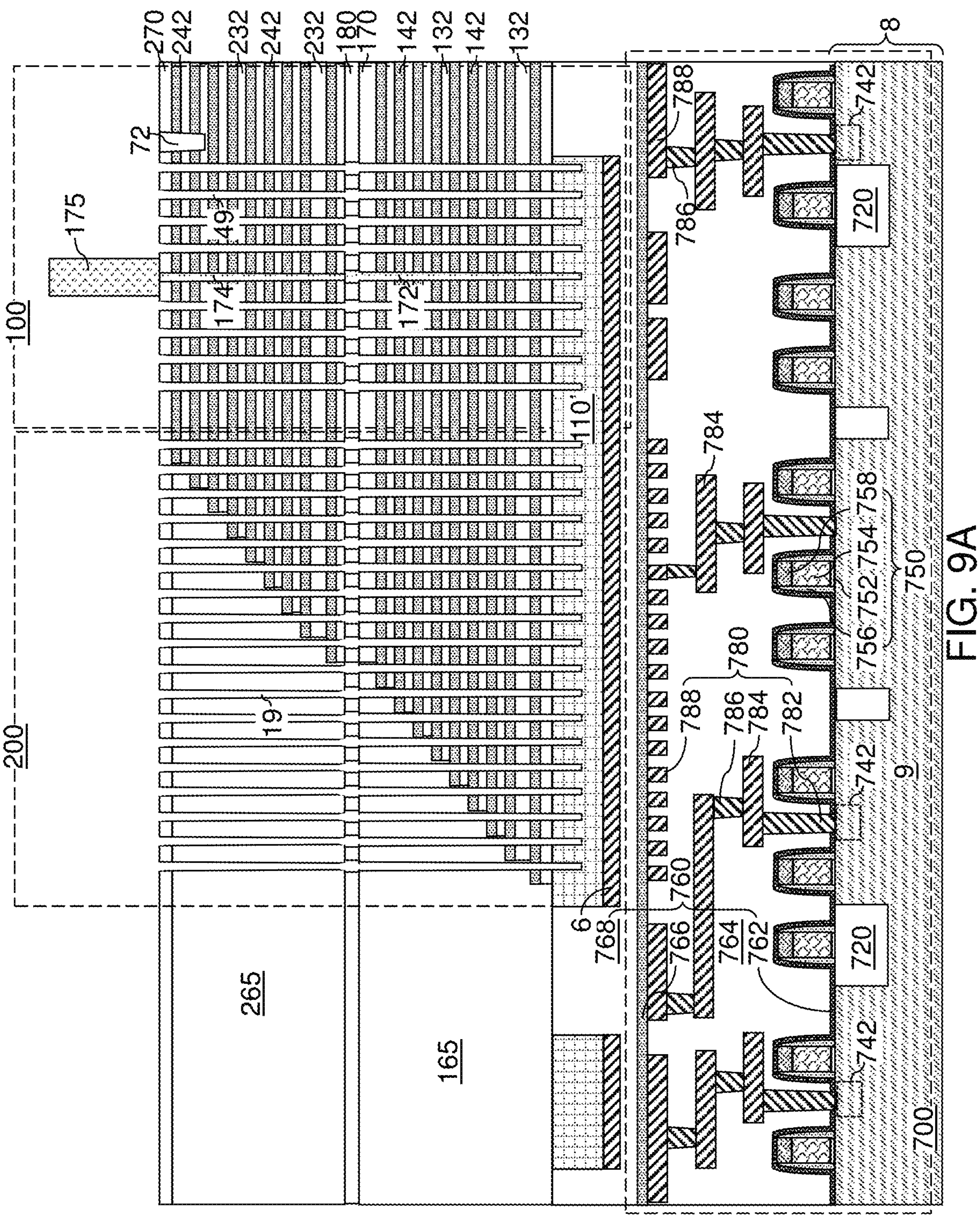
FIG. 9A is a vertical cross-sectional view of the first exemplary structure after formation of inter-tier memory openings and inter-tier support openings according to an embodiment of the present disclosure.
Figure 9B:
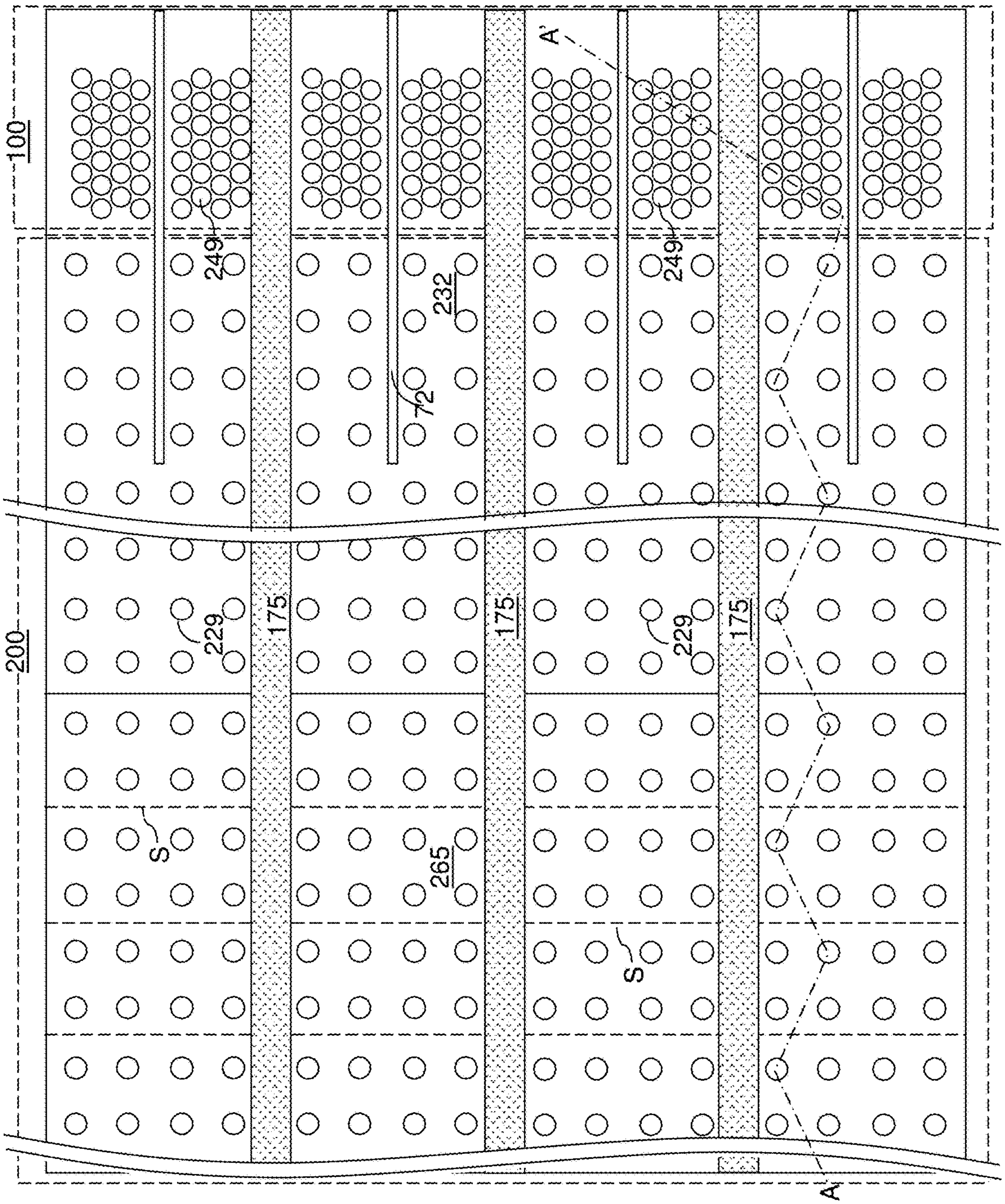
FIG. 9B is a top-down view of the first exemplary structure of FIG. 9A. The hinged vertical plane A-A' corresponds to the plane of the vertical cross-sectional view of FIG. 9A.

Referring to FIGS. 9A and 9B, if the sacrificial second-tier opening fill structures (248, 228, 174) are present in the structure, then a photoresist layer 175 can be applied over the first exemplary structure, and can be lithographically patterned to cover the sacrificial second-tier backside opening fill structures 174 without covering the sacrificial second-tier memory opening fill structures 248 or the sacrificial second-tier support opening fill structures 228. An etch process can be performed to etch the sacrificial fill materials of the sacrificial fill materials of the sacrificial second-tier memory opening fill structures 248, the sacrificial second-tier support opening fill structures 228, the sacrificial first-tier memory opening fill structures 148, and the sacrificial first-tier support opening fill structures 128 selective to the materials of the first and second insulating layers (132, 232), the first and second sacrificial material layers (142,242), the first and second insulating cap layers (170, 270), and the inter-tier dielectric layer 180. A memory opening 49, which is also referred to as an inter-tier memory opening 49, is formed in each contiguous combination of a volume of a second-tier memory openings 249 and a volume of a first-tier memory opening 149. A support opening 19, which is also referred to as an inter-tier support opening 19, is formed in each contiguous combination of a volume of a second-tier support openings 229 and a volume of a first-tier support opening 129. The photoresist layer 175 can be subsequently removed, for example, by ashing.

FIGS. 10A-10D provide sequential cross-sectional views of a memory opening 49 during formation of a memory opening fill structure. The same structural change occurs in each of the memory openings 49 and the support openings 19.

Figure 10B:
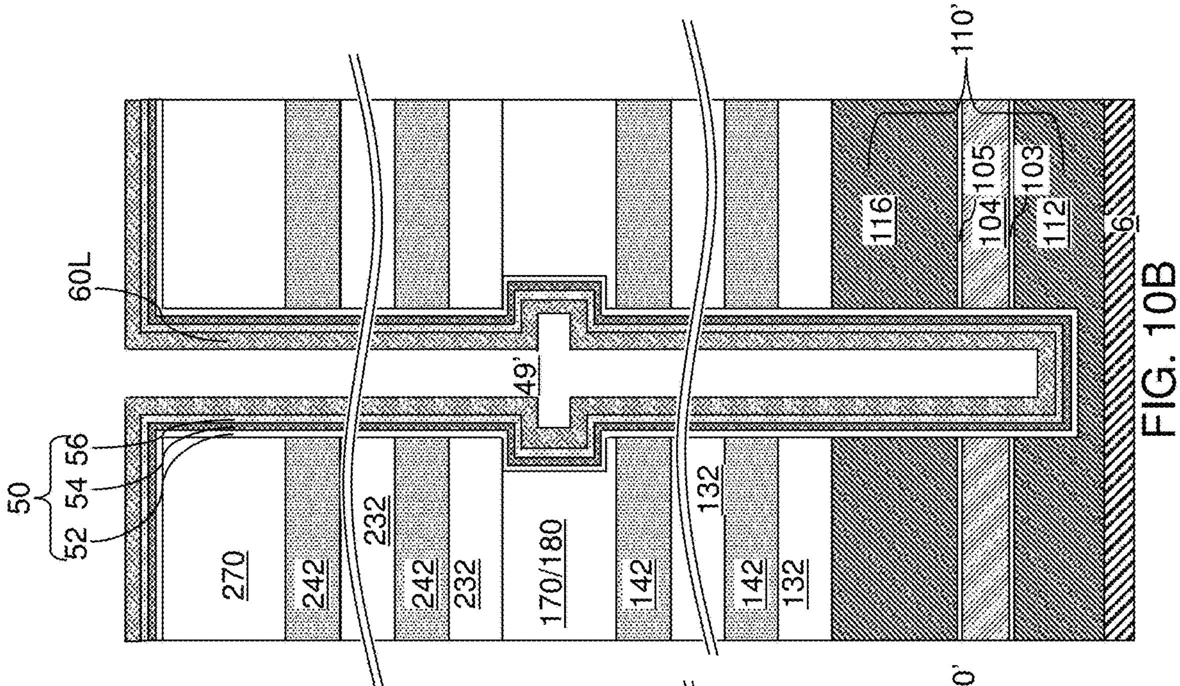
FIGS. 10A-10D illustrate sequential vertical cross-sectional views of a memory opening during formation of a memory opening fill structure according to an embodiment of the present disclosure.
Figure 10A:
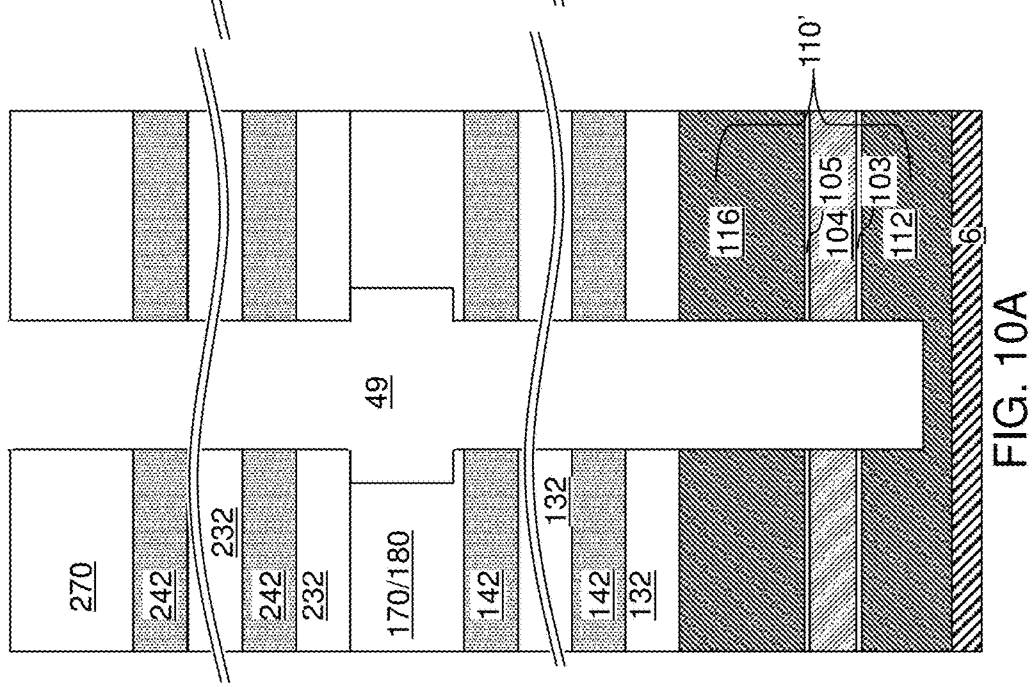

Referring to FIG. 10A, a memory opening 49 in the first exemplary device structure of FIGS. 9A and 9B is illustrated. The memory opening 49 extends through the first-tier structure and the second-tier structure.

Referring to FIG. 10B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Figure 10D:
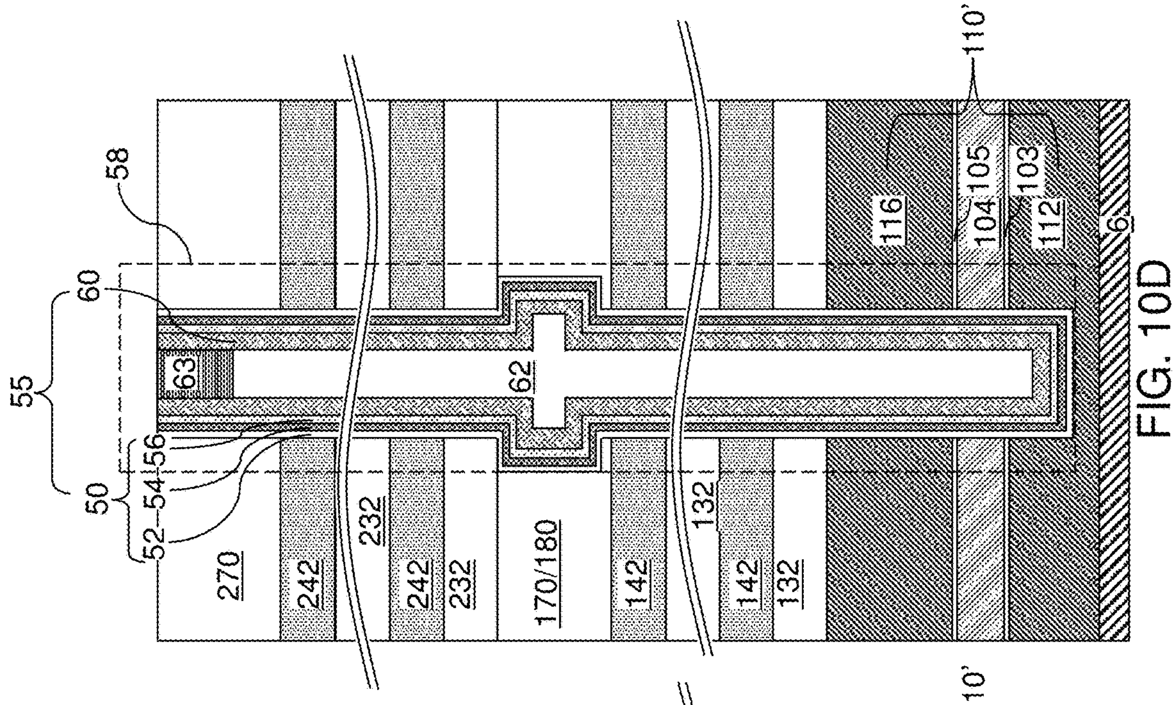
Figure 10C:
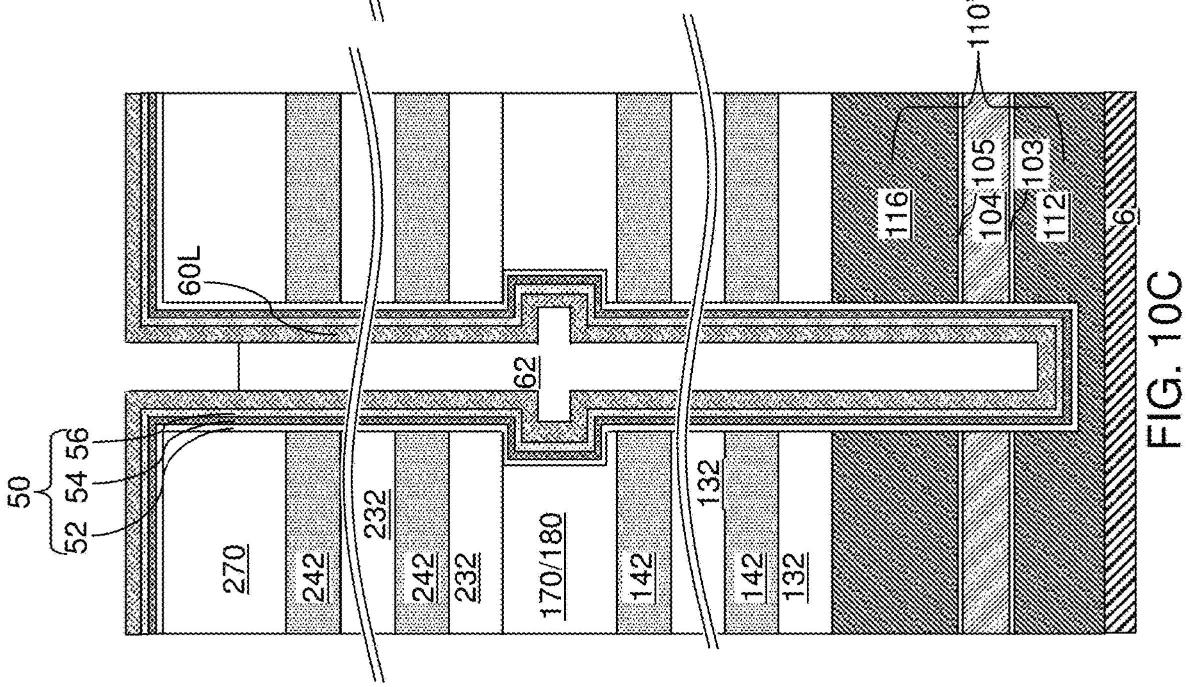

Referring to FIG. 10C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 10D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0\times10^{19}/cm^3$ to $2.0\times10^{21}/cm^3$, although lesser and greater dopant concentrations may also be used. The doped semiconductor material may be, for example, doped polysilicon. Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 110', the first-tier structure (132, 142, 170, 165), the second-tier structure (232, 242, 270, 265, 72), the inter-tier dielectric layer 180, and the memory opening fill structures 58 collectively constitute a memory-level assembly.

Figure 11:
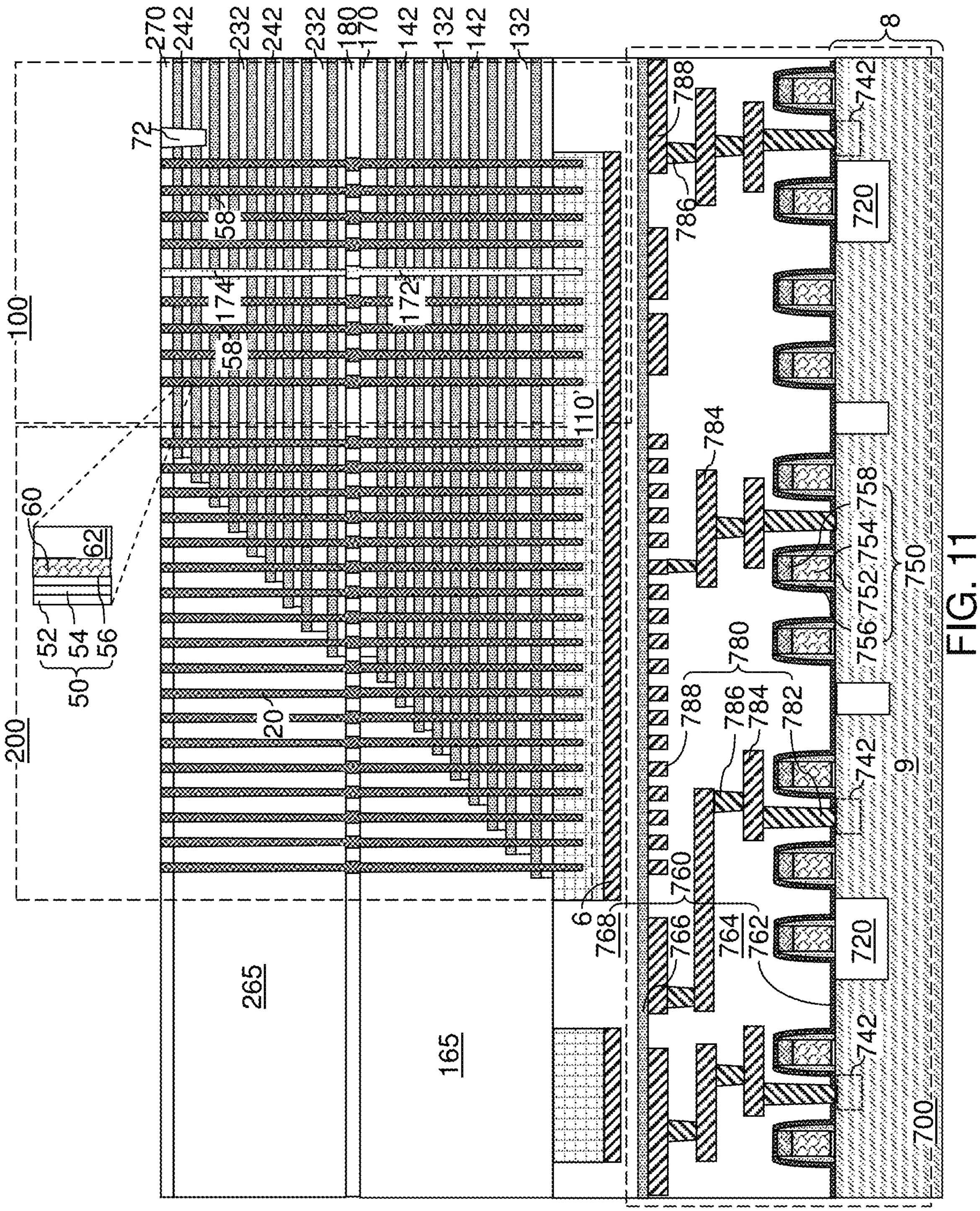
FIG. 11 is a vertical cross-sectional view of the first exemplary structure after formation of memory opening fill structures and support pillar structures according to an embodiment of the present disclosure.

Referring to FIG. 11, the first exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 12A:
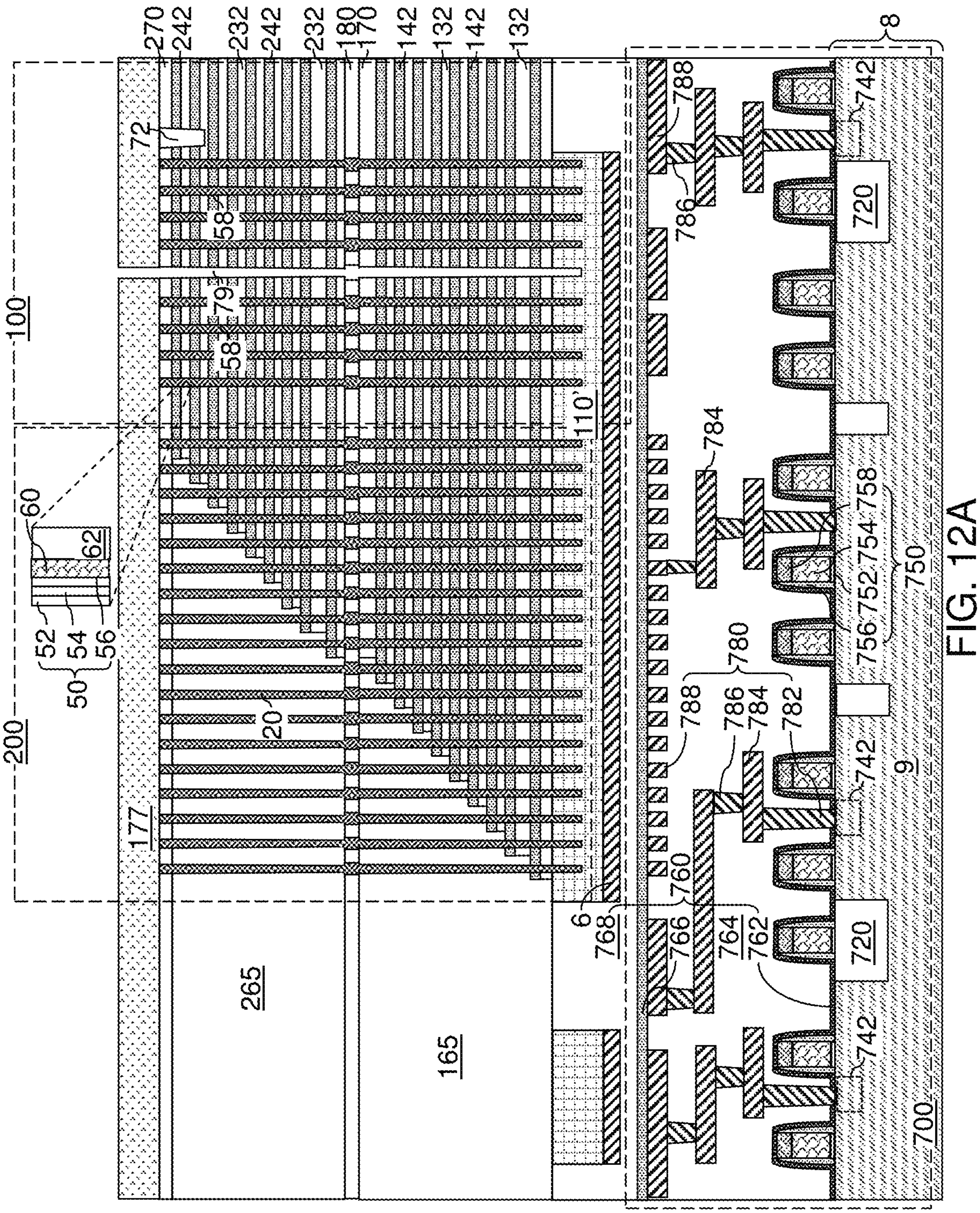
FIG. 12A is a vertical cross-sectional view of the first exemplary structure after formation of inter-tier backside openings according to an embodiment of the present disclosure.
Figure 12B:
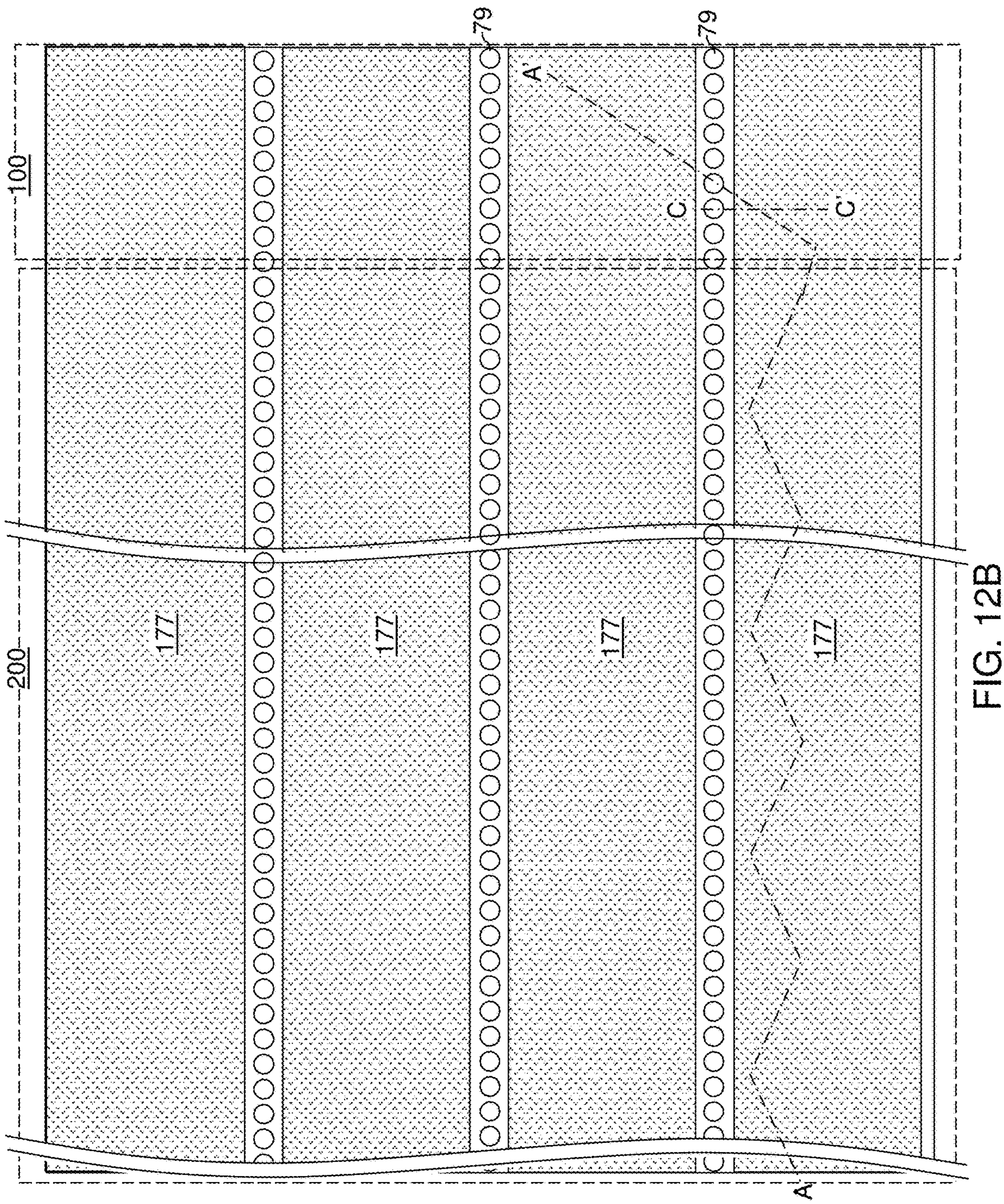
FIG. 12B is a top-down view of the first exemplary structure of FIG. 12A. The hinged vertical plane A-A' corresponds to the plane of the vertical cross-sectional view of FIG. 12A.
Figure 12C:
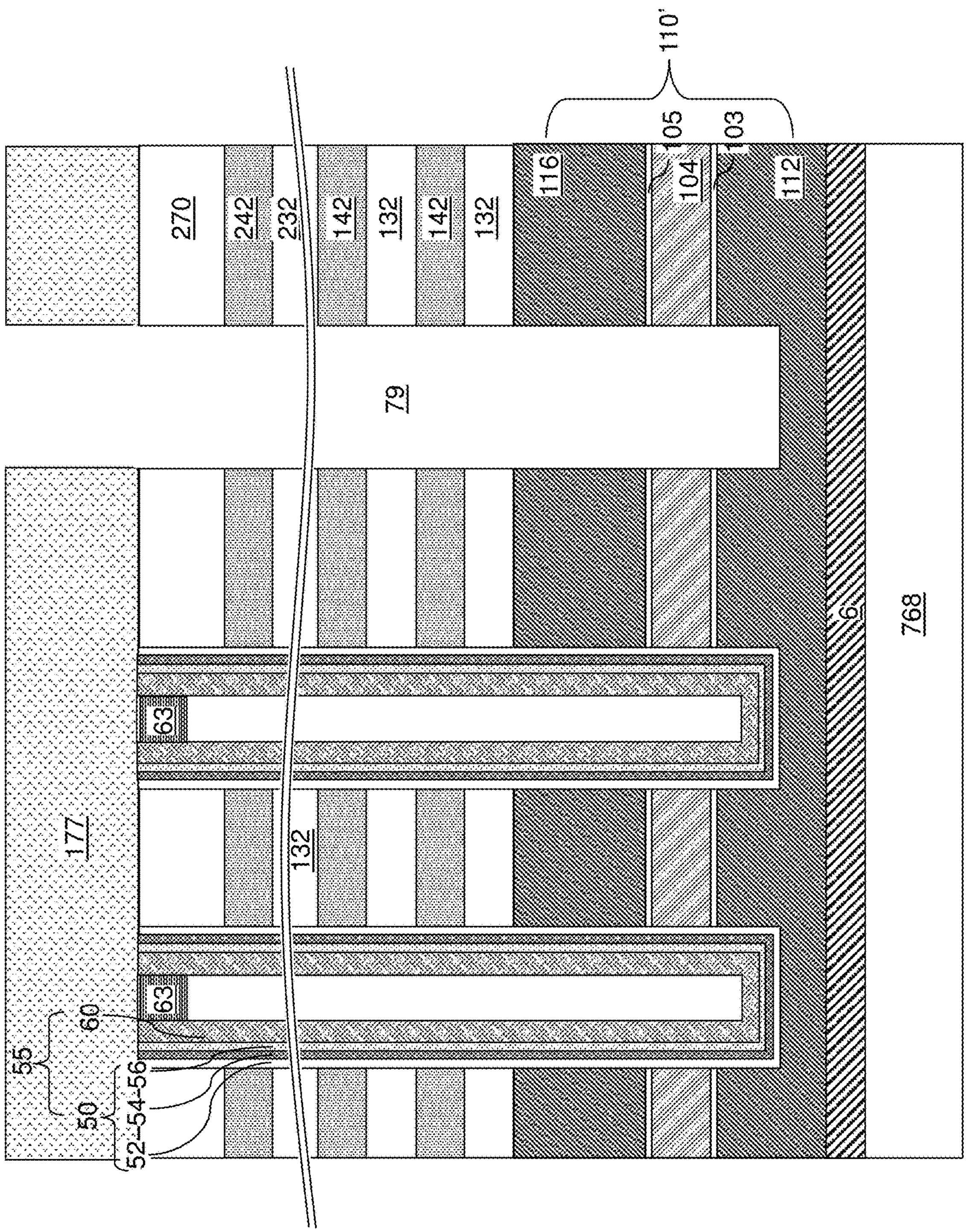
FIG. 12C is a vertical cross-sectional view of a region of the first exemplary structure along the vertical plane C-C' of FIG. 12B.

Referring to FIGS. 12A-12C, a photoresist layer 177 can be applied over the first exemplary structure, and can be lithographically patterned to cover the memory opening fill structures 58 and the support pillar structures 20 without covering the sacrificial second-tier backside opening fill structures 174 (if present). An etch process can be performed to etch the sacrificial fill materials of the sacrificial second-tier backside opening fill structures 174 and the sacrificial first-tier backside opening fill structures 172 selective to the materials of the first and second insulating layers (132, 232), the first and second sacrificial material layers (142,242), the first and second insulating cap layers (170, 270), and the inter-tier dielectric layer 180. A backside opening 79, which is also referred to as an inter-tier backside opening 79, is formed in each contiguous combination of a volume of a second-tier backside openings 173 and a volume of a first-tier backside openings 171. Preferably, backside spacers are not formed in the inter-tier backside openings 79, as in some prior art processes. Therefore, it is not necessary to control the height of the backside spacers to expose the source level sacrificial layer 104 below such spacers, which simplifies the process of the embodiments of the present disclosure compared to some prior art processes which use the spacers.

In an alternative embodiment, if the second-tier backside openings 173, the first-tier backside openings 171 and the sacrificial second-tier opening fill structures (248, 228, 174) are not formed during the previous patterning steps illustrated in FIGS. 4A to 11, then the backside opening 79 can be etched through the materials of the first and second insulating layers (132, 232), the first and second sacrificial material layers (142,242), the first and second insulating cap layers (170, 270), the inter-tier dielectric layer 180 and partially through the in-process source-level material layers 110' to or through the source-level sacrificial layer 104 using the patterned photoresist layer 177 as a mask. Specifically, if the backside openings 79 are wider (e.g., have a larger diameter) than the memory openings 49, then the backside openings 79 may be etched in a single etching step shown in FIGS. 12A and 12B since a very high aspect ratio opening etch is not required to form the wider backside openings 79. Thus, in this alternative embodiment, the memory openings 49 and the backside openings 79 are formed by forming the memory openings 49 and filling the memory openings 49 with the respective memory opening fill structures 58, and forming the backside openings 79 after forming the memory openings 49 and filling the memory openings with the respective memory opening fill structures 58.

Figure 13:
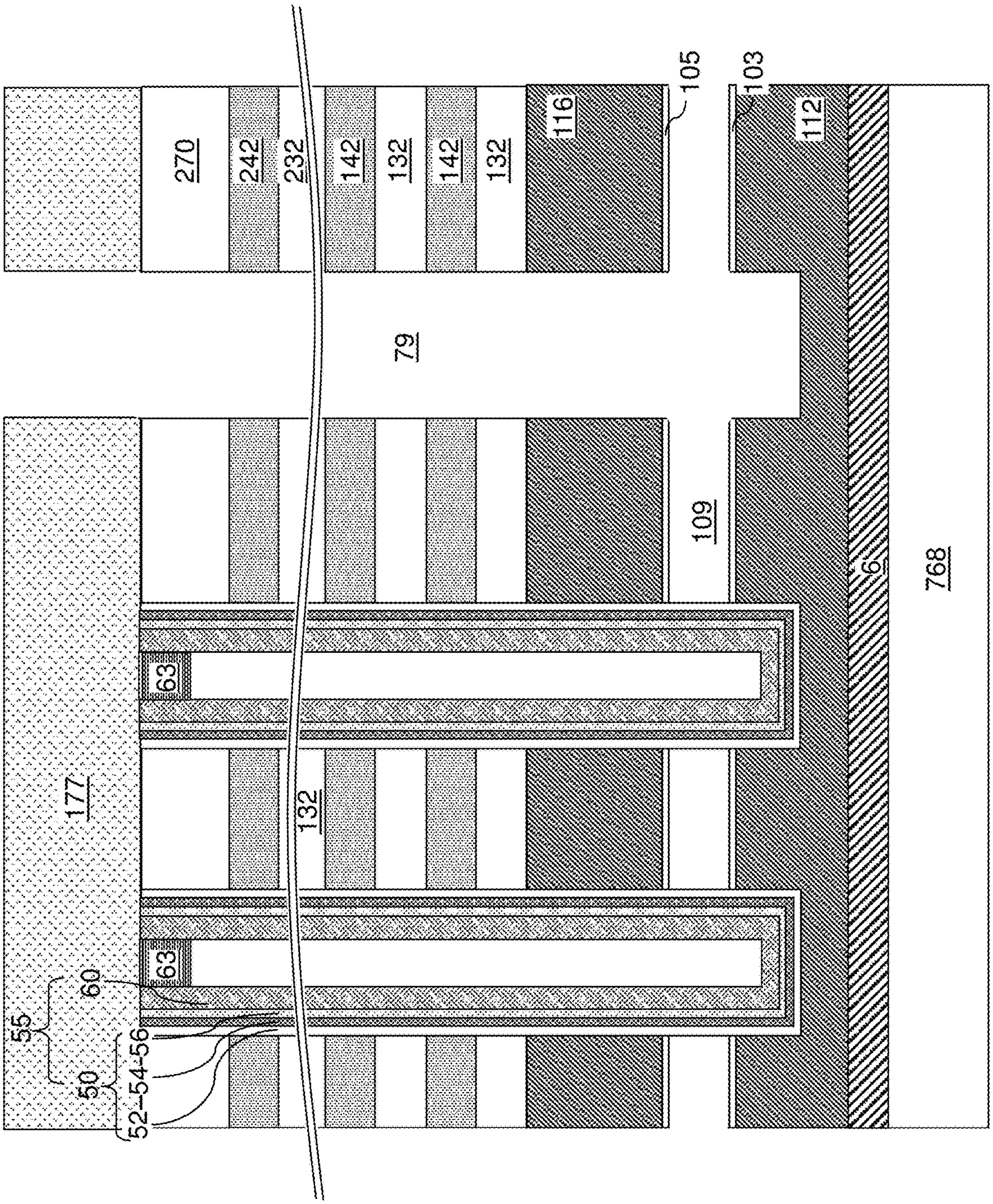
FIG. 13 is a vertical cross-sectional view of a region of the first exemplary structure after formation of a source cavity according to an embodiment of the present disclosure.

Referring to FIG. 13, a first isotropic etch process is performed to etch the source-level sacrificial layer 104 selective to materials of the alternating stacks {(132, 142), (232, 242)} and the memory films 50. An etchant that etches the material of the source-level sacrificial layer 104 selective to the materials of the first-tier alternating stack (132, 142), the second-tier alternating stack (232, 242), the first and second insulating cap layers (170, 270), the first contact-level dielectric layer 280, the upper sacrificial liner 105, and the lower sacrificial liner 103 may be introduced into the backside trenches in an isotropic etch process.

For example, if the source-level sacrificial layer 104 includes a doped silicate glass, such as borosilicate glass, then a vapor phase clean process may be used to remove the source-level sacrificial layer 104 selective to the upper and lower sacrificial liners (105, 103). The vapor phase clean process may include a dilute hydrofluoric acid wet etch followed by a chemical dry etch (CDE) using water vapor and hydrofluoric acid vapor. A source cavity 109 is formed in the volume from which the source-level sacrificial layer 104 is removed. Each of the memory opening fill structures 58 is physically exposed to the source cavity 109. Specifically, each of the memory opening fill structures 58 includes a sidewall and that are physically exposed to the source cavity 109.

Alternatively, if the source-level sacrificial layer 104 includes undoped amorphous silicon or an undoped amorphous silicon-germanium alloy, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the upper and lower sacrificial liners (105, 103). Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Collateral etching of the upper source-level semiconductor layer 116 and/or the lower source-level semiconductor layer 112 can be minimal, and the structural change to the first exemplary structure caused by accidental physical exposure of the surfaces of the upper source-level semiconductor layer 116 and/or the lower source-level semiconductor layer 112 during manufacturing steps do not result in device failures. Generally, the source cavity 109 can be formed by removing the source-level sacrificial layer 104 employing an isotropic etch process that provides an isotropic etchant into the backside openings 79.

Figure 14:
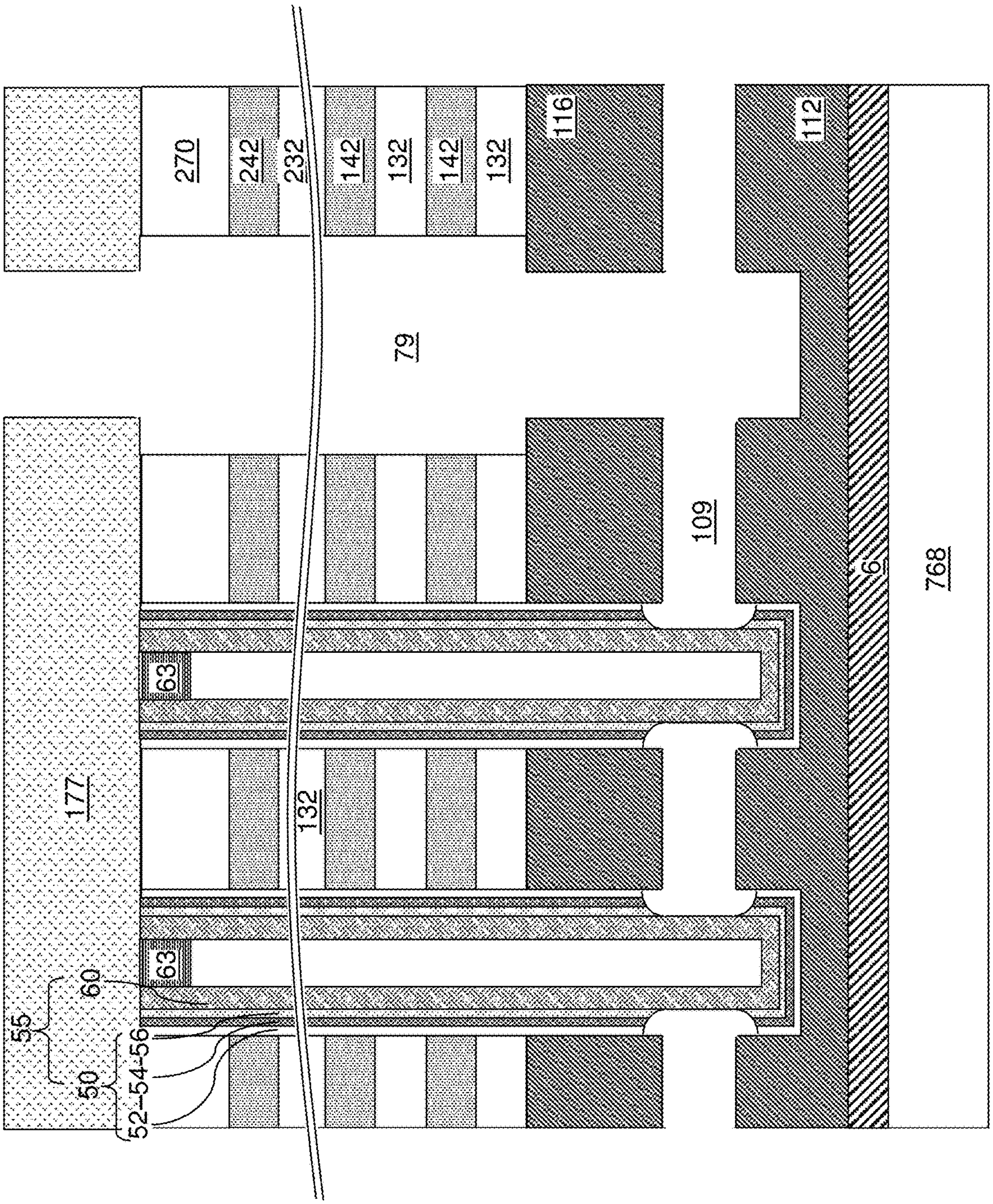
FIG. 14 is a vertical cross-sectional view of a region of the first exemplary structure after physically exposing vertical semiconductor channels around the source cavity according to an embodiment of the present disclosure.

Referring to FIG. 14, a second isotropic etch process can be performed to etch materials of the memory films 50 selective to the vertical semiconductor channels 60. A sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60. Sidewalls of the vertical semiconductor channels 60 are physically exposed after the second isotropic etch process.

Remaining portions of the memory films 50 embedded in the lower source-level semiconductor layer 112 are herein referred to as dielectric cap structures 150. The dielectric cap structures 150 are embedded in the lower source-level semiconductor layer 112, contact a bottom end of a respective one of the vertical semiconductor channels 60, and comprise a respective stack of dielectric materials having a same set of dielectric materials as each of the memory films 50.

Figure 15A:
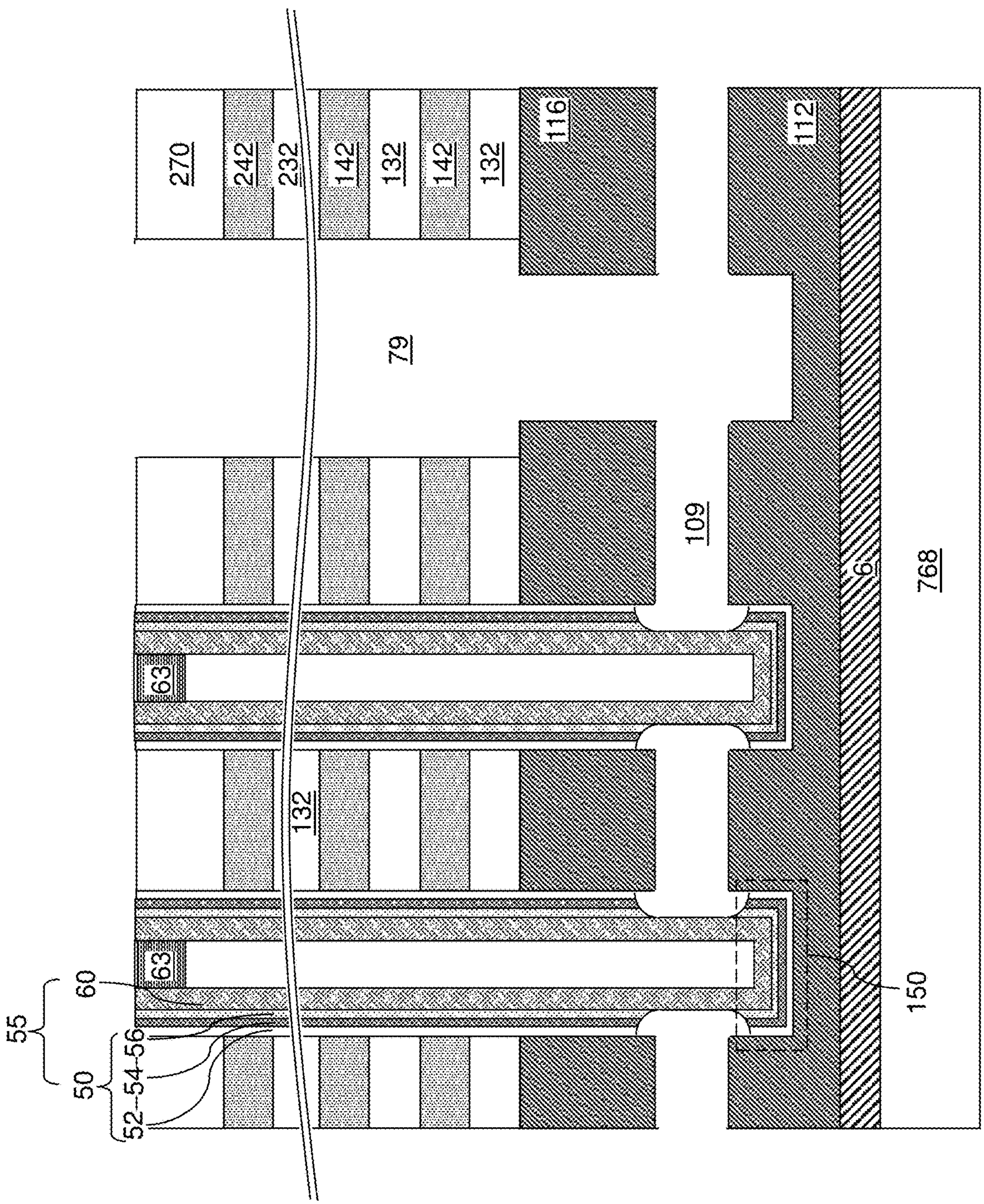
FIG. 15A is a vertical cross-sectional view of a region of the first exemplary structure after removal of a photoresist layer according to an embodiment of the present disclosure.
Figure 15B:
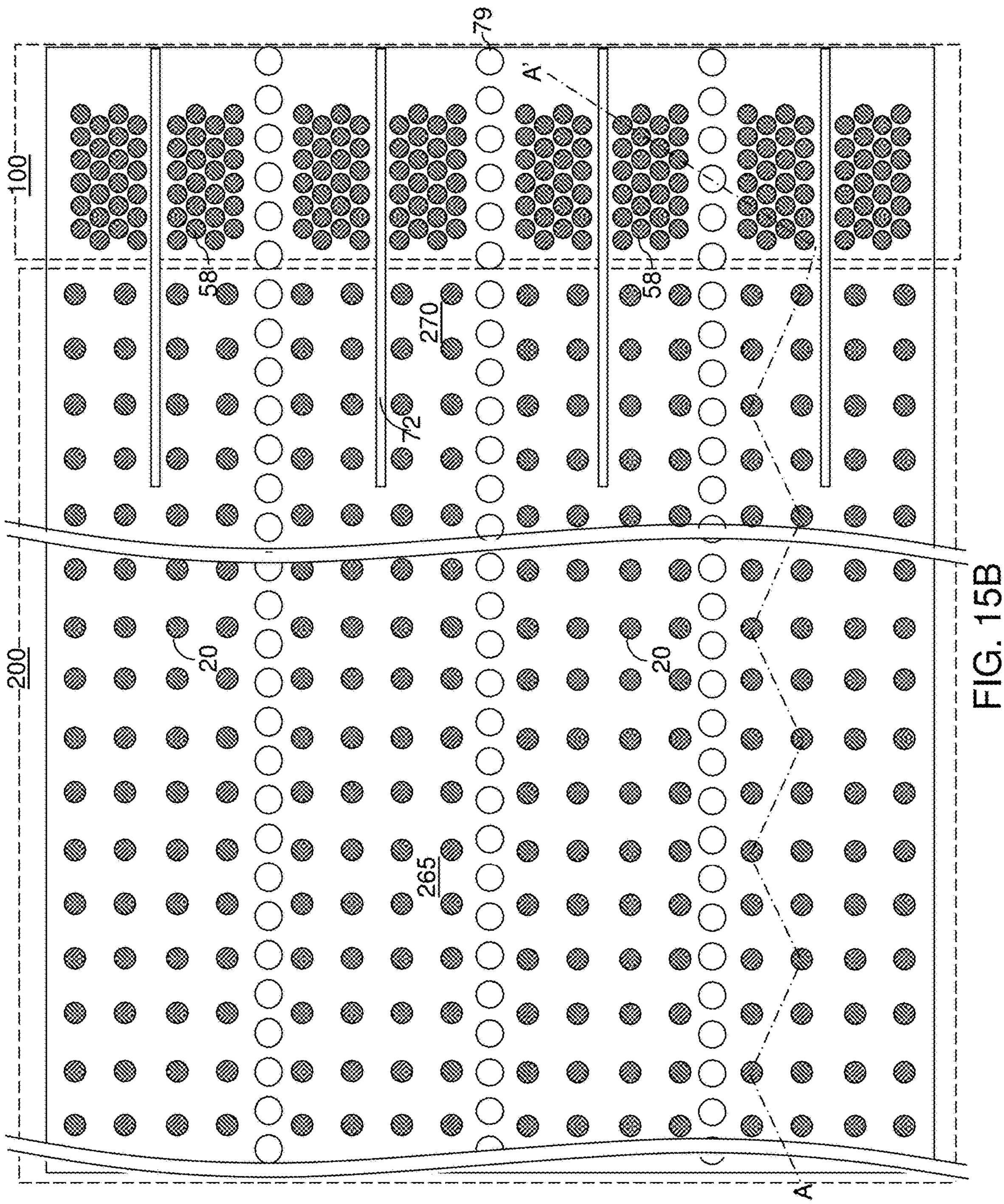
FIG. 15B is a top-down view of the first exemplary structure at the processing steps of FIG. 15A.
Figure 16:
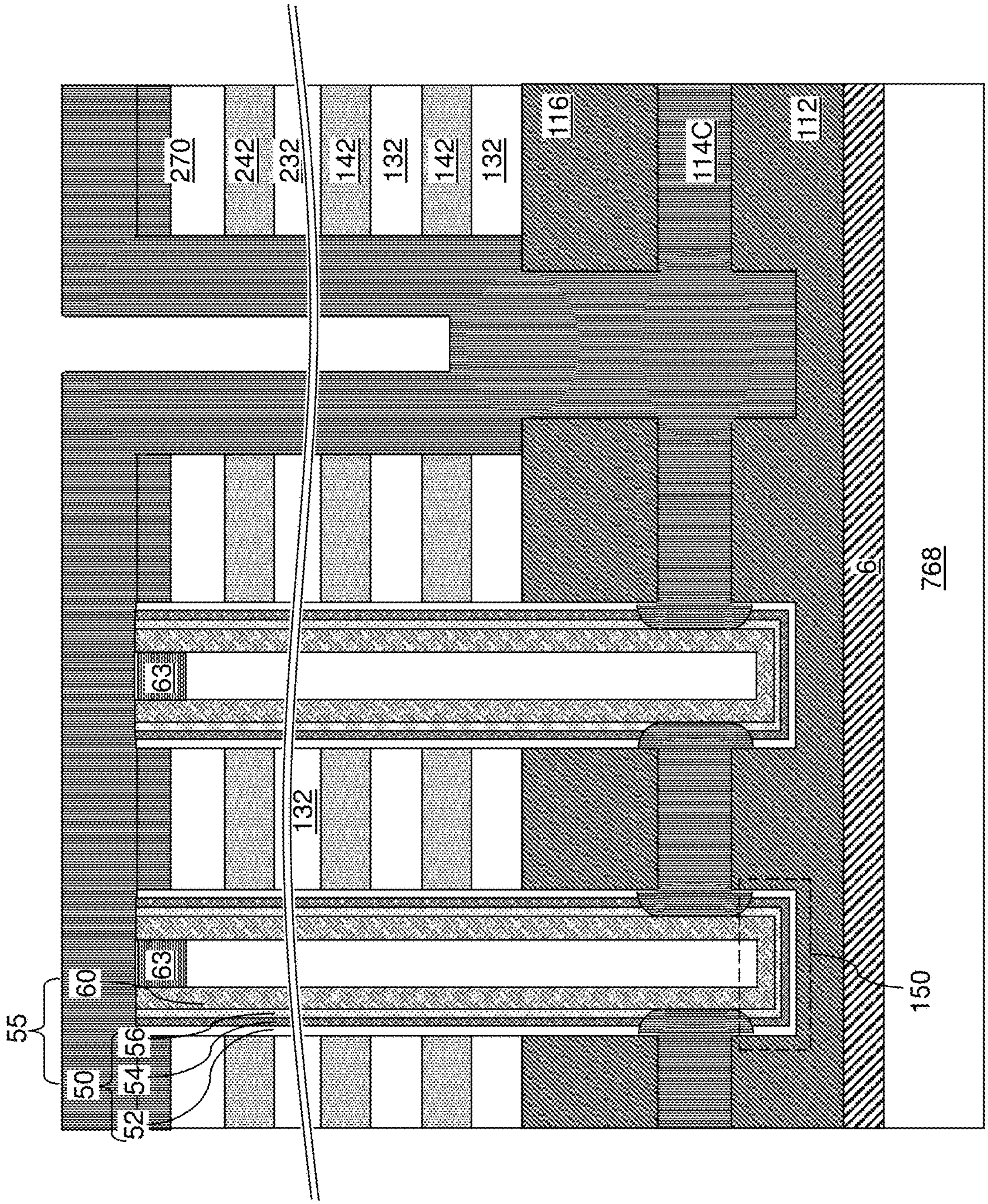
FIG. 16 is a vertical cross-sectional view of a region of the first exemplary structure after formation of a source contact material layer according to an embodiment of the present disclosure.

Referring to FIGS. 15A and 15B, the photoresist layer 177 can be removed, for example, by ashing. Referring to FIG. 16, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

The deposited doped semiconductor material forms a source contact material layer 114C, which may contact sidewalls of the vertical semiconductor channels 60. In one embodiment, at least one non-selective doped semiconductor material deposition process may be used to form a source contact material layer 114C. The atomic concentration of the dopants of the second conductivity type in the deposited semiconductor material may be in a range from $1.0\times10^{19}/cm^3$ to $2.0\times10^{21}/cm^3$, such as from $2.0\times10^{20}/cm^3$ to $8.0\times10^{20}/cm^3$. The source contact layer 114 as initially formed may consist essentially of semiconductor atoms and dopant atoms of the second conductivity type. The duration of the selective semiconductor deposition process may be selected such that the source cavity 109 is filled with the source contact material layer 114C. Optionally, one or more etch back processes may be used in combination with a plurality of selective or non-selective deposition processes to provide a seamless and/or voidless source contact material layer 114C.

Alternatively, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the first exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109.

Figure 17:
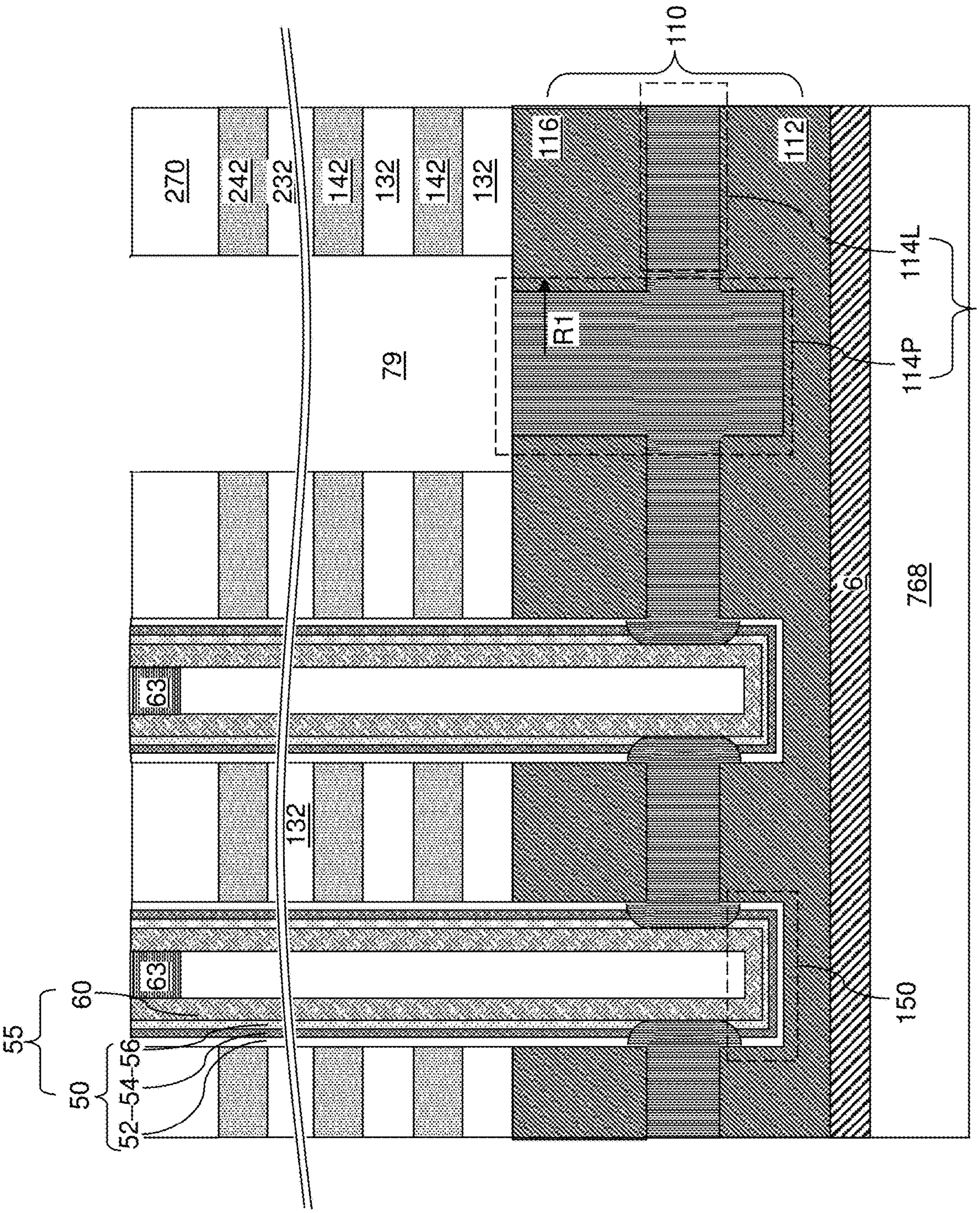
FIG. 17 is a vertical cross-sectional view of a region of the first exemplary structure after formation of a source contact layer according to an embodiment of the present disclosure.

Referring to FIG. 17, in case the source contact material layer 114C includes a portion deposited above the horizontal plane including the bottommost surface of the alternating stacks {(132, 142), (232, 242)} (for example, through use of a non-selective deposition process to form the source contact material layer 114), an etch back process such as an isotropic etch back process can be performed to remove portions of the source contact material layer 114C. Remaining portions of the source contact material layer 114C are herein referred to as a source contact layer 114. The source contact layer 114 can be located below the horizontal plane including the bottommost surface of the alternating stacks {(132, 142), (232, 242)} (such as the horizontal plane including the interface between the upper source-level semiconductor layer 116 and the alternating stacks {(132, 142), (232, 242)}.

The source contact layer 114 is formed directly on the physically exposed sidewalls of the vertical semiconductor channels 60. The source contact layer 114 is formed in the source cavity 109 and in lower portions of the backside openings 79. In one embodiment, the entirety of the source contact layer 114 is a unitary structure that continuously extends underneath the alternating stacks {(132, 142), (232, 242)} and having a homogeneous material composition throughout. As used herein, a "unitary structure" refers to a single continuous structure in which each point in the structure can be connected to any other point in the structure through a continuous path that is entirety within the structure. In one embodiment, the vertical semiconductor channels 60 comprise a first doped semiconductor material having a doping of a first conductivity type, and the source contact layer 114 comprises a second doped semiconductor material having a doping of a second conductivity type that is the opposite of the first conductivity type.

According to an aspect of the present disclosure, the source contact layer 114 comprises a planar source contact layer portion 114L having a uniform thickness and a plurality of source pillar portions 114P laterally spaced apart from each other and adjoined to the planar source contact layer portion 114L. In one embodiment, the plurality of source pillar portions 114P may be arranged as rows of source pillar portions 114P. Source pillar portions 114P within each row of source pillar portions 114P can be arranged along the first horizontal direction hd1. The rows of source pillar portions 114P can be laterally spaced apart along the second horizontal direction hd2.

In one embodiment, each source pillar portion 114P in the plurality of source pillar portions 114P can have a circular or oval horizontal cross-sectional shape having a first radius of curvature R1. Each of the vertical semiconductor channels 60 comprises a respective convex cylindrical sidewall that contacts a respective concave cylindrical sidewall of the planar source contact layer portion 114L.

The vertical stack of the lower source-level semiconductor layer 112, the source contact layer 114, and the upper source-level semiconductor layer 116 is herein referred to as source-level material layers 110. The lower source-level semiconductor layer 112 can contact a horizontal bottom surface of the planar source contact layer portion 114L, and the upper source-level semiconductor layer 116 can contact a horizontal top surface of the planar source contact layer portion 114L. The lower source-level semiconductor layer 112 can contact bottom surfaces and lower portions of cylindrical sidewalls of the plurality of source pillar portions 114P, and the upper source-level semiconductor layer 116 can contact upper portions of the cylindrical sidewalls of the plurality of source pillar portions 114P.

In one embodiment, the memory films 50 comprise outer sidewalls that contact the upper source-level semiconductor layer 116. The dielectric cap structures 150 can be embedded in the lower source-level semiconductor layer 112, can contact a bottom end of a respective one of the vertical semiconductor channels 60, and can comprise a stack of dielectric materials having a same set of dielectric materials as each of the memory films 50.

Figure 18A:
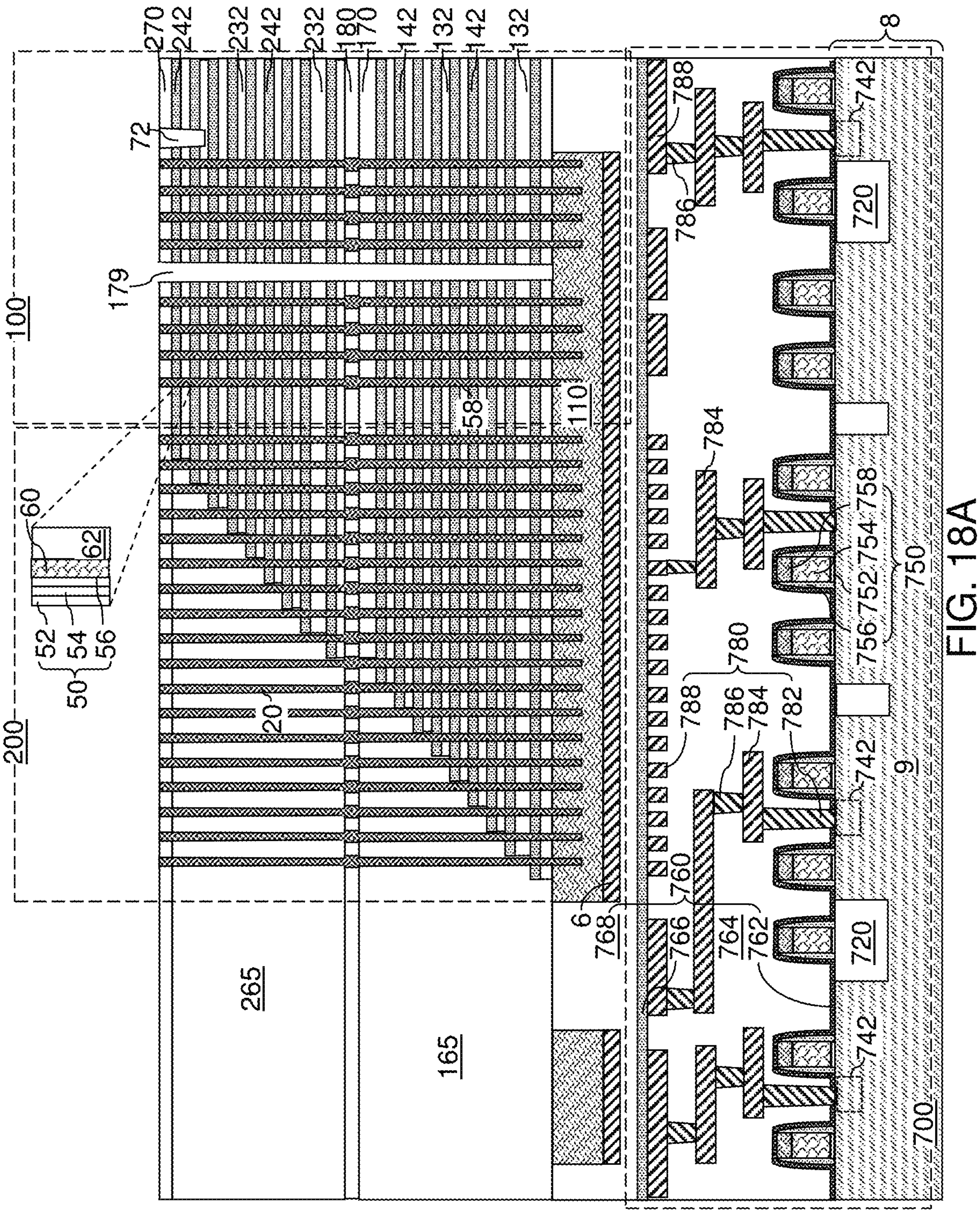
FIG. 18A is a vertical cross-sectional view of the first exemplary structure after formation of backside trenches according to an embodiment of the present disclosure.
Figure 18B:
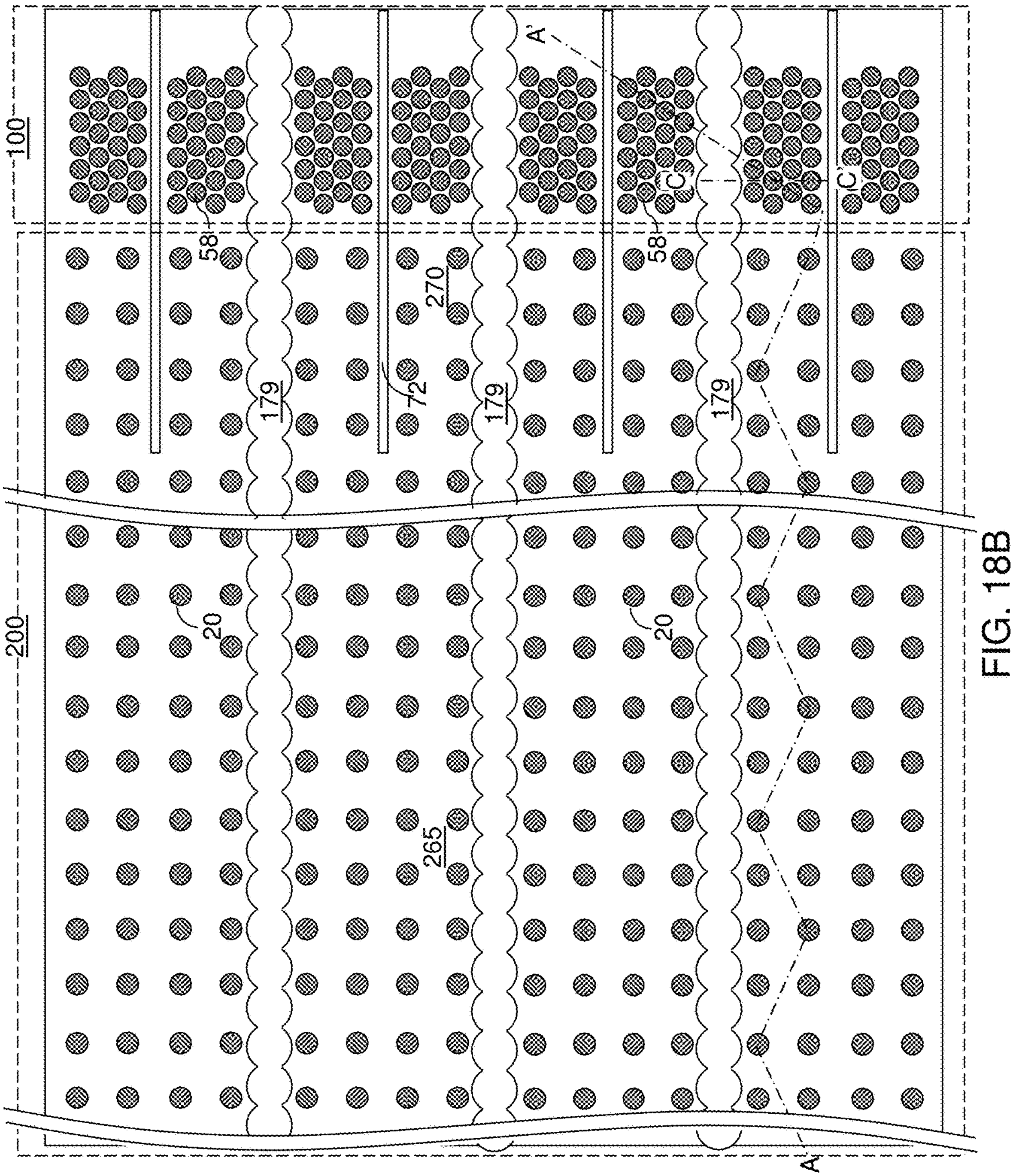
FIG. 18B is a top-down view of the first exemplary structure of FIG. 18A. The hinged vertical plane A-A' corresponds to the plane of the vertical cross-sectional view of FIG. 18A.
Figure 18C:
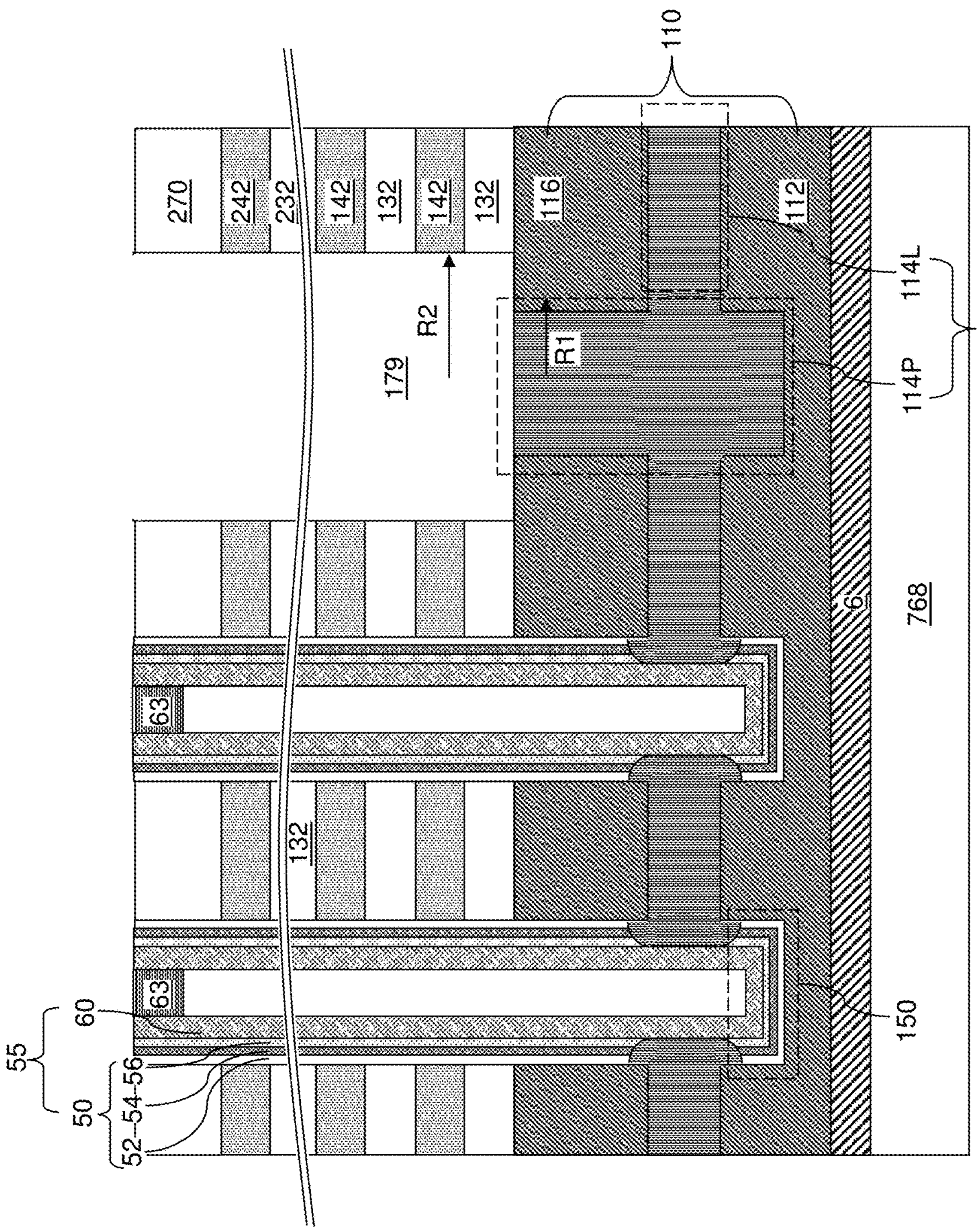
FIG. 18C is a vertical cross-sectional view of a region of the first exemplary structure along the vertical plane C-C' of FIG. 18B.

Referring to FIGS. 18A-18C, the backside openings 79 can be laterally expanded by performing an isotropic etch process that etches at least the material of the insulating layers (132, 232) of the alternating stack {(132, 142), (232, 242)}. The isotropic etch process may, or may not, etch the material of the sacrificial material layers (142, 242). The duration of the isotropic etch process is selected such that each row of backside openings 79 that laterally extend along the first horizontal direction hd1 merge at least at the level of the insulating layers (132, 242). Depending on whether the material of the sacrificial material layers (142, 242) is sufficiently etched isotropically or not, the backside openings 79 may, or may not, merge at the levels of the sacrificial material layers (142, 242).

In one embodiment, each row of backside openings 79 arranged along the first horizontal direction (e.g., word line direction) hd1 may merge at each level of the layers within the alternating stack {(132, 142), (232, 242)}. In another embodiment, each row of backside openings 79 arranged along the first horizontal direction hd1 may merge at levels of the insulating layers (132, 232), the insulating cap layers (170, 270), and the inter-tier dielectric layer 180, and may not merge at levels of the sacrificial material layer (142, 242). Generally, each row of backside openings 79 arranged along the first horizontal direction merges at least at the levels of the insulating layers (132, 232). Each set of the backside openings 79 that merge forms a respective backside trench 179. The backside trenches 179 laterally extend along the first horizontal direction hd1 and divide the alternating stack {(132, 142), (232, 242)} into a plurality of alternating stacks {(132, 142), (232, 242)} that are laterally spaced apart along the second horizontal direction hd2.

In an illustrative example, the insulating layers (132, 232) can include silicon oxide, and the isotropic etch process can employ dilute hydrofluoric acid. In one embodiment, each neighboring pair of alternating stacks is laterally spaced apart by a respective backside trench 179 laterally extending along the first horizontal direction hd1, having a width modulation along the second horizontal direction hd1 that is perpendicular to the first horizontal direction hd1, and overlying top surfaces of the plurality of source pillar portions 114P.

Each of the backside trenches 179 comprise a pair of lengthwise sidewalls that laterally extend along the first horizontal direction hd1. Each lengthwise sidewall of the backside trenches 179 comprises a plurality of concave vertical sidewall segments that are adjoined among one another at vertical edges. As used herein, a concave vertical sidewall segment refers to a sidewall segment having a concave horizontal cross-sectional profile and extending straight along a vertical direction. As used herein, a convex vertical sidewall segment refers to a sidewall segment having a convex horizontal cross-sectional profile and extending straight along a vertical direction.

In one embodiment, the source pillar portions 114P may have a circular or oval horizontal cross-sectional shape with a first radius of curvature R1, and the concave vertical sidewall segments of the lengthwise sidewalls of the backside trenches 179 can have a second radius of curvature R2 that is greater than the first radius of curvature R1.

Figure 19:
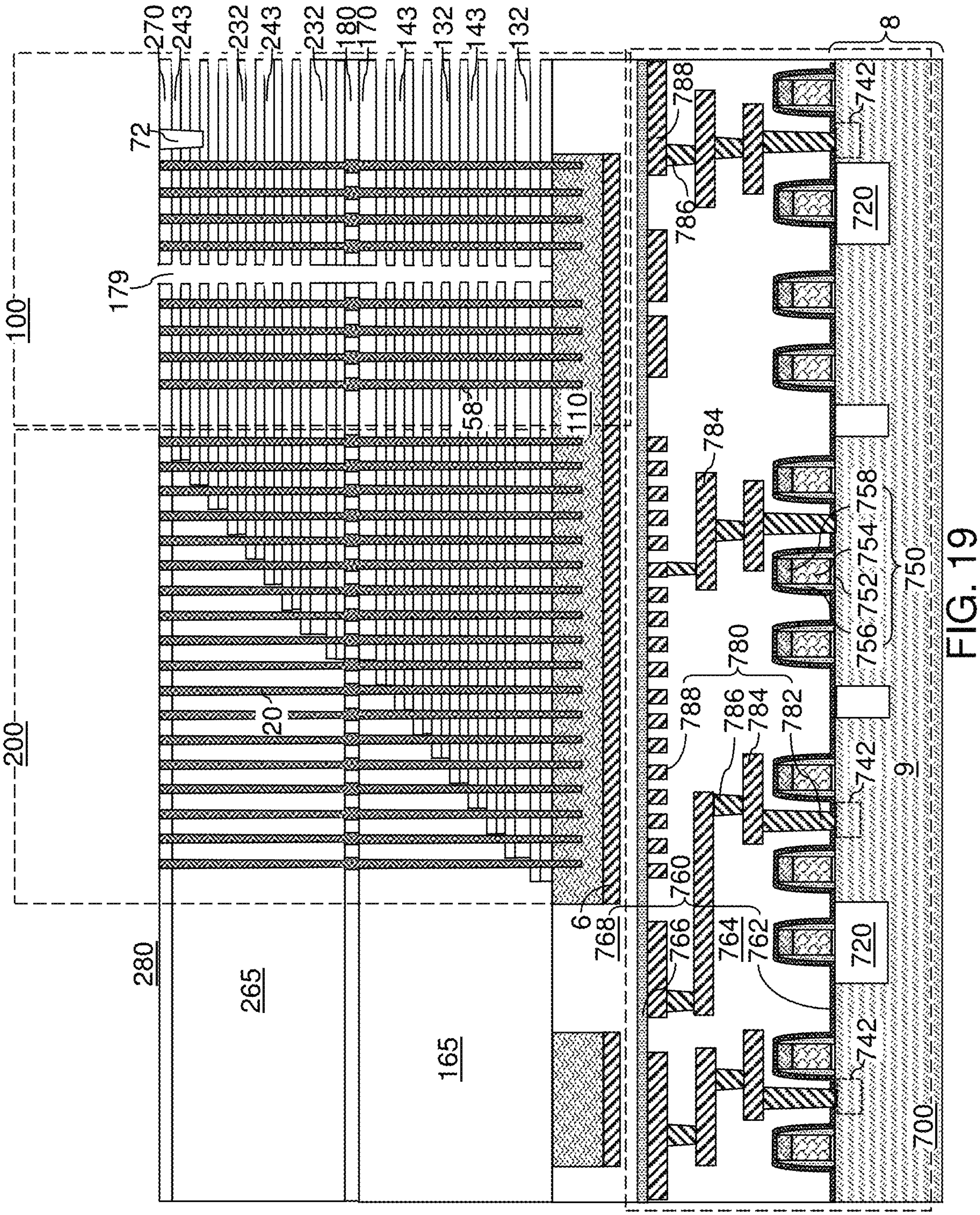
FIG. 19 is a vertical cross-sectional view of the first exemplary structure after formation of backside recesses according to an embodiment of the present disclosure.

Referring to FIG. 19, the sacrificial material layers (142, 242) are removed selective to the insulating layers (132, 232), the first and second insulating cap layers (170, 270), the first contact-level dielectric layer 280, and the source contact layer 114. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the first exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 20A:
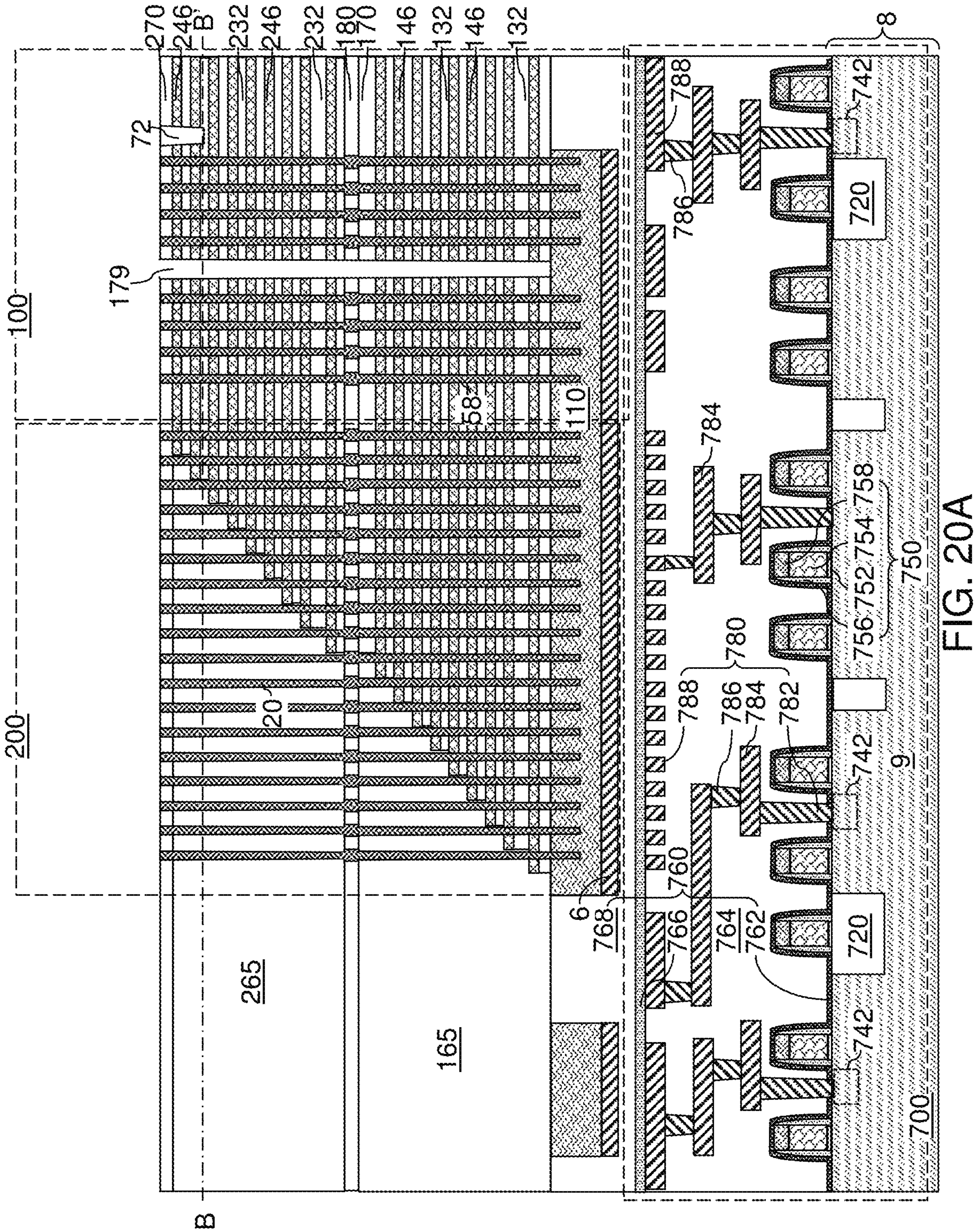
FIG. 20A is a vertical cross-sectional view of the first exemplary structure after formation of electrically conductive layers according to an embodiment of the present disclosure.
Figure 20B:
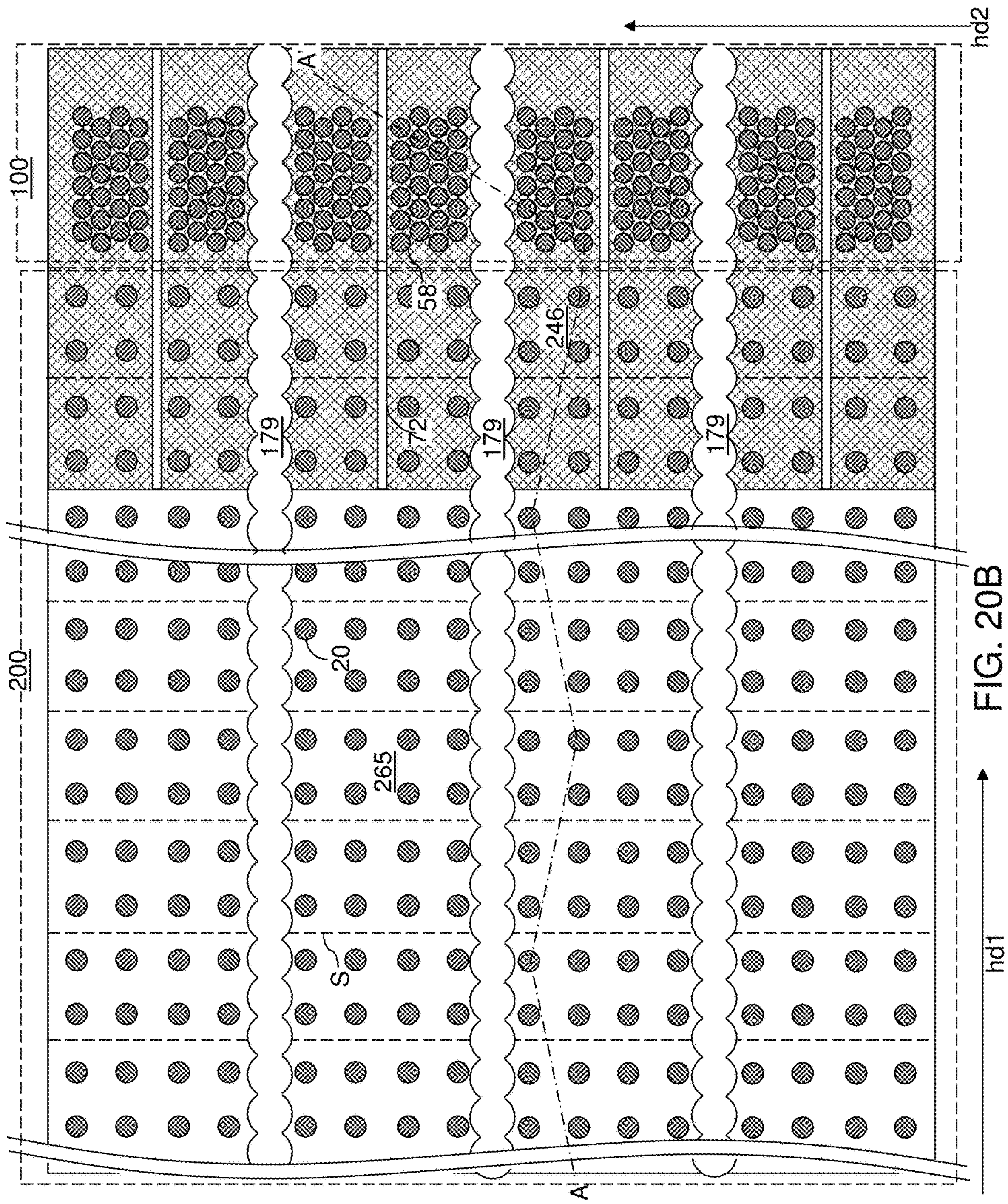
FIG. 20B is a horizontal cross-sectional view of the first exemplary structure along the horizontal plane B-B' of FIG. 20A. The hinged vertical plane A-A' corresponds to the plane of the vertical cross-sectional view of FIG. 20A.
Figure 21A:
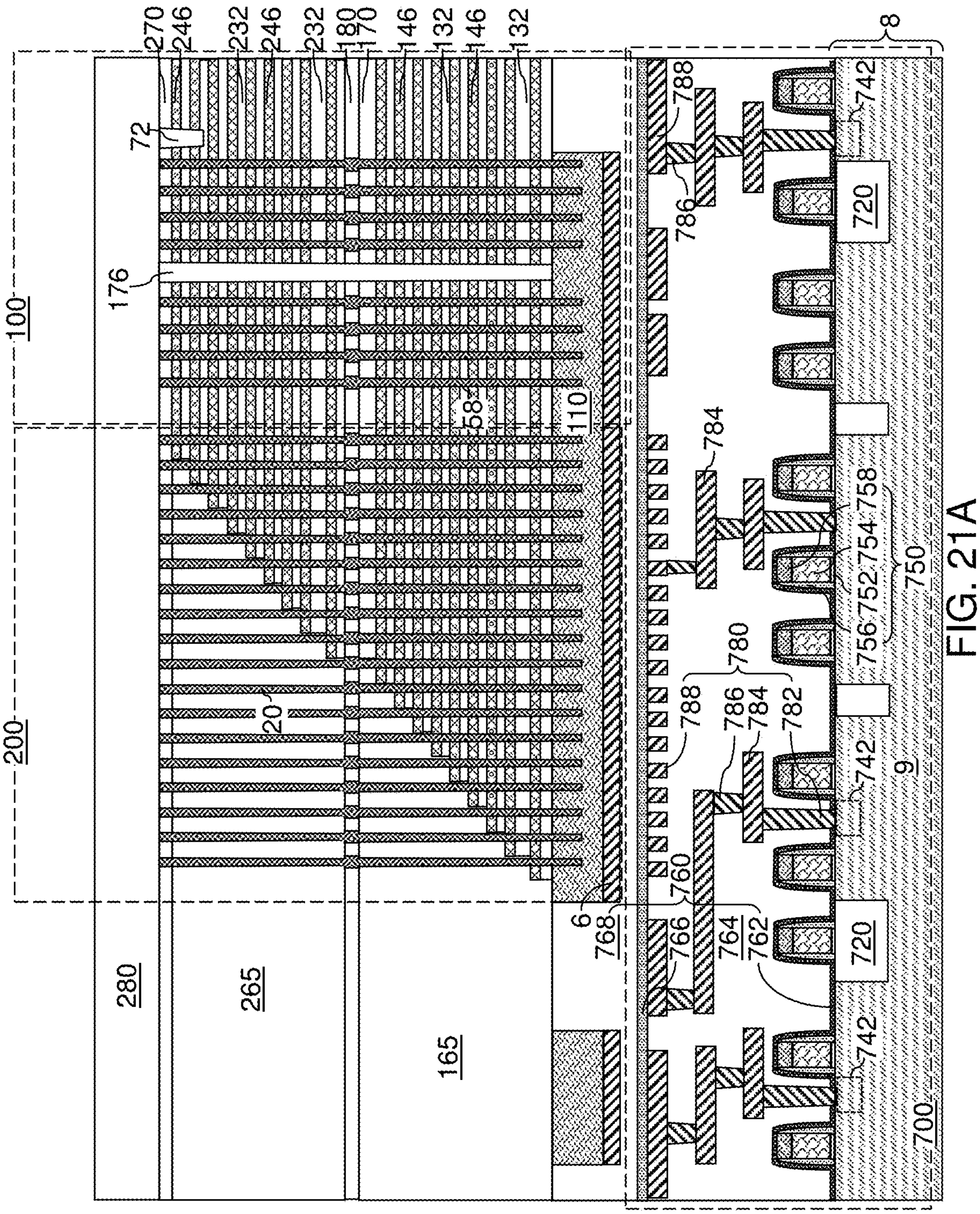
FIG. 21A is a vertical cross-sectional view of the first exemplary structure after formation of dielectric backside trench fill structures in the backside trenches according to an embodiment of the present disclosure.
Figure 21B:
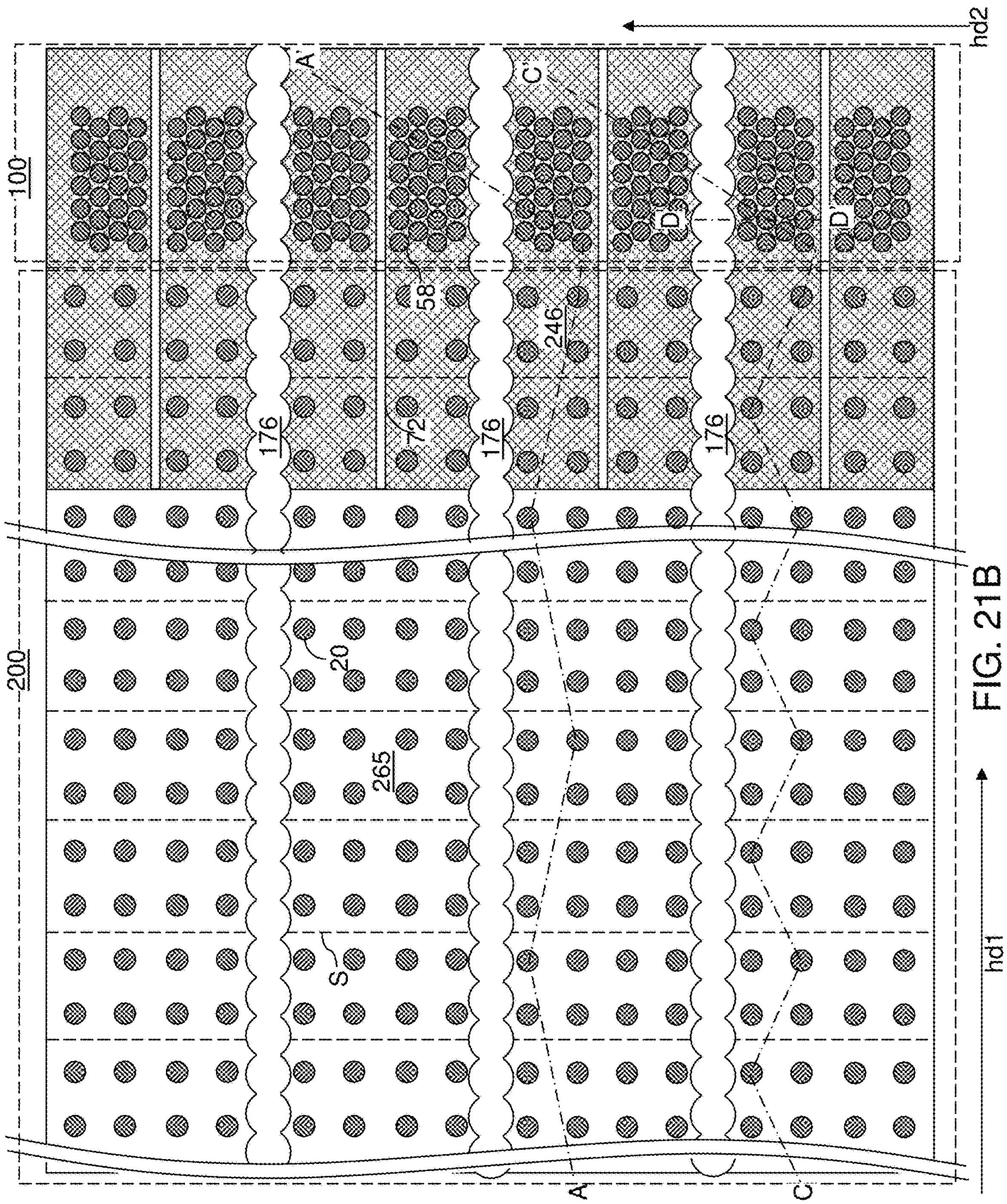
FIG. 21B is a horizontal cross-sectional view of the first exemplary structure along the horizontal plane B-B' of FIG. 21A. The hinged vertical plane A-A' corresponds to the plane of the vertical cross-sectional view of FIG. 21A.
Figure 21C:
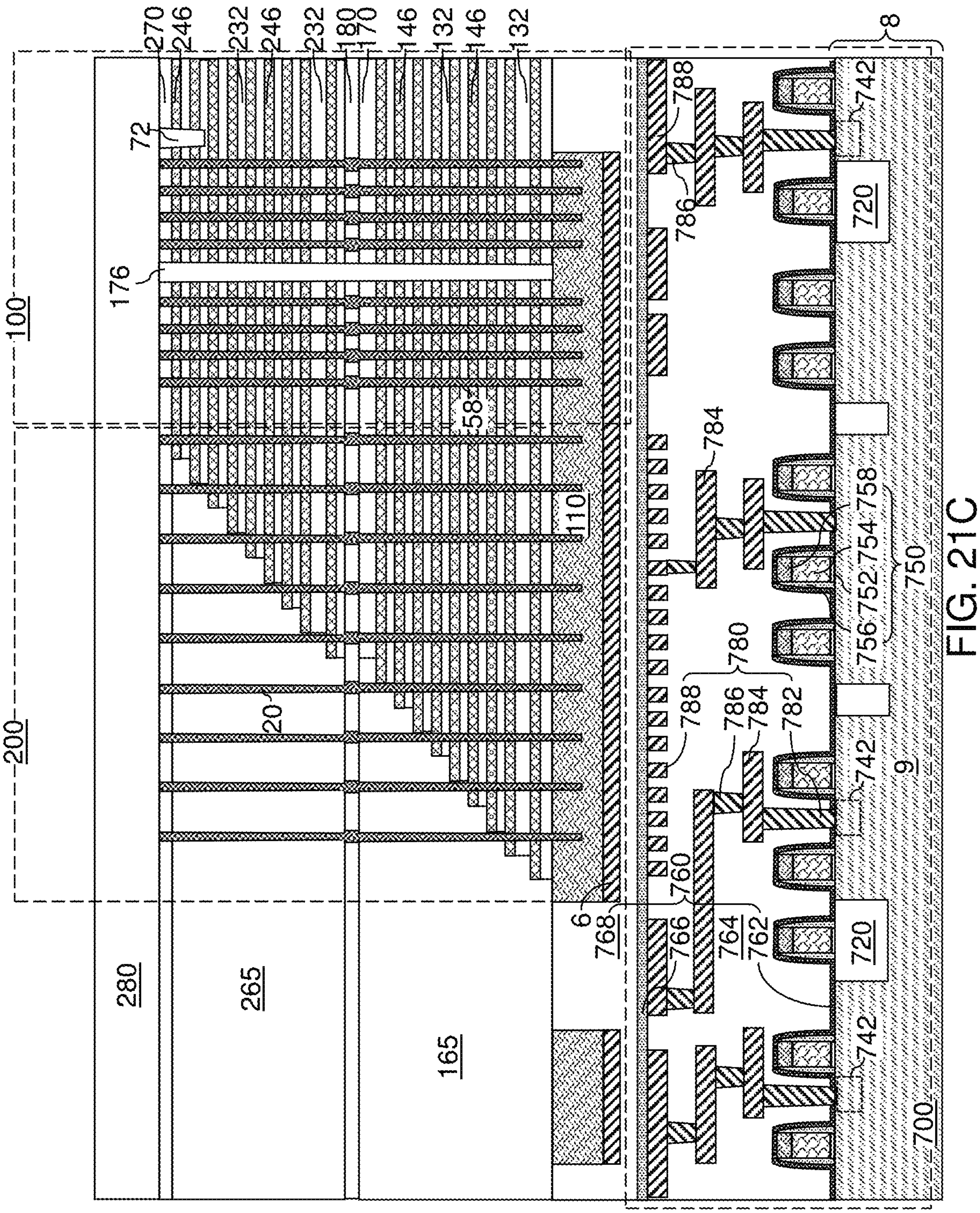
FIG. 21C is a vertical cross-sectional view of the first exemplary structure along the vertical plane C-C' of FIG. 21B.
Figure 21D:
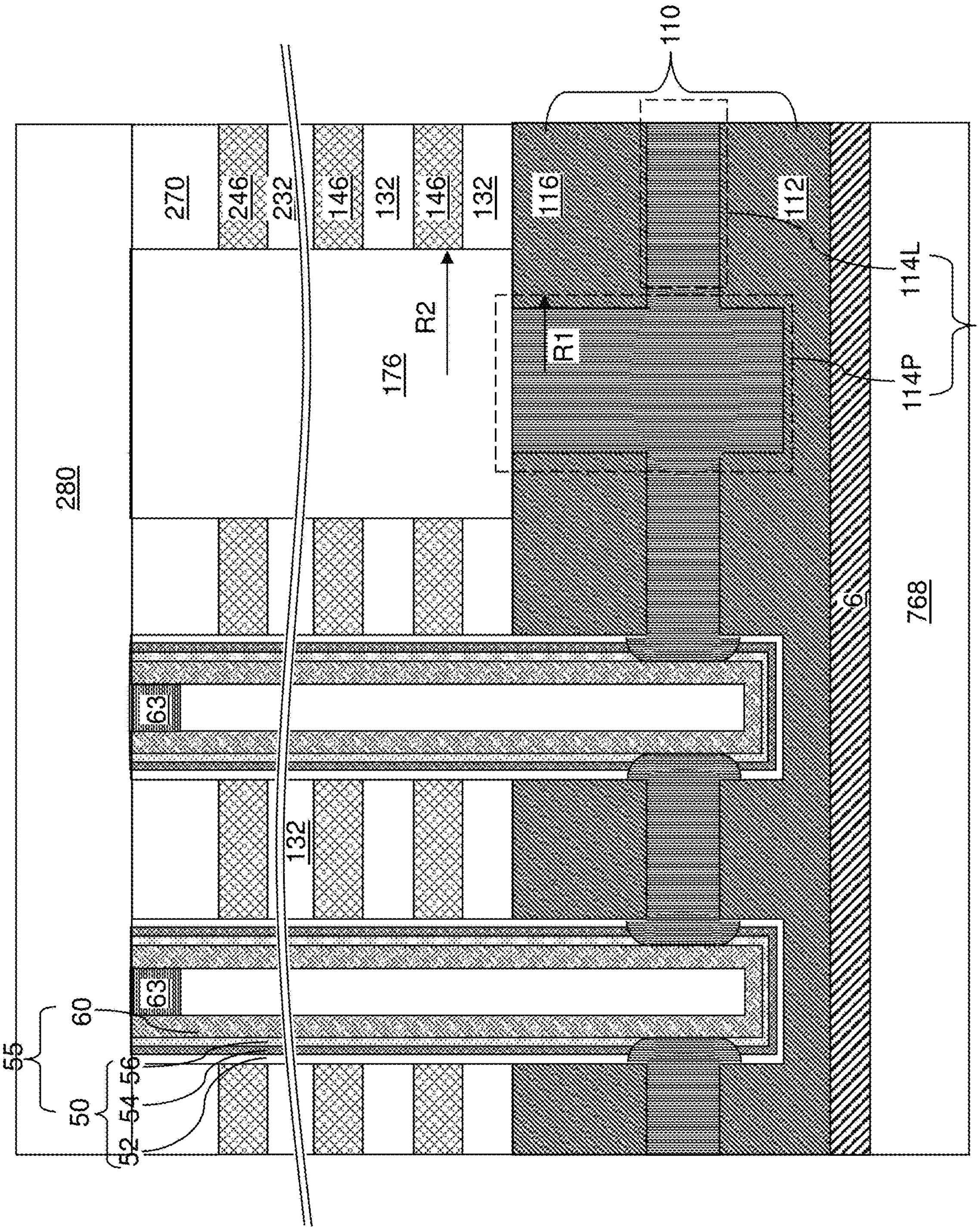
FIG. 21D is a vertical cross-sectional view of a region of the first exemplary structure along the vertical plane D-D' of FIG. 21B.

Referring to FIGS. 20A and 20B, a backside blocking dielectric layer (not shown) may be optionally deposited in the backside recesses (143, 243) and the backside trenches 79 and over the second insulating cap layer 270. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (143, 243), on the sidewalls of the backside trenches 79, and over the second insulating cap layer 270. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting first exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the second insulating cap layer 270. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the second insulating cap layer 270, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Generally, remaining portions of the sacrificial material layers (142, 242) are replaced with electrically conductive layers (146, 246). Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

Referring to FIGS. 21A-21D, a dielectric material can be deposited in the backside trenches 179 and over the second insulating cap layer 270. The dielectric material can include undoped silicate glass or a doped silicate glass. Each portion of the dielectric material that fills a backside trench 179 constitutes a dielectric backside trench fill structure 176. The horizontally extending portion of the dielectric material that overlies the second insulating cap layer 270 comprises a contact-level dielectric layer 280.

Generally, each backside trench 179 can be filled with a respective dielectric backside trench fill structure 176. Each dielectric backside trench fill structure 176 includes a pair of lengthwise sidewalls that laterally extend along the first horizontal direction hd1. Each lengthwise sidewall of the pair of lengthwise sidewalls comprises convex vertical sidewall segments adjoined among one another at vertical edges. In one embodiment, each source pillar portion 114P of the plurality of source pillar portions 114P can have a circular or oval horizontal cross-sectional shape having a first radius of curvature R1. The convex vertical sidewall segments of the dielectric backside trench fill structure 176 can have a second radius of curvature R2 that is greater than the first radius of curvature R1.

In one embodiment, each row of source pillar portions 114P can be arranged along the first horizontal direction hd1, and can underlie, and contact, a respective dielectric backside trench fill structure 176 that fills a respective backside trench 179. In one embodiment, each of the electrically conductive layers (146, 246) comprises a plurality of convex vertical sidewall segments that contact a respective dielectric backside trench fill structure 176. In one embodiment, each of the insulating layers (132, 232) comprises a plurality of convex vertical sidewall segments that contact a respective dielectric backside trench fill structure 176.

Figure 22A:
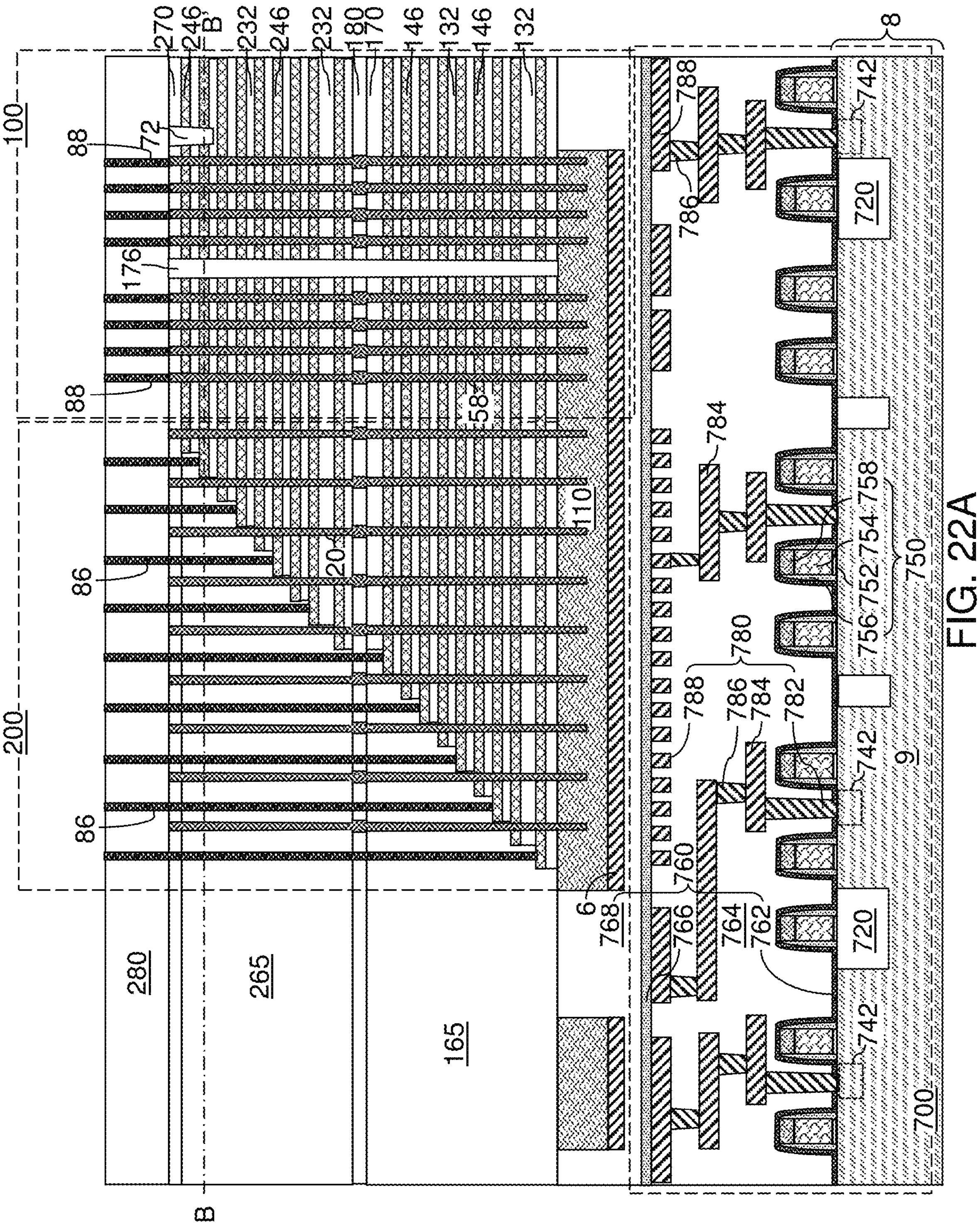
FIG. 22A is a vertical cross-sectional view of the first exemplary structure after formation of a contact-level dielectric layer and various contact via structures according to an embodiment of the present disclosure.
Figure 22B:
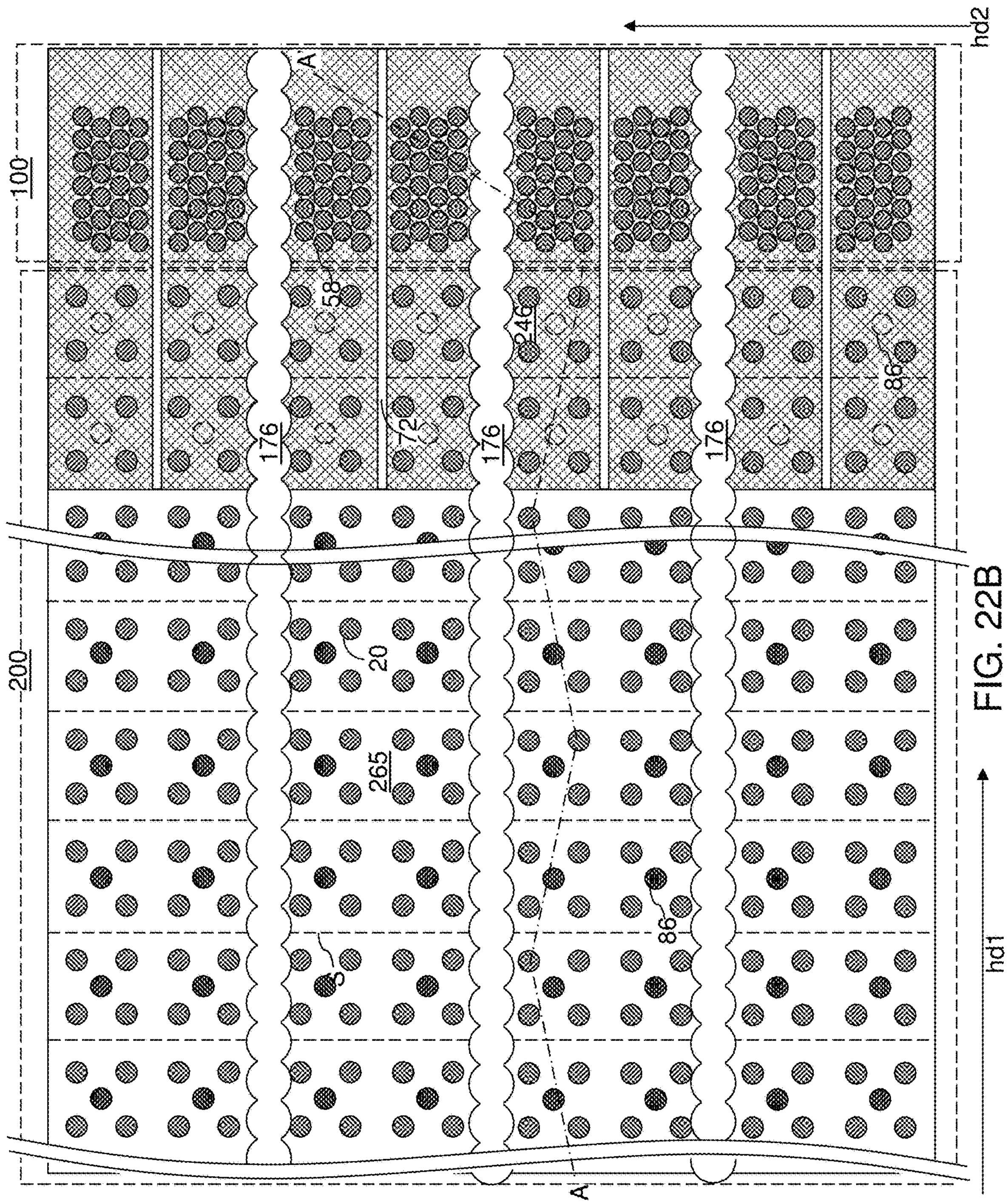
FIG. 22B is a horizontal cross-sectional view of the first exemplary structure along the vertical plane B-B' of FIG. 22A. The hinged vertical plane A-A' corresponds to the plane of the vertical cross-sectional view of FIG. 22A.

Referring to FIGS. 22A and 22B, a photoresist layer (not shown) may be applied over the contact-level dielectric layer 280, and may be lithographically patterned to form various contact via openings. For example, openings for forming drain contact via structures may be formed in the memory array region 100, and openings for forming staircase region contact via structures may be formed in the staircase region 200. An anisotropic etch process is performed to transfer the pattern in the photoresist layer through the contact-level dielectric layer 280 and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Referring to FIGS. 1A-22 and according to various embodiments of the present disclosure, a three-dimensional memory device is provided, which comprises: source-level material layers 110 located over a substrate 8 and comprising a source contact layer 114, wherein the source contact layer 114 comprises a planar source contact layer portion 114L and a plurality of source pillar portions 114P laterally spaced apart from each other and adjoined to the planar source contact layer portion 114L; alternating stacks of insulating layers (132, 232) and electrically conductive layers (146, 246) located over the source-level material layers 114, wherein each neighboring pair of alternating stacks {(132, 246), (232, 246)} is laterally spaced apart by a respective backside trench 179 laterally extending along a first horizontal direction hd1, and overlying top surfaces of the plurality of source pillar portions 114P; memory openings 49 vertically extending through a respective one of the alternating stacks {(132, 246), (232, 246)}; and memory opening fill structures 58 located in the memory openings 49 and comprising a vertical semiconductor channel 60 and a memory film 50.

In one embodiment, each of the vertical semiconductor channels 60 comprises a respective convex cylindrical sidewall that contacts a respective concave cylindrical sidewall of the planar source contact layer portion 114L. In one embodiment, an entirety of the source contact layer 114 is a unitary structure that continuously extends underneath the alternating stacks {(132, 246), (232, 246)} and having a homogeneous material composition throughout.

In one embodiment, the vertical semiconductor channels 60 comprise a first doped semiconductor material having a doping of a first conductivity type; and the source contact layer 114 comprises a second doped semiconductor material having a doping of a second conductivity type that is the opposite of the first conductivity type.

In one embodiment, each backside trench 179 has a width modulation along a second horizontal direction that is perpendicular to the first horizontal direction; each backside trench 179 is filled with a respective dielectric backside trench fill structure 176 including a pair of lengthwise sidewalls that laterally extend along the first horizontal direction hd1; and each lengthwise sidewall of the pair of lengthwise sidewalls comprises convex vertical sidewall segments adjoined to each other at vertical edges. In one embodiment, each source pillar portion 114P of the plurality of source pillar portions 114P has a circular horizontal cross-sectional shape having a first radius of curvature R1; and the convex vertical sidewall segments have a second radius of curvature R2 that is greater than the first radius of curvature R1.

In one embodiment, the plurality of source pillar portions 114P are arranged as rows of source pillar portions 114P; and each row of source pillar portions 114P is arranged along the first horizontal direction hd1 and underlies, and contacts, a dielectric backside trench fill structure 176 that fills a respective backside trench 179. In one embodiment, each of the electrically conductive layers (146, 246) comprises a plurality of convex vertical sidewall segments that contacts the respective dielectric backside trench fill structure 176. In one embodiment, each of the insulating layers (132, 232) comprises a plurality of convex vertical sidewall segments that contacts the respective dielectric backside trench fill structure 176.

In one embodiment, the source-level material layers 110 comprise: a lower source-level semiconductor layer 112 contacting a horizontal bottom surface of the planar source contact layer portion 114L and overlying the substrate 8; and an upper source-level semiconductor layer 116 contacting a horizontal top surface of the planar source contact layer portion 114L and underlying the alternating stacks {(132, 146), (232, 246)}. In one embodiment, the lower source-level semiconductor layer 112 contacts bottom surfaces and lower portions of cylindrical sidewalls of the plurality of source pillar portions 114P; and the upper source-level semiconductor layer 116 contacts upper portions of the cylindrical sidewalls of the plurality of source pillar portions 114P.

In one embodiment, the memory films 50 comprise outer sidewalls that contact the upper source-level semiconductor layer 116; and the three-dimensional memory device comprises dielectric cap structures 150 embedded in the lower source-level semiconductor layer 112, contacting a bottom end of a respective one of the vertical semiconductor channels 60, and comprising a stack of dielectric materials having a same set of dielectric materials as each of the memory films.

Figure 23A:
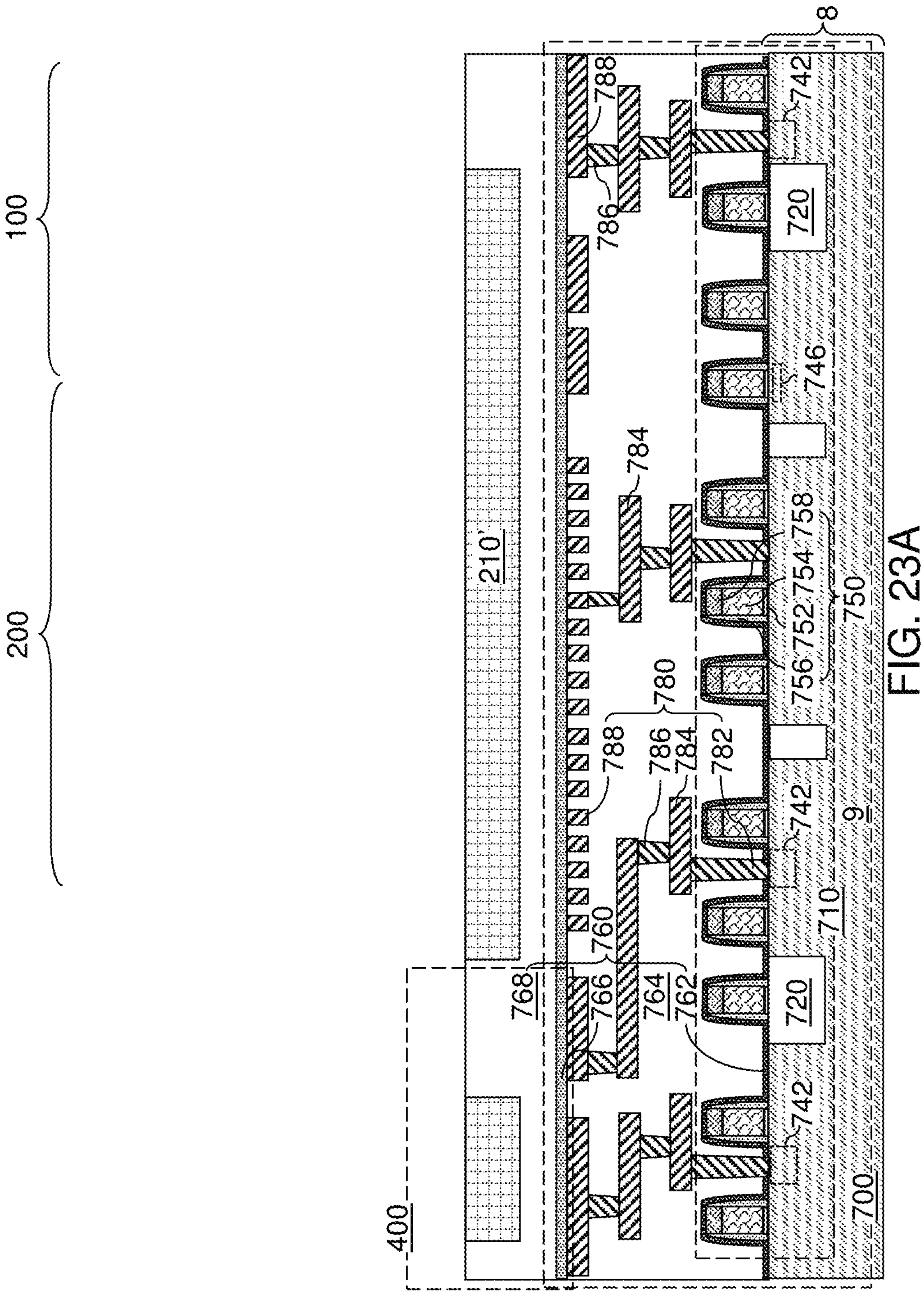
FIG. 23A is a vertical cross-sectional view of a second exemplary structure after formation of semiconductor devices, lower level dielectric layers, lower metal interconnect structures, and in-process source level material layers on a semiconductor substrate according to an embodiment of the present disclosure.
Figure 23B:
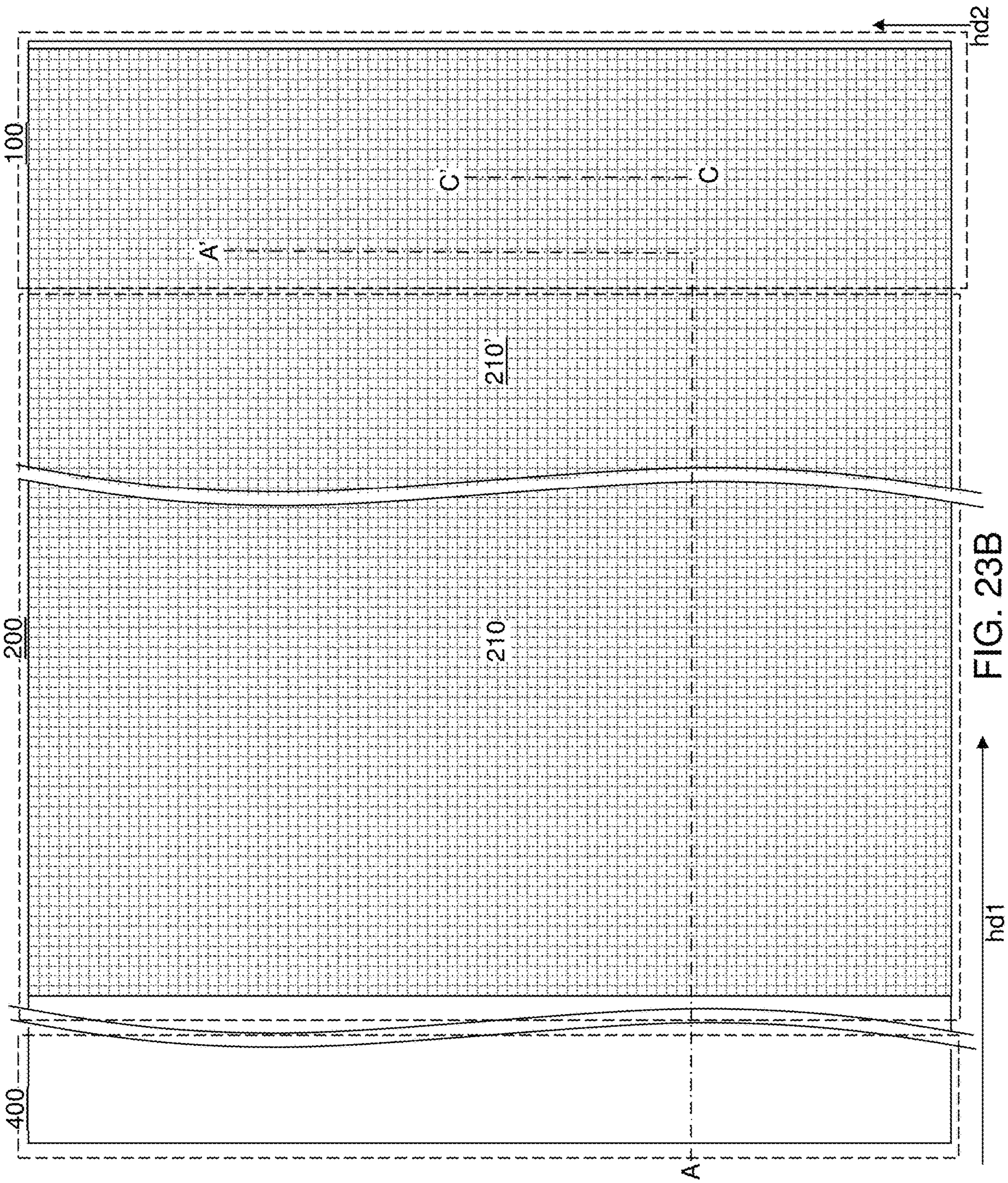
FIG. 23B is a top-down view of the second exemplary structure of FIG. 23A. The hinged vertical plane A-A' is the plane of the vertical cross-sectional view of FIG. 23A.
Figure 23C:
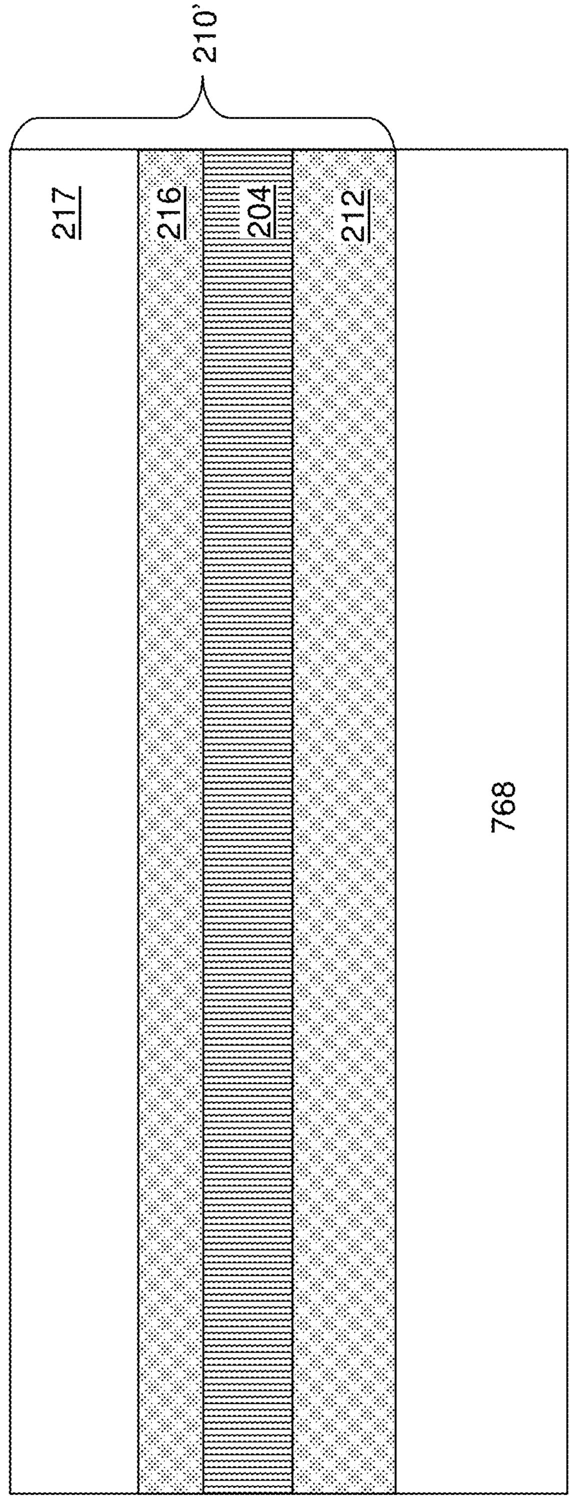
FIG. 23C is a magnified view of the in-process source level material layers along the vertical plane C-C' of FIG. 23B.

Referring to FIGS. 23A-23C, a second exemplary structure according to a second embodiment of the present disclosure can be derived from the first exemplary structure illustrated in FIGS. 1A-1C by omitting formation of a conductive plate layer 6 and by forming in-process source-level material layers 210' instead of the in-process source-level material layers 110' of the first exemplary structure. The in-process source-level material layers 210' of the second exemplary structure differ in material composition from the in-process source-level material layers 110' of the first exemplary structure.

In the second exemplary structure, the peripheral device region 700 may be located on the side of the memory array region 100, below the memory array region 100 or above the memory array region 100. Thus, formation of the semiconductor devices 710 below the memory array region 100 is optional. The semiconductor devices 710 may be formed on a separate substrate and then bonded over the memory array region 100. Generally, at least one dielectric material layer can be formed over the substrate 8. The at least one dielectric material layer may, or may not, embed metal interconnect structures therein. In one embodiment, the at least one dielectric material layer may include lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

The in-process source-level material layers 210' may include material layers which are subsequently modified to form source-level material layers. The source-level material layers upon formation include a source contact layer that functions as a common source region for vertical charge storage field effect transistors (e.g., vertical NAND strings) of a three-dimensional memory device. In one embodiment, the in-process source-level material layers 210' may include, from bottom to top, a lower source-level dielectric etch-stop layer 212, a source-level sacrificial layer 204, an upper source-level dielectric etch-stop layer 216, and a source-level insulating layer 217.

The lower source-level dielectric etch-stop layer 212 and the upper source-level dielectric etch-stop layer 216 include a dielectric material that provides high etch resistance to the etch chemistry of an anisotropic etch process to be subsequently employed to etch the insulating layers (132, 232) and the sacrificial material layers (142, 242). For example, the lower source-level dielectric etch-stop layer 212 and the upper source-level dielectric etch-stop layer 216 comprise carbon at an atomic concentration in a range from 2% to 30%. In one embodiment, each of the lower source-level dielectric etch-stop layer 212 and the upper source-level dielectric etch-stop layer 216 comprise silicon oxide carbide (i.e., silicon oxycarbide). In this case, the atomic concentration of silicon atoms in the lower source-level dielectric etch-stop layer 212 and the upper source-level dielectric etch-stop layer 216 can be in a range from 30% to 40%, the atomic concentration of oxygen atoms in the lower source-level dielectric etch-stop layer 212 and the upper source-level dielectric etch-stop layer 216 can be in a range from 40% to 66%, and the atomic concentration of carbon atoms in the lower source-level dielectric etch-stop layer 212 and the upper source-level dielectric etch-stop layer 216 can be a range from 2% to 30%, although lesser and greater atomic concentrations may also be employed for each of silicon atoms, carbon atoms, and oxygen atoms. The thickness of each of the lower source-level dielectric etch-stop layer 212 and the upper source-level dielectric etch-stop layer 216 may be in a range from 30 nm to 600 nm, such as from 60 nm to 300 nm, although lesser and greater thicknesses may also be used.

The source-level sacrificial layer 204 includes a sacrificial material that may be removed selective to the lower source-level dielectric etch-stop layer 212 and the upper source-level dielectric etch-stop layer 216. In one embodiment, the source-level sacrificial layer 204 may include a semiconductor material such as undoped amorphous silicon, polysilicon or a silicon-germanium alloy. The thickness of the source-level sacrificial layer 204 may be in a range from 60 nm to 1,000 nm, such as from 120 nm to 600 nm, although lesser and greater thicknesses may also be used.

The source-level insulating layer 217 includes a dielectric material such as silicon oxide. The thickness of the source-level insulating layer 217 may be in a range from 20 nm to 400 nm, such as from 40 nm to 200 nm, although lesser and greater thicknesses may also be used.

The in-process source-level material layers 210' may be formed directly above a subset of the semiconductor devices 710 on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The in-process source-level material layers 210' may be patterned to provide openings in areas in which through-memory-level contact via structures and through-dielectric contact via structures are to be subsequently formed. The in-process source-level material layers 210' may be patterned such that an opening extends over a staircase region 200 in which contact via structures contacting word line electrically conductive layers are to be subsequently formed. In one embodiment, the staircase region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the in-process source-level material layers 210' may be formed within the area of a memory array region 100, in which a three-dimensional memory array including memory stack structures is to be subsequently formed. A peripheral region 400 that is subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. Alternatively, the peripheral device region 700 may be located on the side of the memory array region 100 or may be bonded above the memory array region 100. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

Figure 24:
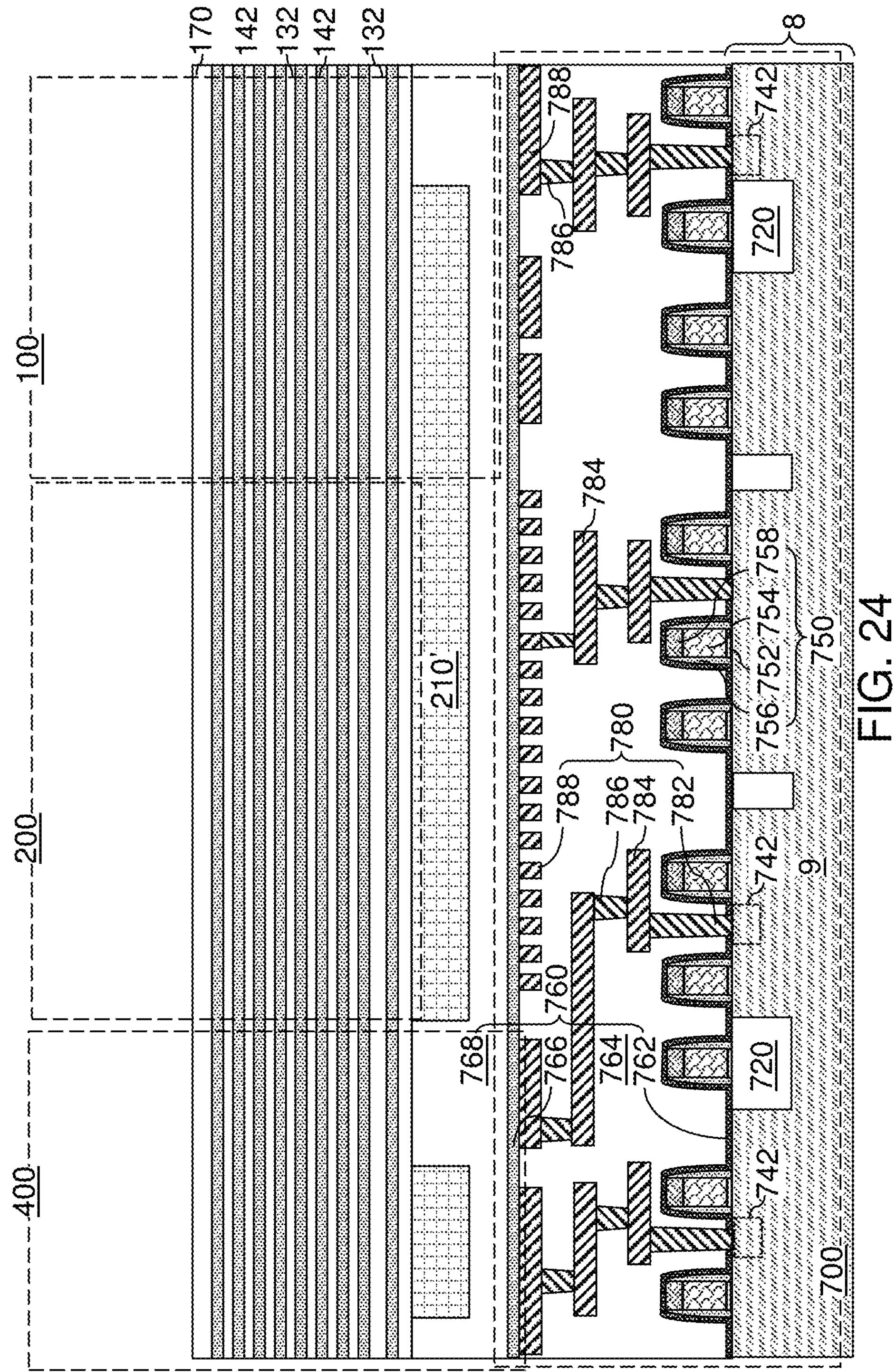
FIG. 24 is a vertical cross-sectional view of the second exemplary structure after formation of a first-tier alternating stack of first insulting layers and first spacer material layers according to an embodiment of the present disclosure.

Referring to FIG. 24, an alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 210'. Generally, a first-tier alternating stack (132, 142) can be formed in the same manner as in the first exemplary structure by performing the processing steps of FIG. 2. The first-tier alternating stack (132, 142) can be the same in structure and in material composition as in the first exemplary structure of FIG. 2. A first insulating cap layer 170 is subsequently formed over the first-tier alternating stack (132, 142).

Figure 25:
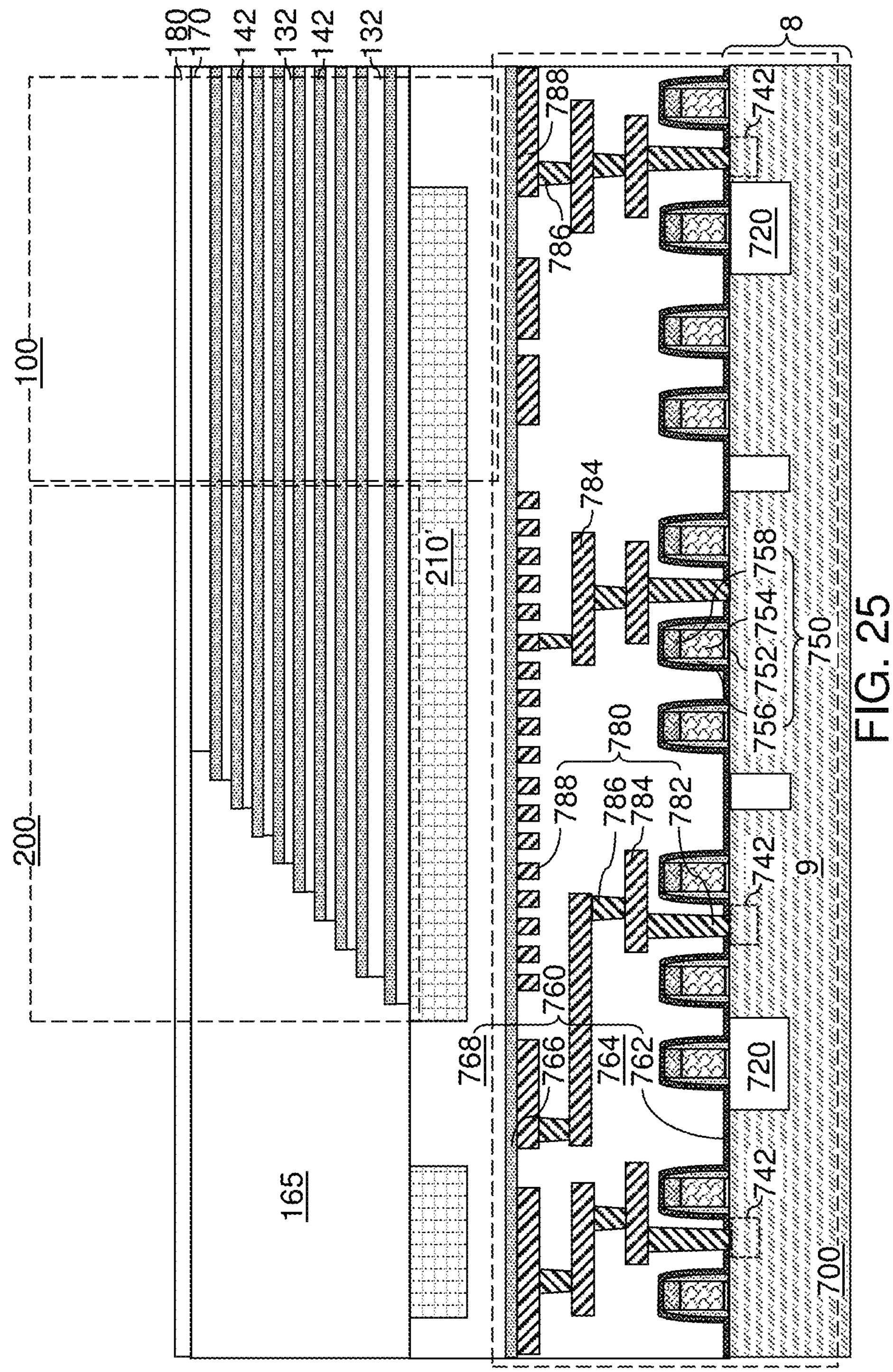
FIG. 25 is a vertical cross-sectional view of the second exemplary structure after patterning a first-tier staircase region, a first retro-stepped dielectric material portion, and an inter-tier dielectric layer according to an embodiment of the present disclosure.

Referring to FIG. 25, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 26A:
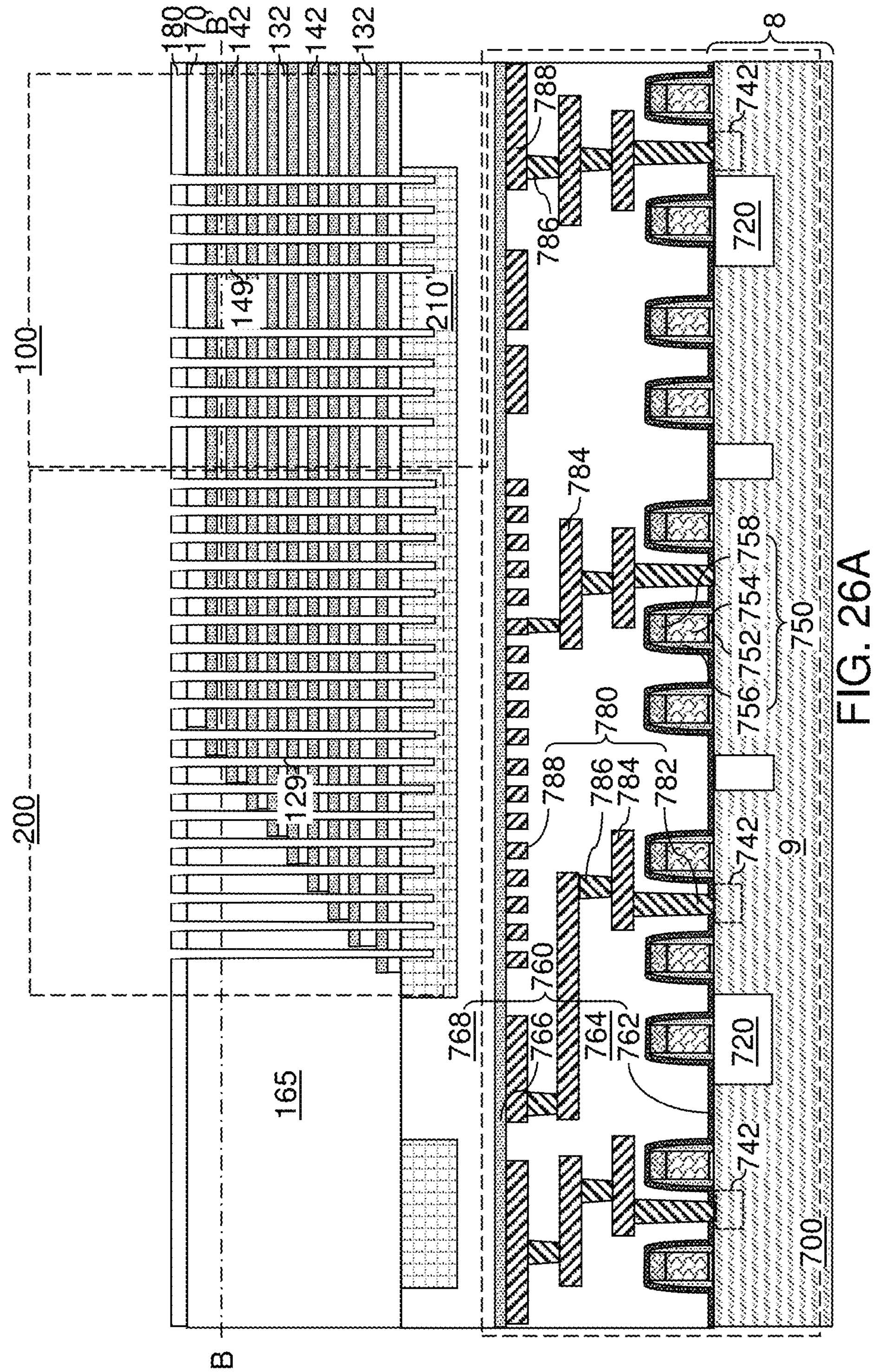
FIG. 26A is a vertical cross-sectional view of the second exemplary structure after formation of first-tier memory openings and first-tier support openings according to an embodiment of the present disclosure.
Figure 26B:
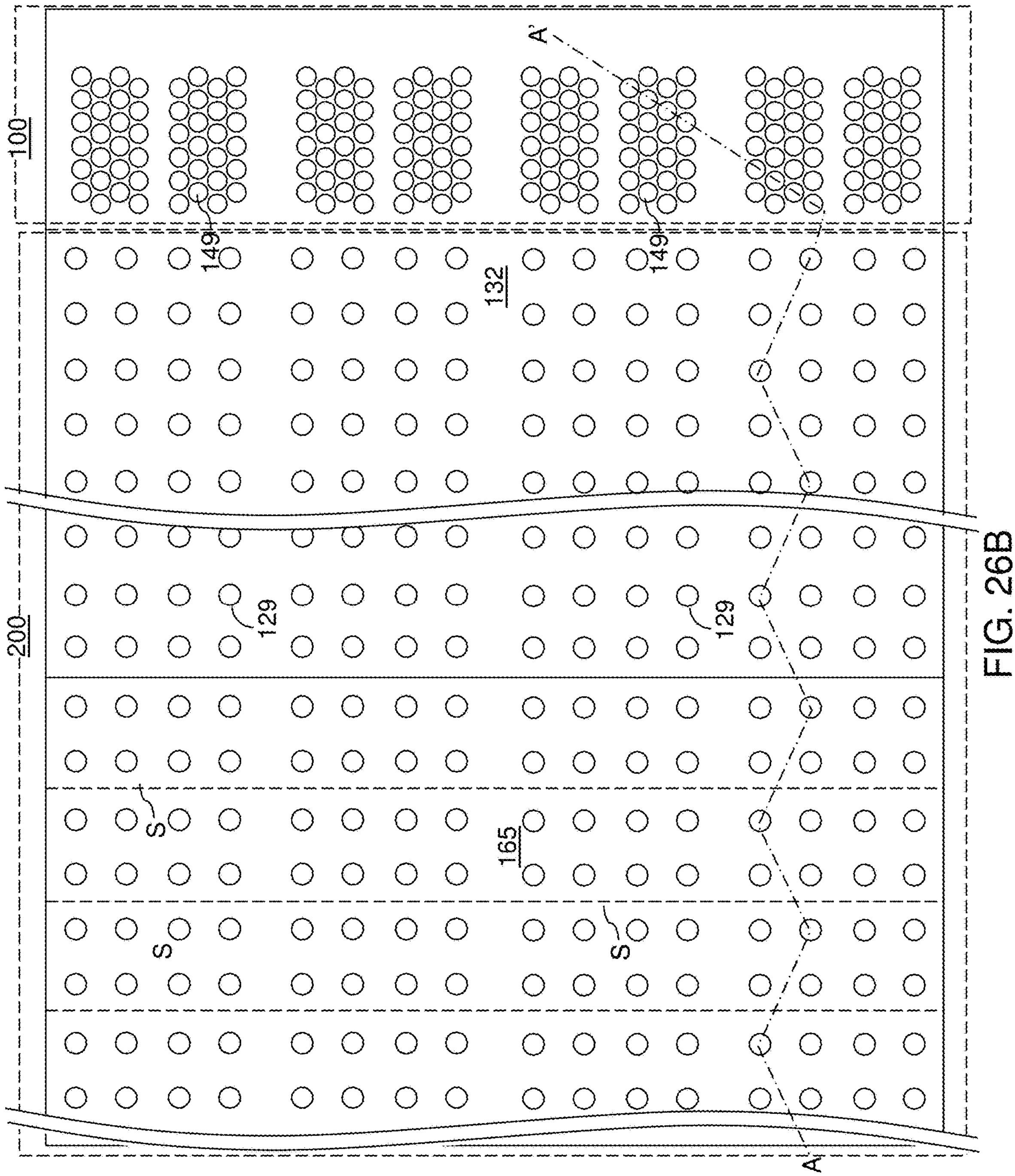
FIG. 26B is a horizontal cross-sectional view of the second exemplary structure of FIG. 26A. The hinged vertical plane A-A' corresponds to the plane of the vertical cross-sectional view of FIG. 26A.

Referring to FIGS. 26A and 26B, various first-tier openings (149, 129) may be formed through the inter-tier dielectric layer 180 and the first-tier structure (132, 142, 170, 165) and into the in-process source-level material layers 210'. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the in-process source-level material layers 210' by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first-tier alternating stack (132, 142) are illustrated as dotted lines in FIG. 26B.

The first-tier memory openings 149 are openings that are formed in the memory array region 100 through each layer within the first-tier alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200, and are subsequently employed to form support pillar structures. A subset of the first-tier support openings 129 that is formed through the first retro-stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered.

After etching through the alternating stack (132, 142) and the first retro-stepped dielectric material portion 165, the chemistry of a terminal portion of the first anisotropic etch process may be selected to etch through the dielectric material(s) of the at least one second dielectric layer 768 with a higher etch rate than an average etch rate for the in-process source-level material layers 210'. For example, the terminal portion of the anisotropic etch process may include a step that etches the dielectric material(s) of the at least one second dielectric layer 768 selective to a semiconductor material within a component layer in the in-process source-level material layers 210'. In one embodiment, the terminal portion of the first anisotropic etch process may etch through the, the source-level insulating layer 217, the upper source-level dielectric etch-stop layer 216, the, the source-level sacrificial layer 204, and the, and at least partly into the lower source-level dielectric etch-stop layer 212. The terminal portion of the first anisotropic etch process may include at least one etch chemistry for etching the various semiconductor materials of the in-process source-level material layers 210'. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 27:
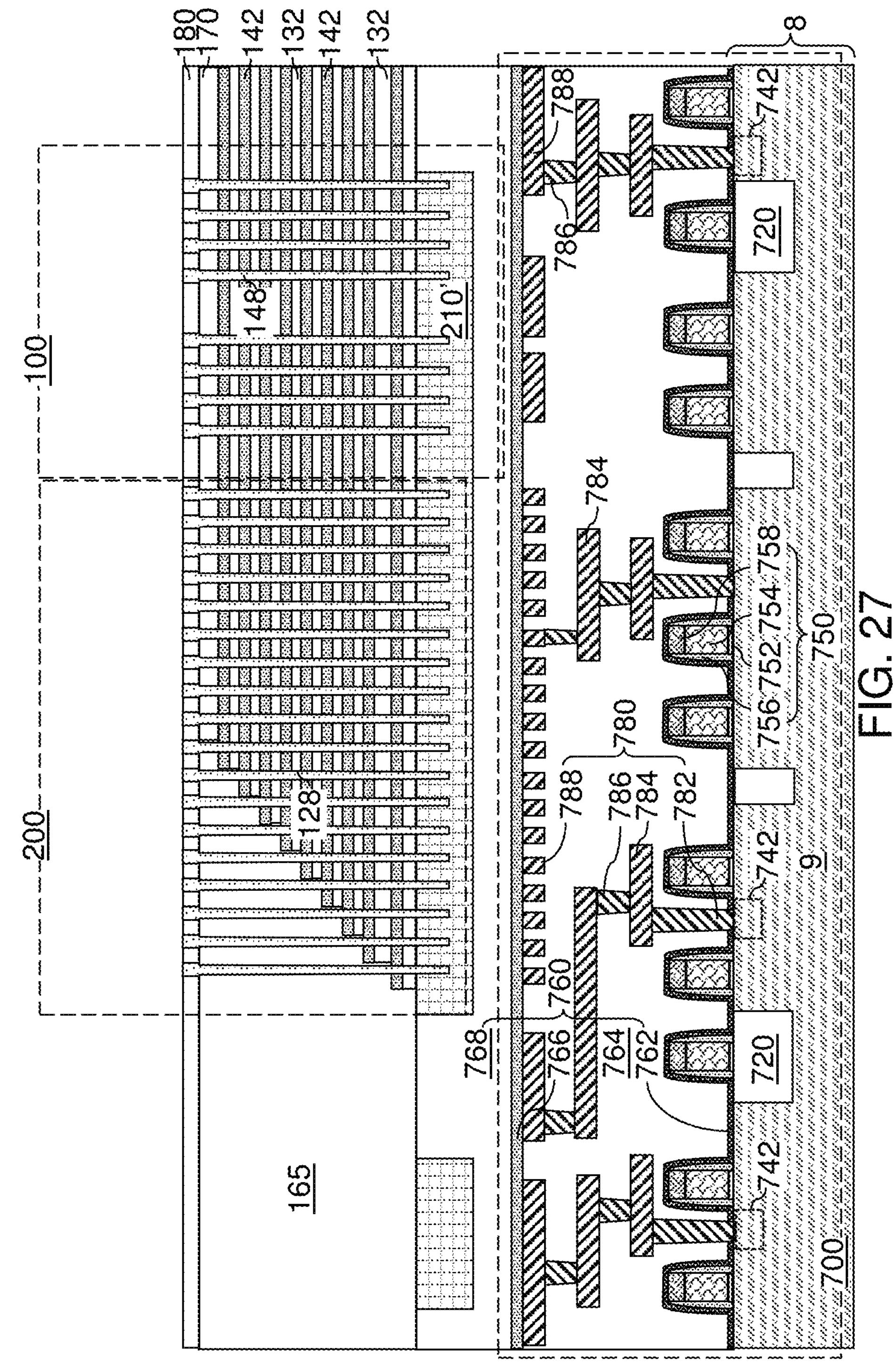
FIG. 27 is a vertical cross-sectional view of the second exemplary structure after formation of various sacrificial fill structures according to an embodiment of the present disclosure.

Referring to FIG. 27, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first-tier alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch-stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first-tier alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 28:
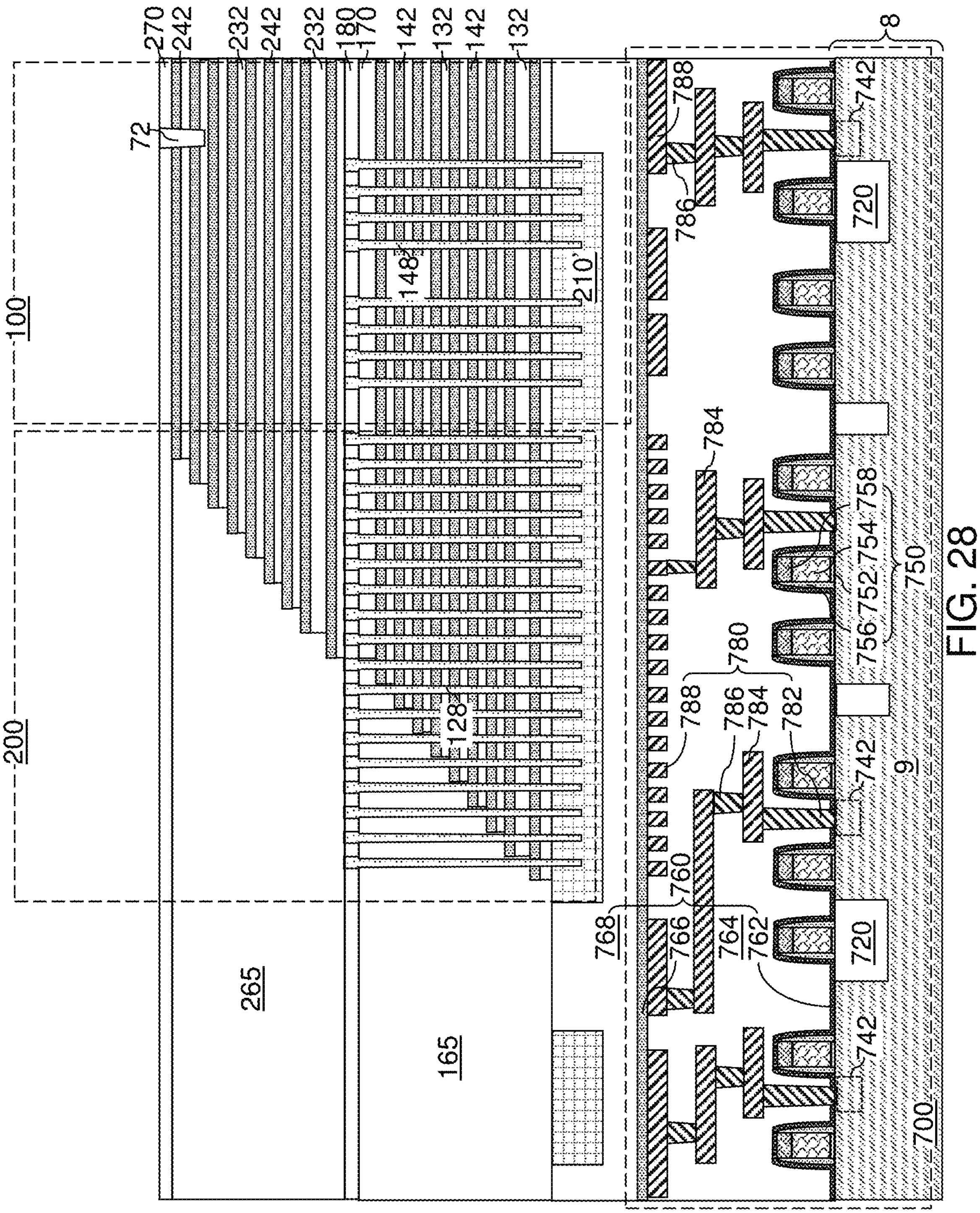
FIG. 28 is a vertical cross-sectional view of the second exemplary structure after formation of a second-tier alternating stack of second insulating layers and second spacer material layers, second stepped surfaces, and a second retro-stepped dielectric material portion according to an embodiment of the present disclosure.

Referring to FIG. 28, a second-tier structure may be formed over the first-tier structure (132, 142, 170, 148). The second-tier structure may include an additional alternating stack of insulating layers and spacer material layers, which may be sacrificial material layers. For example, a second-tier alternating stack (232, 242) of material layers may be subsequently formed on the top surface of the first-tier alternating stack (132, 142). The second-tier alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second-tier alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second-tier alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second-tier alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level material layers 210', and at least one retro-stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second-tier alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 29A:
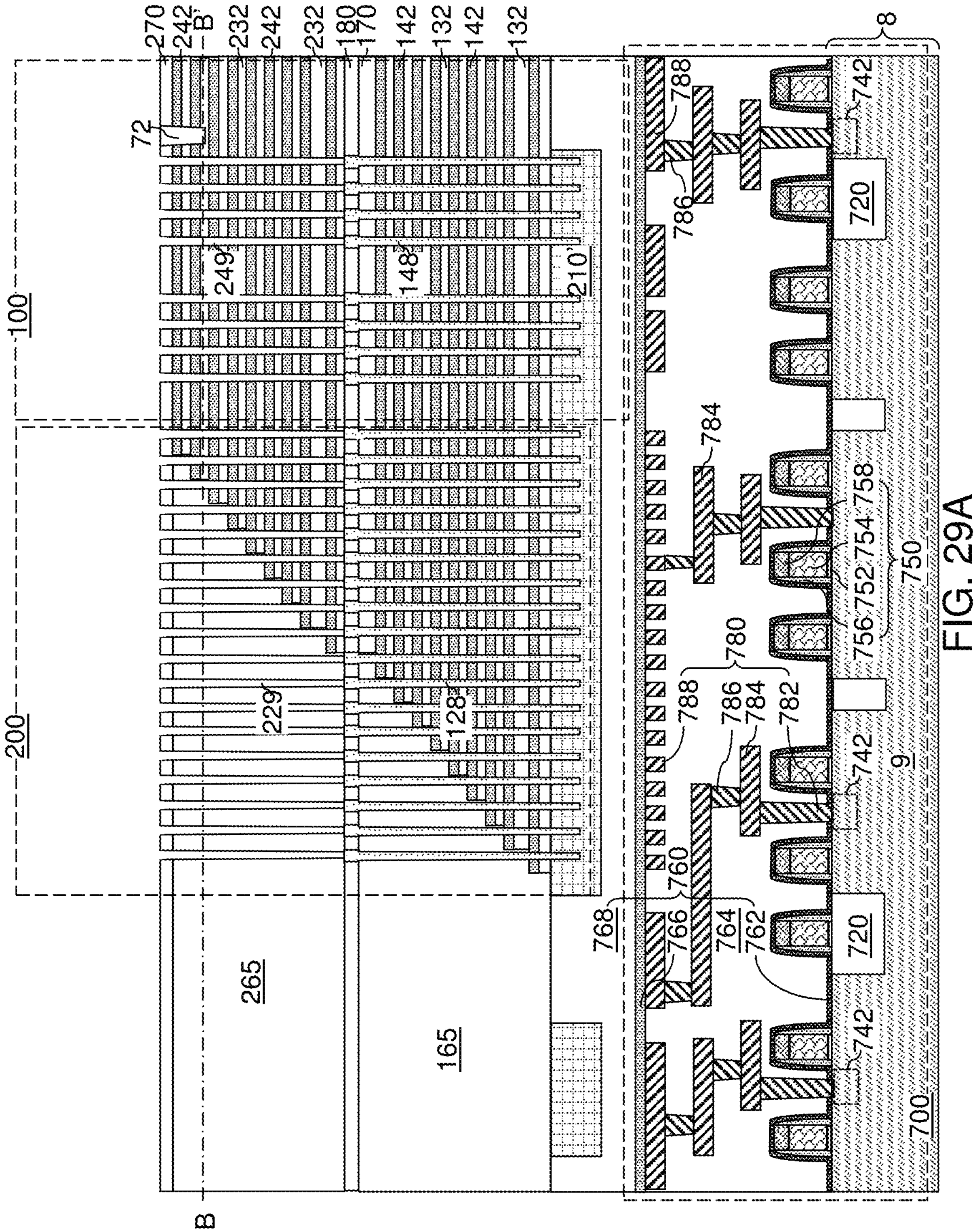
FIG. 29A is a vertical cross-sectional view of the second exemplary structure after formation of second-tier memory openings and second-tier support openings according to an embodiment of the present disclosure.
Figure 29B:
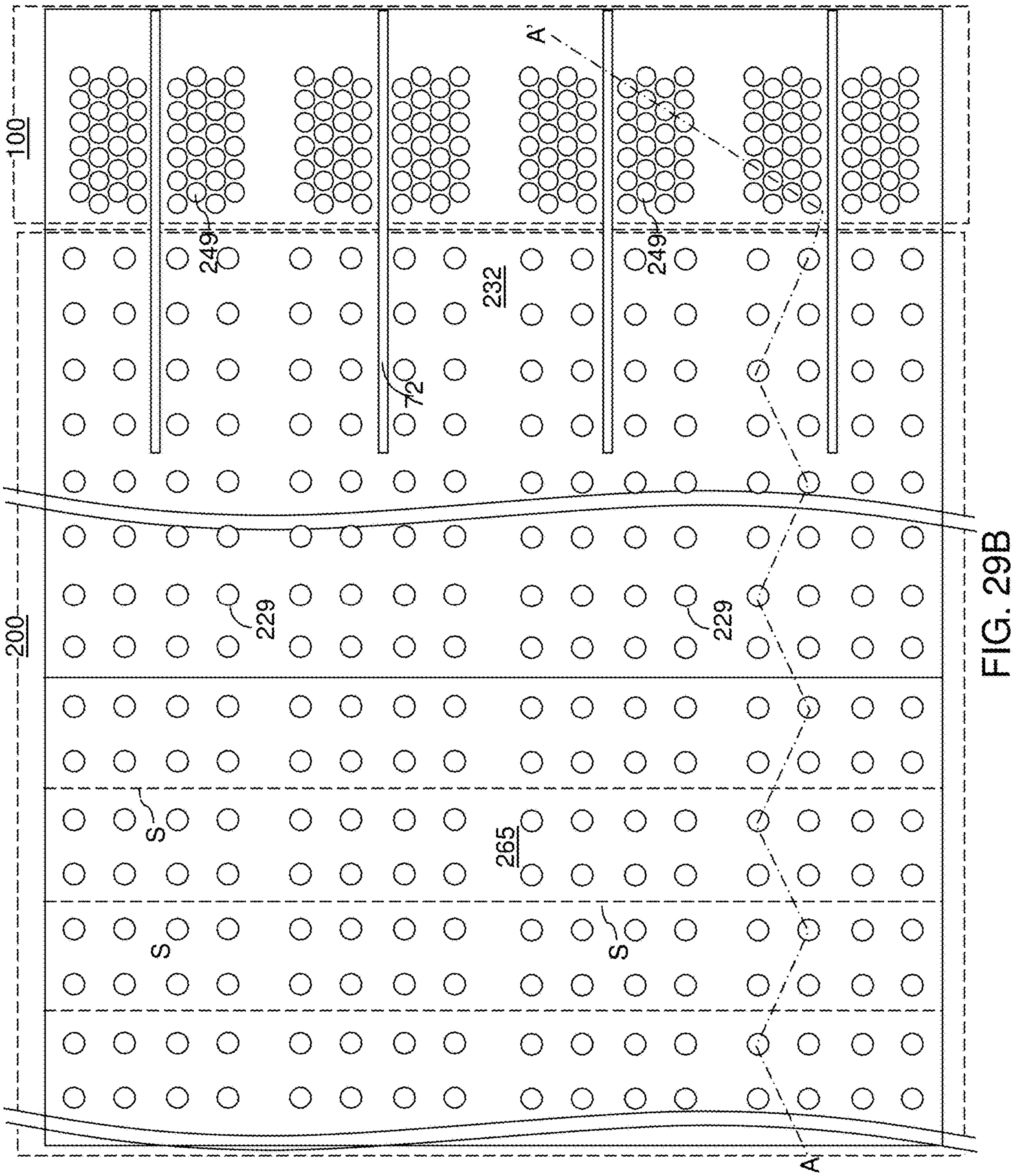
FIG. 29B is a horizontal cross-sectional view of the second exemplary structure along the horizontal plane B-B' of FIG. 29A. The hinged vertical plane A-A' corresponds to the plane of the vertical cross-sectional view of FIG. 29A.

Referring to FIGS. 29A and 29B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second-tier alternating stack (232, 242) and the second retro-stepped dielectric material portion 265. Locations of steps S in the first-tier alternating stack (132, 142) and the second-tier alternating stack (232, 242) are illustrated as dotted lines in FIG. 29B.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 30:
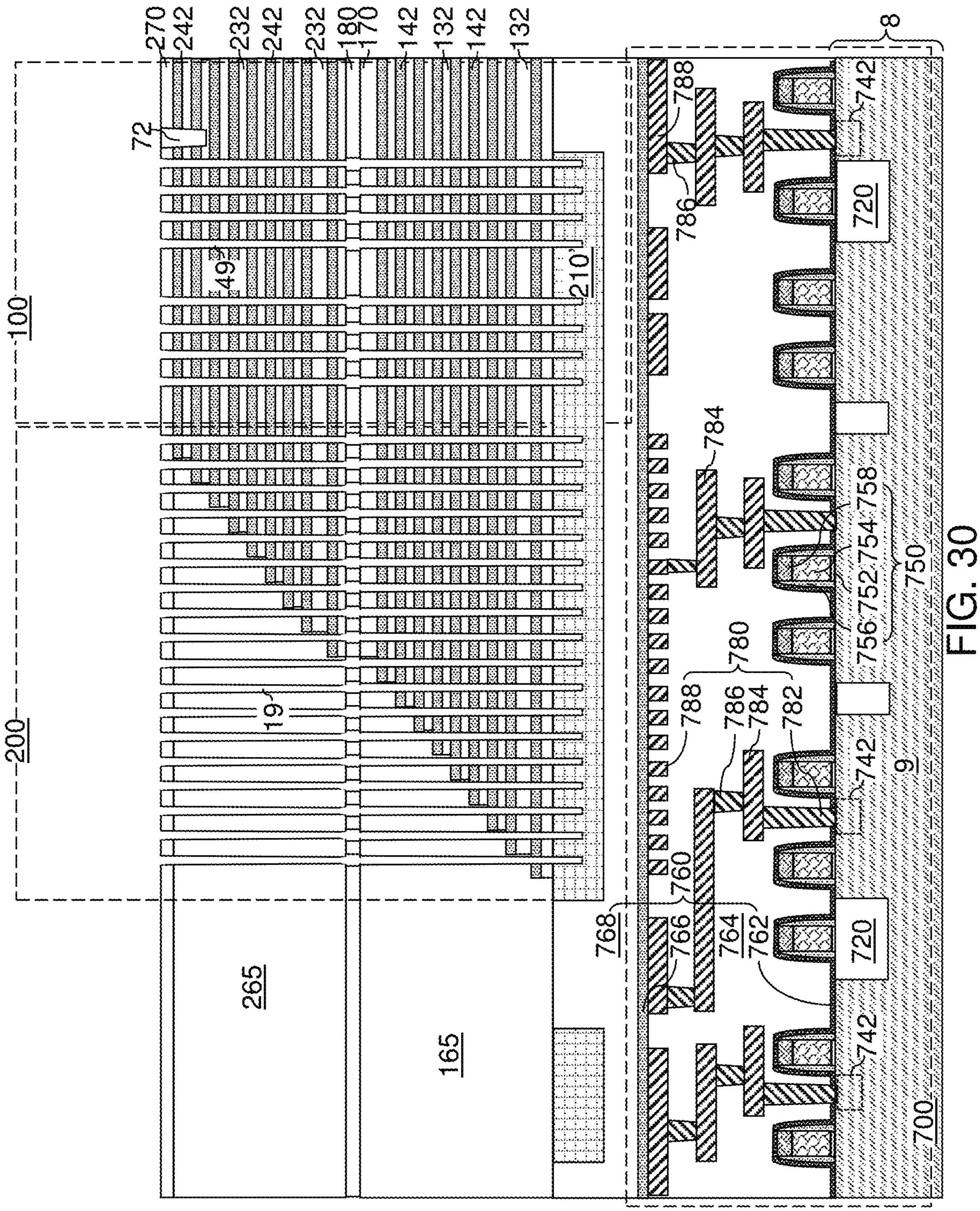
FIG. 30 is a vertical cross-sectional view of the second exemplary structure after formation of inter-tier memory openings and inter-tier support openings according to an embodiment of the present disclosure.

Referring to FIG. 30, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142,242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 30A-30D provide sequential cross-sectional views of a memory opening 49 during formation of a memory opening fill structure. The same structural change occurs in each of the memory openings 49 and the support openings 19.

Figure 31B:
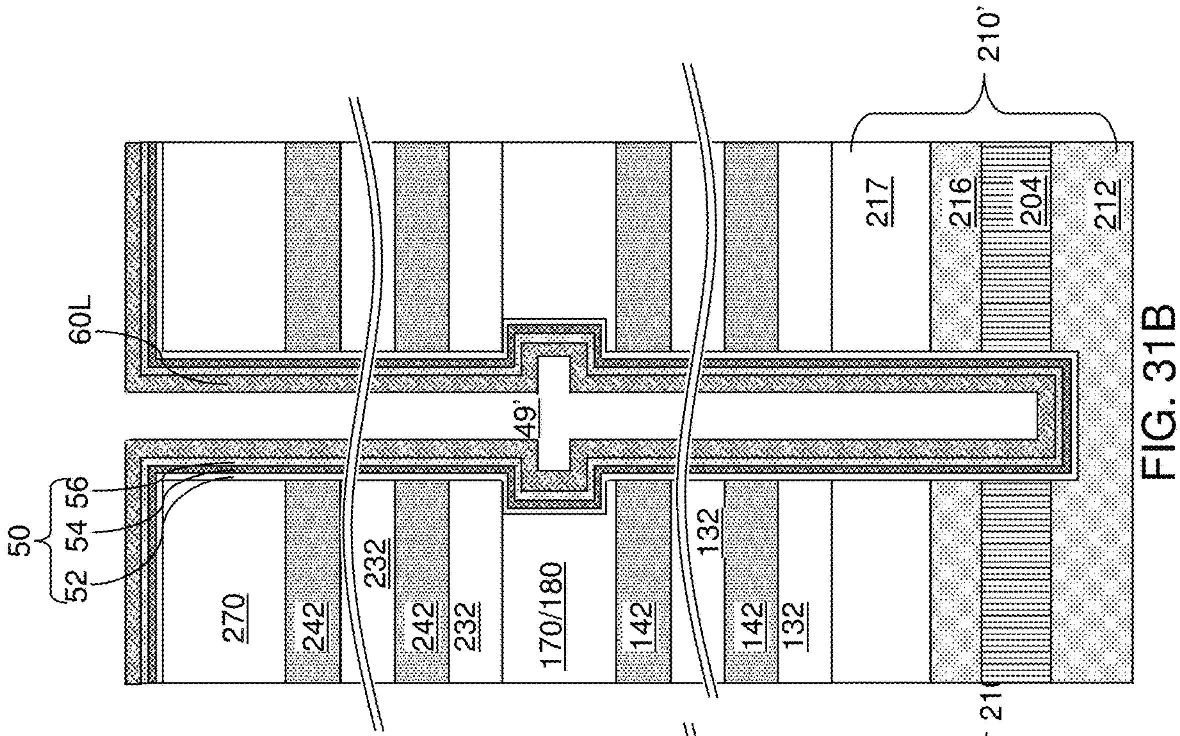
FIGS. 31A-31D illustrate sequential vertical cross-sectional views of a memory opening during formation of a memory opening fill structure according to an embodiment of the present disclosure.
Figure 31A:
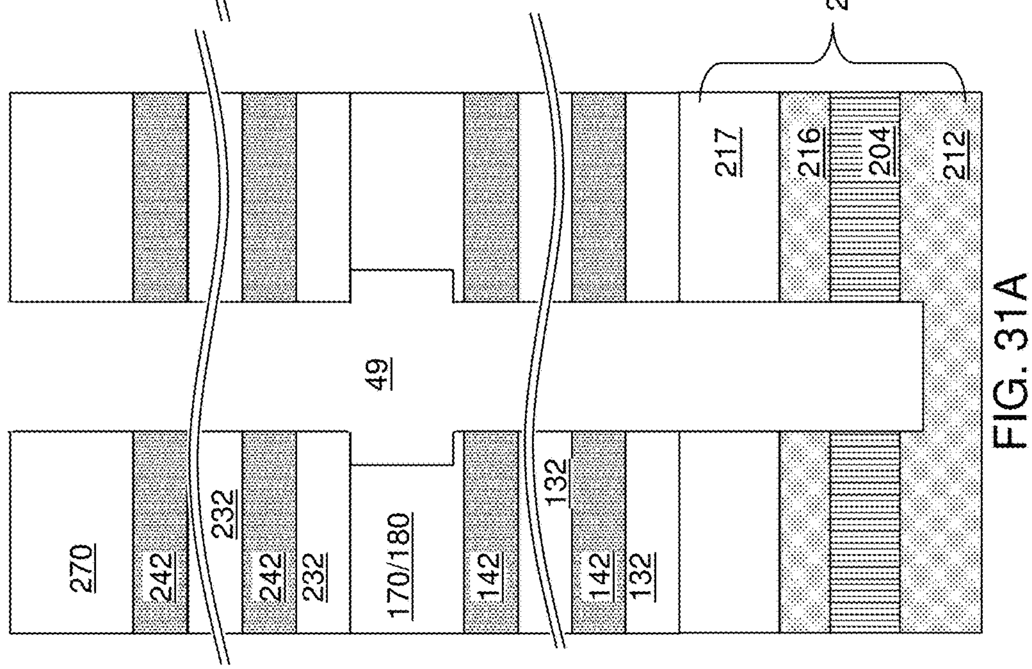

Referring to FIG. 31A, a memory opening 49 in the first second exemplary device structure of FIG. 30 is illustrated. The memory opening 49 extends through the first-tier structure and the second-tier structure.

Referring to FIG. 31B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Figures 31C, 31D:
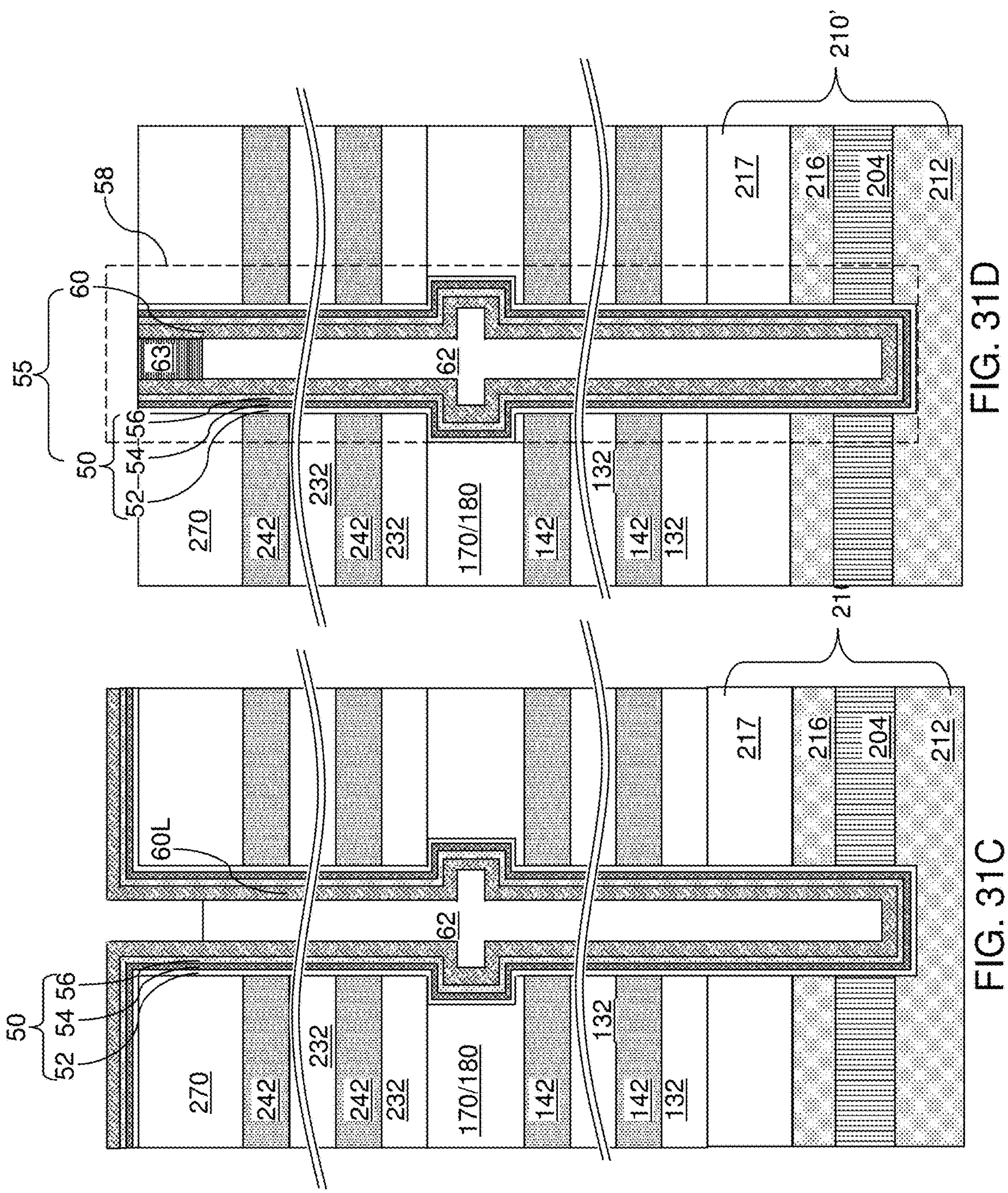

Referring to FIG. 31C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 31D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0\times10^{19}/cm^3$ to $2.0\times10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 210', the first-tier structure (132, 142, 170, 165), the second-tier structure (232, 242, 270, 265, 72), the inter-tier dielectric layer 180, and the memory opening fill structures 58 collectively constitute a memory-level assembly.

Figure 32:
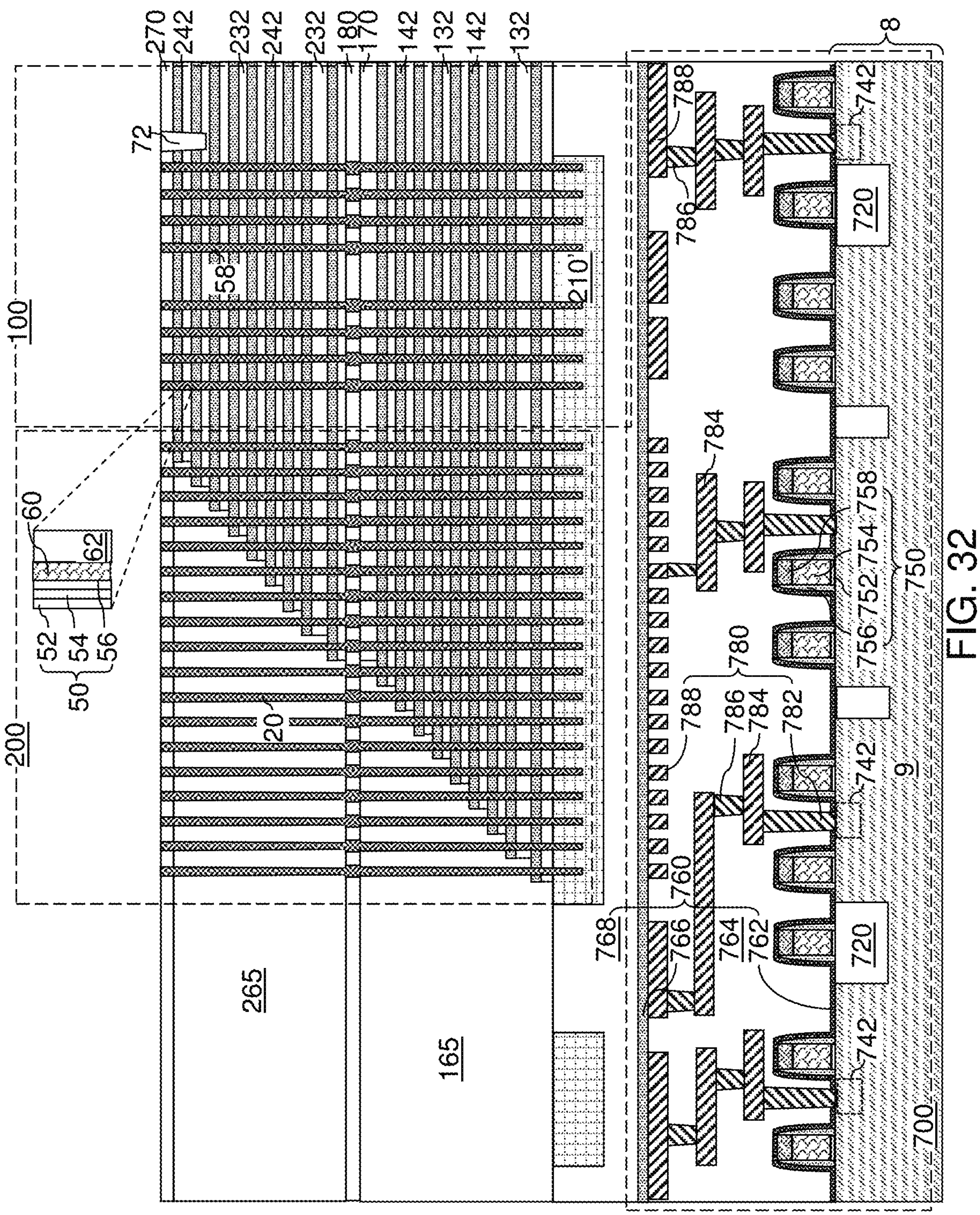
FIG. 32 is a vertical cross-sectional view of the second exemplary structure after formation of memory opening fill structures and support pillar structures according to an embodiment of the present disclosure.

Referring to FIG. 32, the second exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 33A:
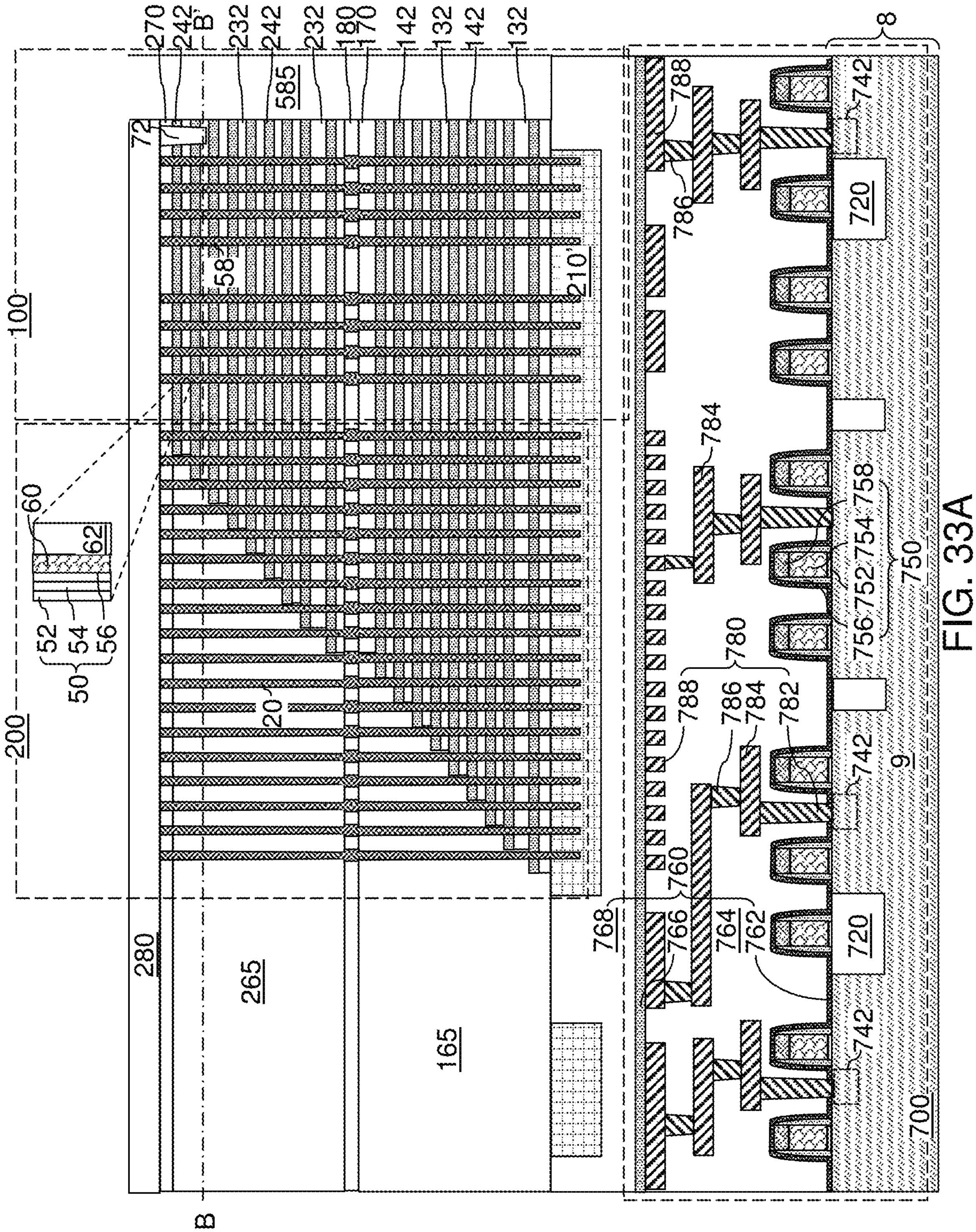
FIG. 33A is a vertical cross-sectional view of the second exemplary structure after formation of pillar cavities according to an embodiment of the present disclosure.
Figure 33B:
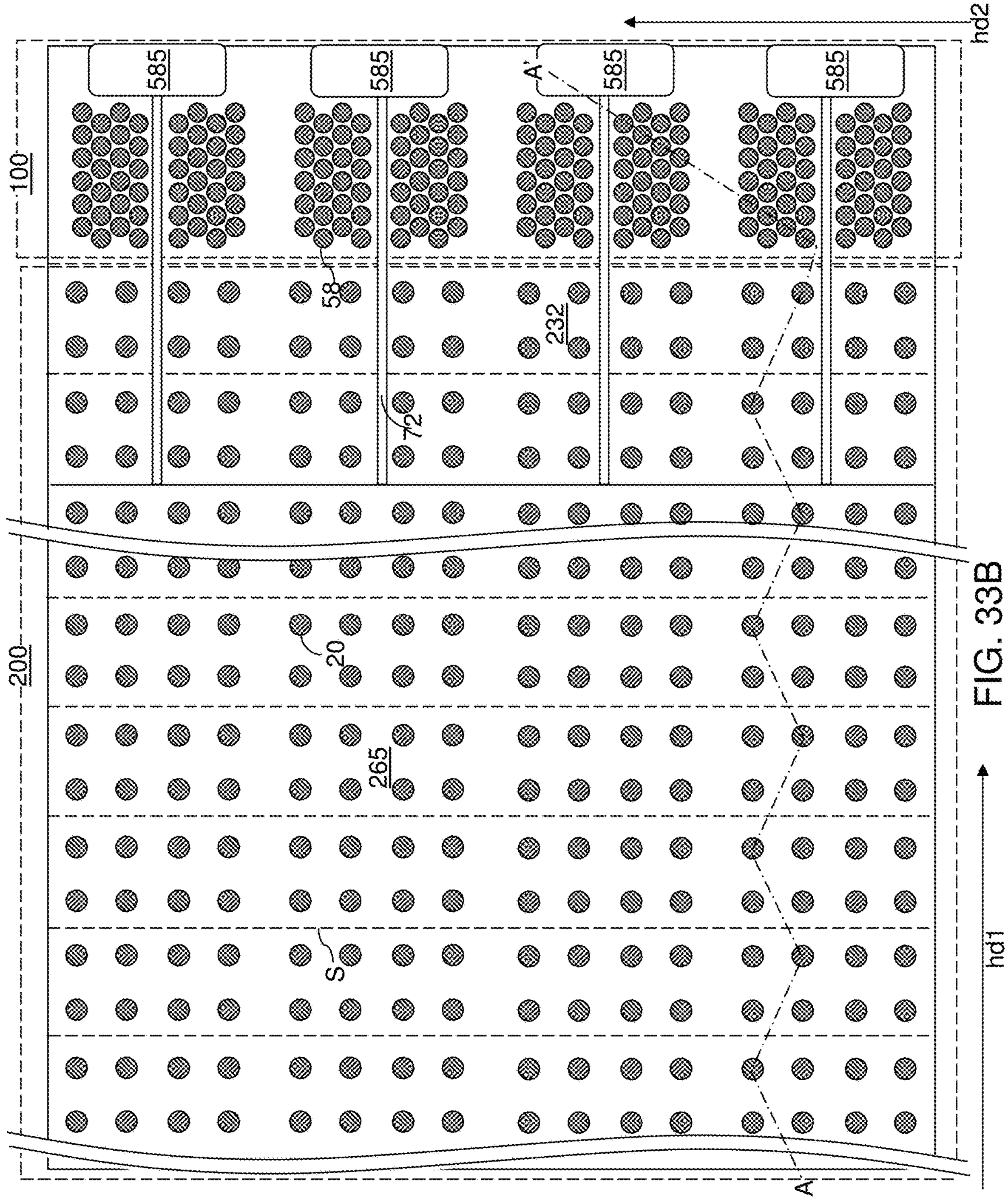
FIG. 33B is a horizontal cross-sectional view of the second exemplary structure along the horizontal plane B-B' of FIG. 33A. The hinged vertical plane A-A' corresponds to the plane of the vertical cross-sectional view of FIG. 33A.

Referring to FIGS. 33A and 33B, a first contact-level dielectric layer 280 may be formed over the second-tier structure (232, 242, 270, 265, 72). The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer (not shown) may be applied over the first contact-level dielectric layer 280, and may be lithographically patterned to form discrete openings within the area of the memory array region 100 in which memory opening fill structures 58 are not present. An anisotropic etch may be performed to form vertical interconnection region cavities 585 having substantially vertical sidewalls that extend through the first contact-level dielectric layer 280, the second-tier structure (232, 242, 270, 265, 72), and the first-tier structure (132, 142, 170, 165) may be formed underneath the openings in the photoresist layer. A top surface of a lower-level metal interconnect structure 780 may be physically exposed at the bottom of each vertical interconnection region cavity 585. The photoresist layer may be removed, for example, by ashing.

Figure 34:
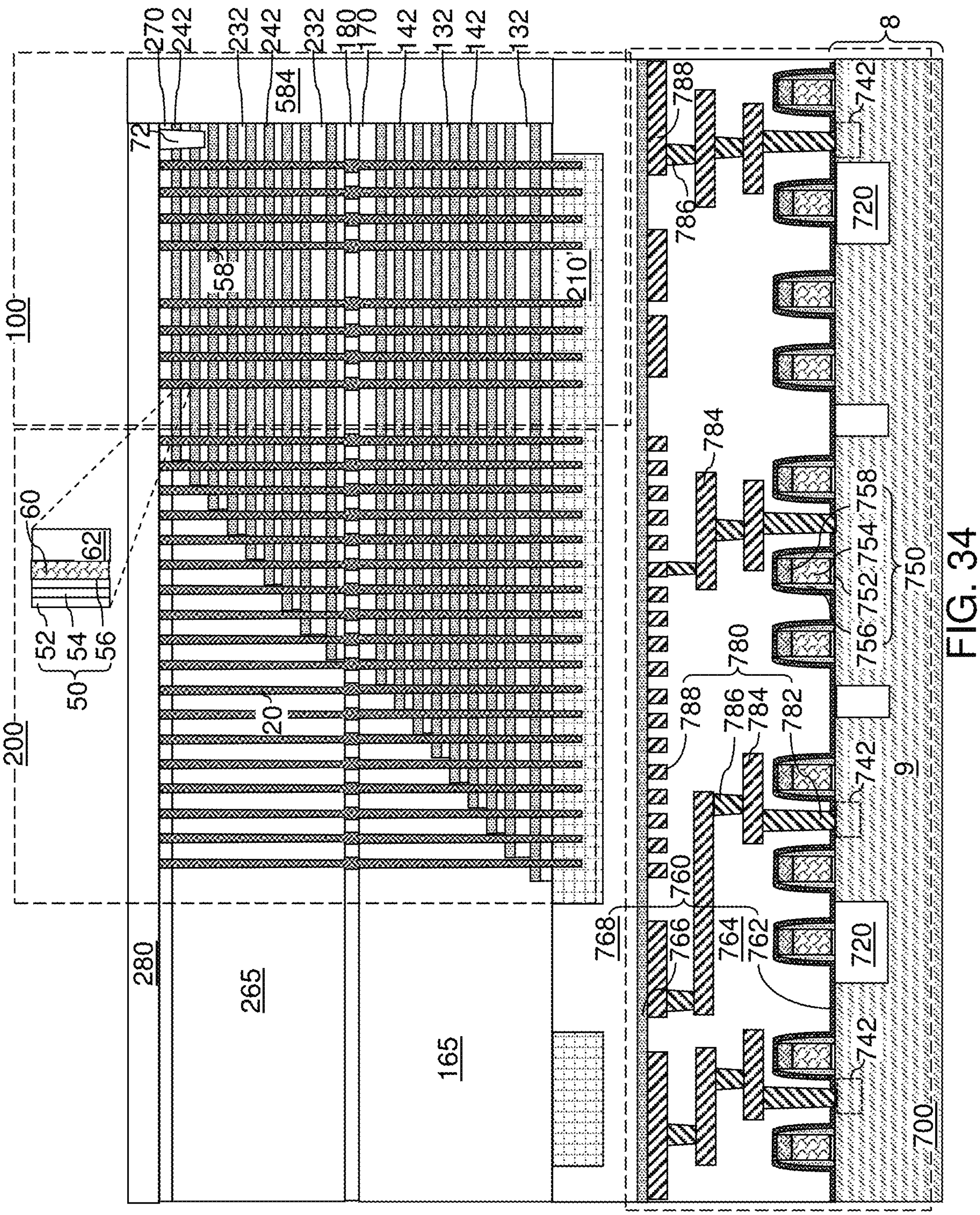
FIG. 34 is a vertical cross-sectional view of the second exemplary structure after formation of dielectric pillar structures according to an embodiment of the present disclosure.

Referring to FIG. 34, a dielectric material such as silicon oxide may be deposited in the vertical interconnection region cavities 585 by a conformal deposition process (such as low pressure chemical vapor deposition) or a self-planarizing deposition process (such as spin coating). Excess portions of the deposited dielectric material may be removed from above the top surface of the first contact-level dielectric layer 280 by a planarization process. Remaining portions of the dielectric material in the vertical interconnection region cavities 585 constitute interconnection region dielectric fill material portions 584.

Figure 35A:
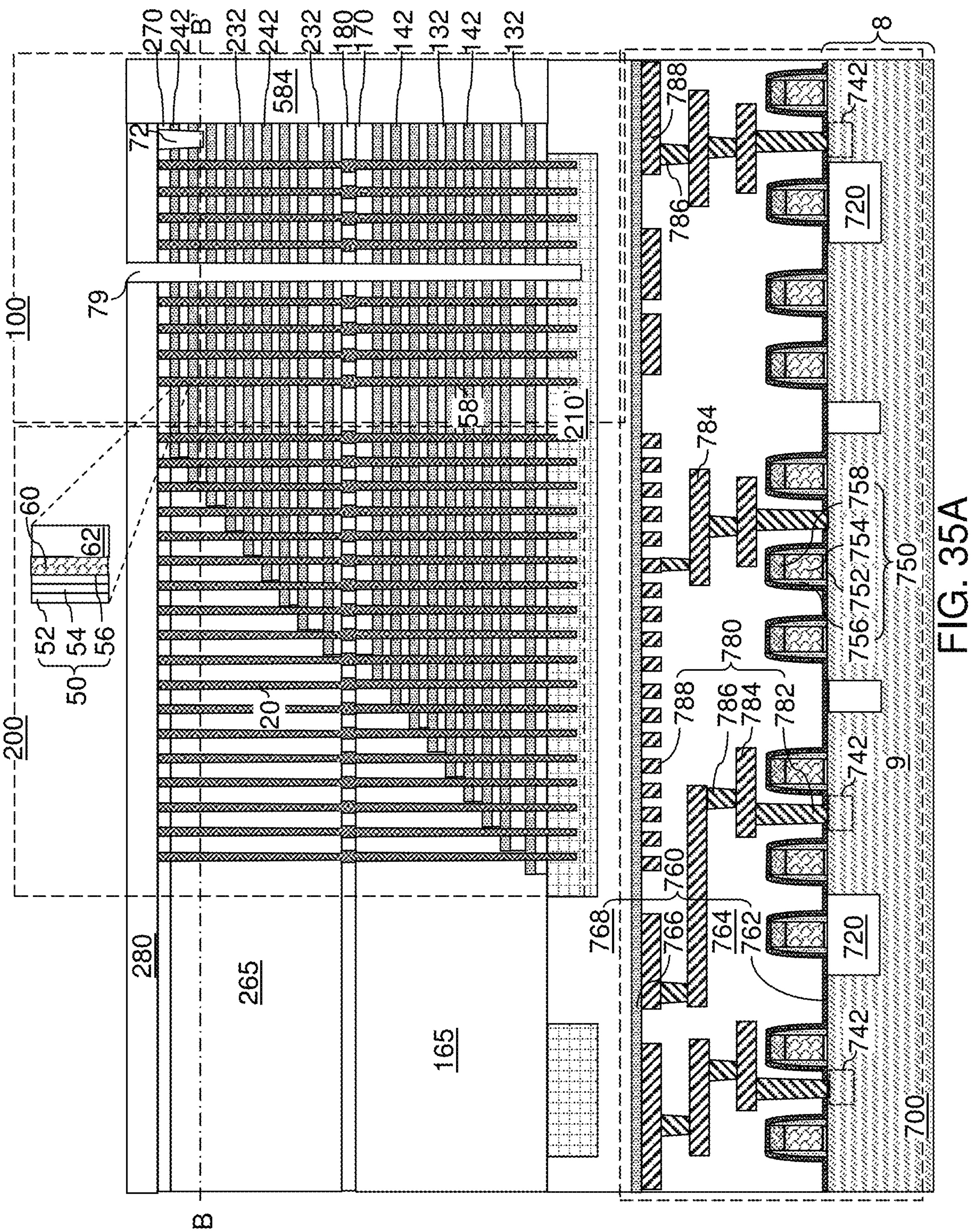
FIG. 35A is a vertical cross-sectional view of the second exemplary structure after formation of a first contact-level dielectric layer and backside trenches according to an embodiment of the present disclosure.
Figure 35B:
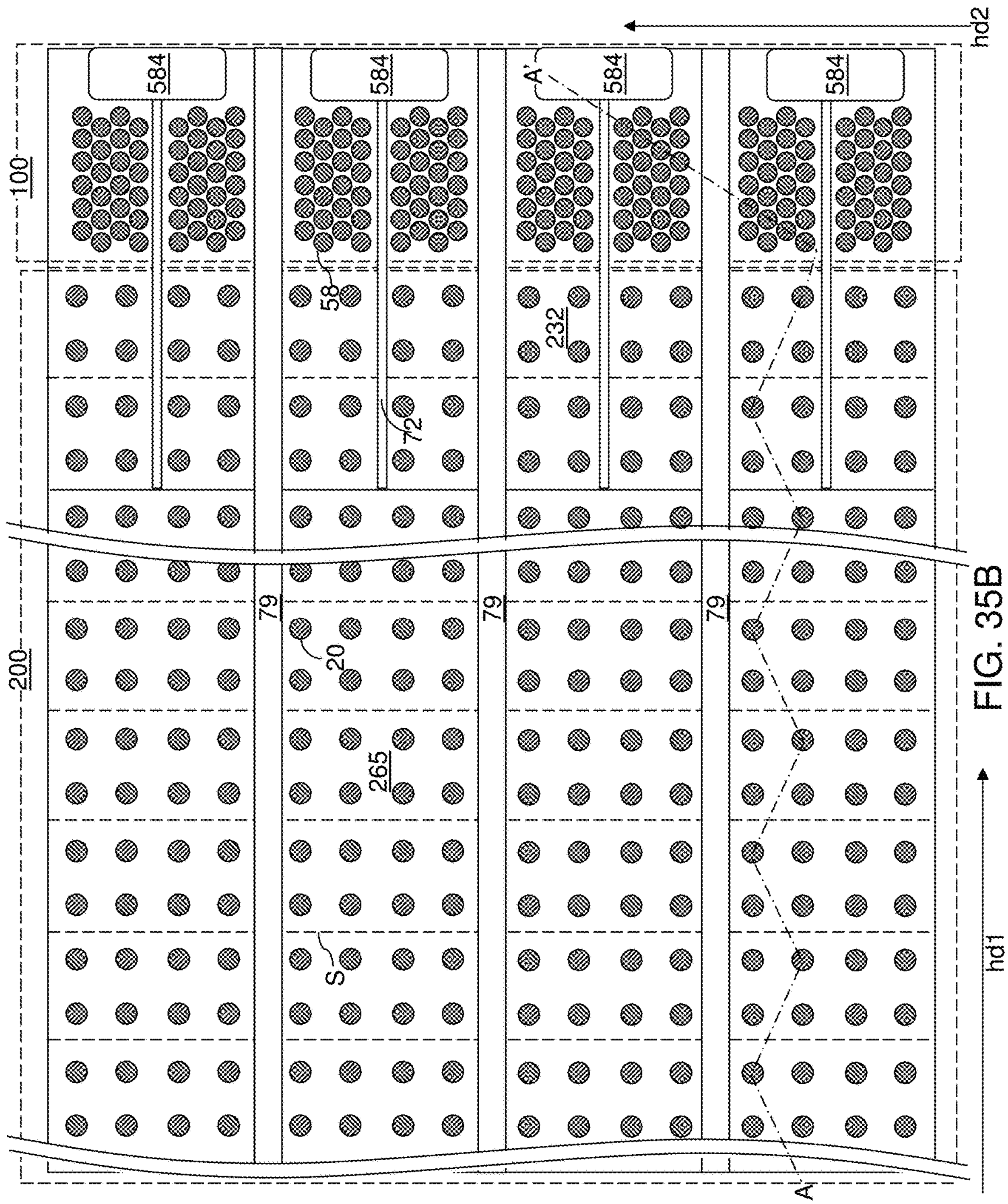
FIG. 35B is a horizontal cross-sectional view of the second exemplary structure along the horizontal plane B-B' of FIG. 35A. The hinged vertical plane A-A' corresponds to the plane of the vertical cross-sectional view of FIG. 35A.
Figure 36A:
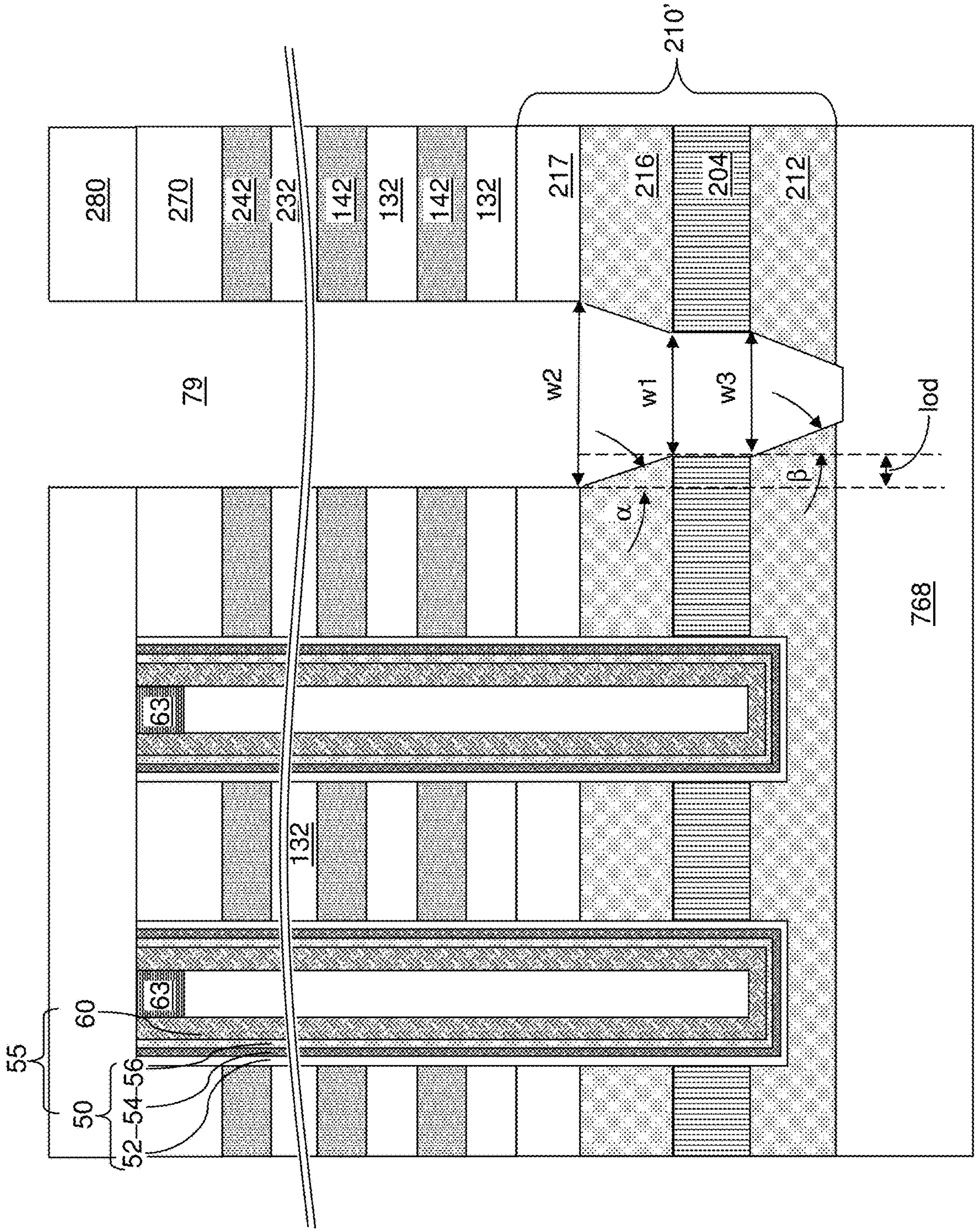
FIGS. 36A-36F illustrate sequential vertical cross-sectional views of a region including memory opening fill structures and a backside trench during formation of source-level material layers according to an embodiment of the present disclosure.

Referring to FIGS. 35A, 35B, and 36A, a photoresist layer (not shown) may be applied over the first contact-level dielectric layer 280 and may be lithographically patterned to form elongated openings that extend along the first horizontal direction hd1 between clusters of memory opening fill structures 58. Backside trenches 79 may be formed by transferring the pattern in the photoresist layer (not shown) through the first contact-level dielectric layer 280, the second-tier structure (232, 242, 270, 265, 72), and the first-tier structure (132, 142, 170, 165), and into the in-process source-level material layers 210'. Portions of the first contact-level dielectric layer 280, the second-tier structure (232, 242, 270, 265, 72), the first-tier structure (132, 142, 170, 165), and the in-process source-level material layers 210' that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79.

The backside trenches 79 are formed through the alternating stacks {(132, 142), (232, 242)} and into the in-process source-level material layers 210' by the anisotropic etch process. In one embodiment, the anisotropic etch process has an etch chemistry that etches the materials of the insulating layers (132, 232) and the sacrificial material layers (142, 242) with a straight etch profile, and etches the materials of the lower source-level dielectric etch-stop layer 212 and the upper source-level dielectric etch-stop layer 216 with a tapered profile. In one embodiment, the anisotropic etch process cam employ an etchant gas including one or more hydrofluorocarbon gases. Each of the upper source-level dielectric etch-stop layer 216 and the lower source-level dielectric etch-stop layer 212 has a higher etch resistance to the etchant gas than materials of the alternating stacks {(132, 142), (232, 242)}. In one embodiment, the lower source-level dielectric etch-stop layer 212 and the upper source-level dielectric etch-stop layer 216 can include carbon-containing dielectric material, such as silicon oxycarbide.

In one embodiment, first tapered surfaces having a first taper angle α are formed through the upper source-level dielectric etch-stop layer 216 and second tapered surfaces having a second taper angle β are formed through the lower source-level dielectric etch-stop layer 212 by the anisotropic etch process. The backside trenches 79 can have vertical or substantially vertical sidewalls that extend through the alternating stacks {(132, 142), (232, 242)} and additional vertical or substantially vertical sidewalls that extend through the source-level sacrificial layer 204. In one embodiment, each of the backside trenches 79 has a first width w1 along a second horizontal direction (e.g., bit line direction) hd2 within a horizontal plane including a bottom surface of the upper source-level dielectric etch-stop layer 216, and each of the backside trenches 79 has a second width w2 along the second horizontal direction hd2 within a horizontal plane including a top surface of the upper source-level dielectric etch-stop layer 216. Each of the backside trenches 79 has a third width w3 along the second horizontal direction hd2 within a horizontal plane including a top surface of the lower source-level dielectric etch-stop layer 212. The second width w2 is greater than the first width w1, and the third width w3 can be the same as, or can be less than, the first width w1.

In one embodiment, segments of sidewalls of the backside trenches 79 located on the alternating stacks {(132, 142), (232, 242)} can be vertical or can have a taper angle that is less than the first taper angle α. In one embodiment, the first taper angle α and the second taper angle β may be the same, or may be substantially the same. In one embodiment, the second taper angle β may be within a range from 70% to 130% of the first taper angle α. In one embodiment, the first taper angle α and the second taper angle β may be in a range from 3 degrees to 45 degrees, such as a range from 6 degrees to 25 degrees.

In one embodiment, the bottom surface of the upper source-level dielectric etch-stop layer 216 and the top surface of the lower source-level dielectric etch-stop layer 212 have elongated openings that laterally extend along the first horizontal direction (e.g., word line direction) hd1 within the areas of the backside trenches 79. Each elongated opening through the top surface of the lower source-level dielectric etch-stop layer 212 can be vertically coincident with, or can be laterally offset inward, from a respective elongated opening through the bottom surface of the upper source-level dielectric etch-stop layer 216 in a plan view, i.e., a view along a vertical direction in which peripheries of structures are overlaid over one another.

Figure 36B:
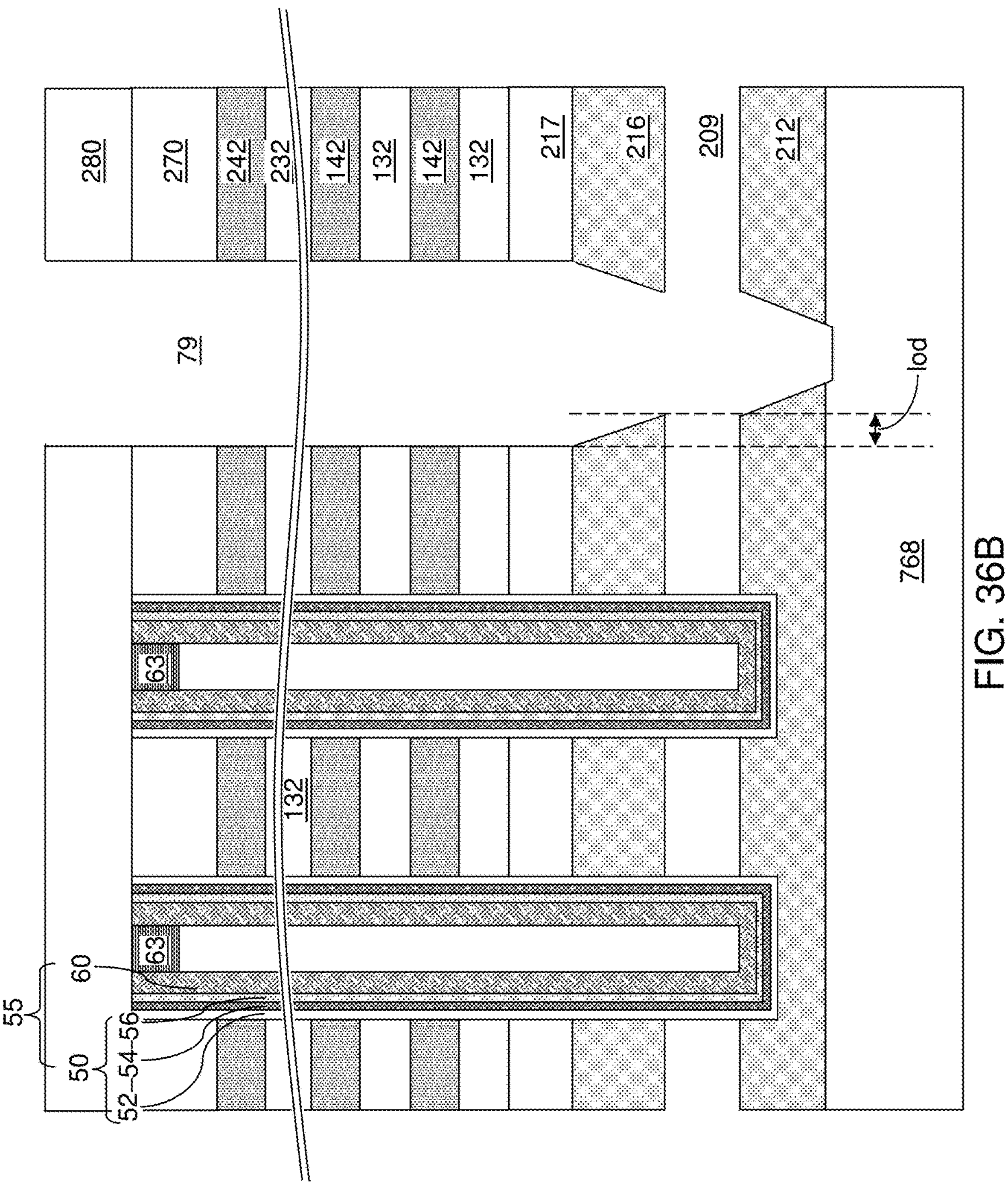

Referring to FIG. 36B, an etchant that etches the material of the source-level sacrificial layer 204 selective to the materials of the first-tier alternating stack (132, 142), the second-tier alternating stack (232, 242), the first and second insulating cap layers (170, 270), the first contact-level dielectric layer 280, and the etch-stop layers (212, 216) may be introduced into the backside trenches 79 in an isotropic etch process. For example, if the source-level sacrificial layer 204 includes undoped amorphous silicon, undoped polysilicon or an undoped amorphous silicon-germanium alloy, a wet etch process using hot trimethyl-2 hydroxyethyl ammonium hydroxide ("hot TMY") or tetramethyl ammonium hydroxide (TMAH) may be used to remove the source-level sacrificial layer 204 selective to the alternating stacks {(132, 142), (232, 242)}, the lower source-level dielectric etch-stop layer 212, and the upper source-level dielectric etch-stop layer 216. A source cavity 109 is formed in the volume from which the source-level sacrificial layer 204 is removed without using a sidewall spacer in the backside trenches 79. Thus, the source cavity 109 formation process is simplified by using the etch stop layers (212, 216) and omitting the steps required to form sidewall spacers in the backside trenches 79.

Wet etch chemicals such as hot TMY and TMAH selectively undoped silicon compared to silicon oxycarbide of the upper source-level dielectric etch-stop layer 216 and the lower source-level dielectric etch-stop layer 212. Thus, use of selective wet etch chemicals such as hot TMY and TMAH for the wet etch process that forms the source cavity 109 provides a large process window against etch depth variation during formation of the backside trenches 79. Each of the memory opening fill structures 58 is physically exposed to the source cavity 109. Specifically, each of the memory opening fill structures 58 includes a sidewall of the memory film 50 that is physically exposed to the source cavity 109.

Figure 36C:
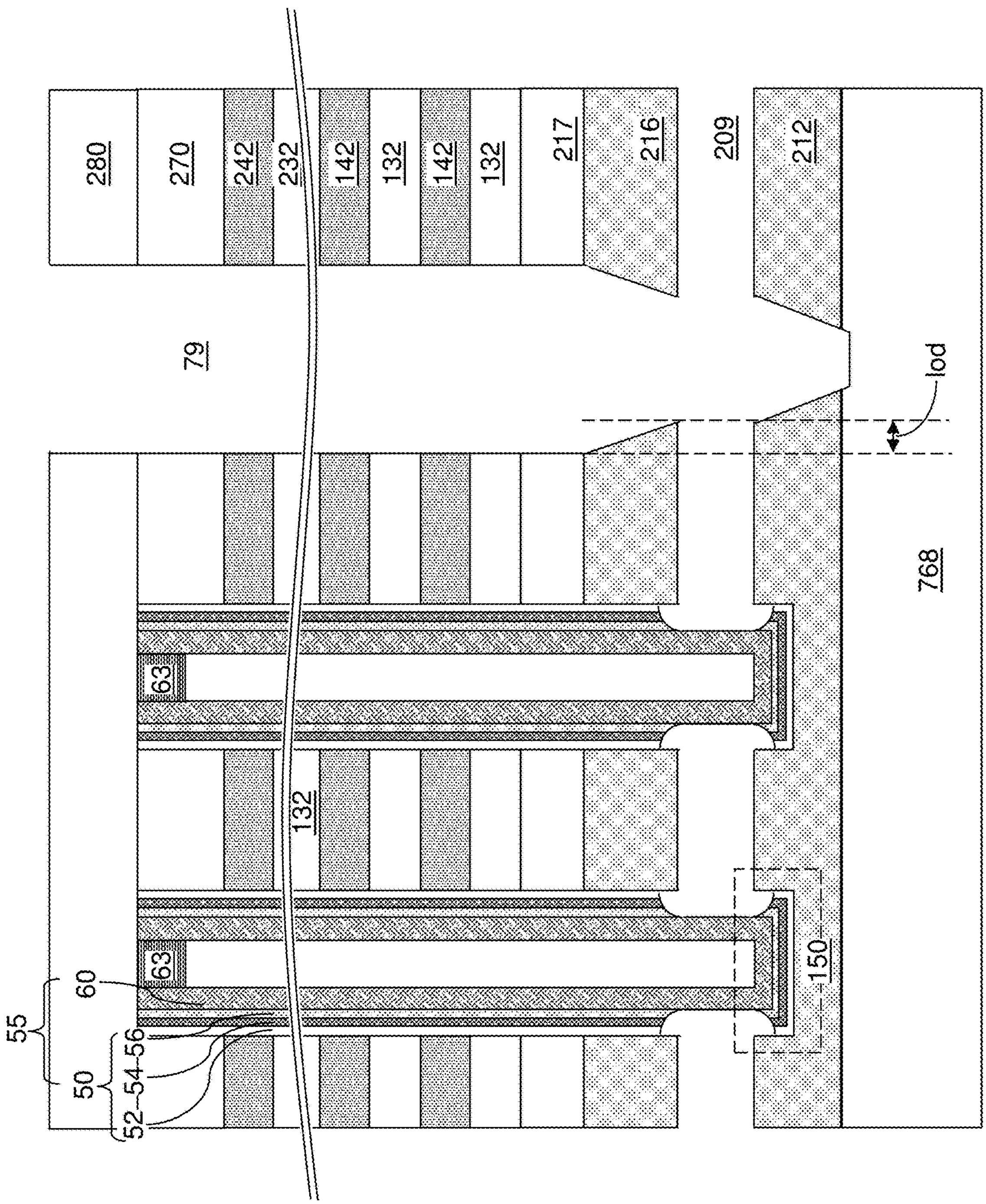

Referring to FIG. 36C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The source cavity 109 may be expanded in volume by removal of the portions of the memory films 50. A top surface of the lower source-level dielectric etch-stop layer 212 and a bottom surface of the upper source-level dielectric etch-stop layer 216 may be physically exposed to the source cavity 109. The source cavity 109 is formed by isotropically etching the source-level sacrificial layer 204 and a bottom portion of each of the memory films 50 selective to at least one source-level dielectric etch-stop layer (such as the lower source-level dielectric etch-stop layer 212 and the upper source-level dielectric etch-stop layer 216) and the vertical semiconductor channels 60 without using a sidewall spacer in the backside trenches 79.

Generally, the physically exposed portions of the memory films 50 can be isotropically etched after formation of the source cavity 109. Cylindrical sidewalls of the vertical semiconductor channels 60 are physically exposed to the source cavity 109. Remaining portions of the memory films 50 that are embedded in the lower source-level dielectric etch-stop layer 212 comprise dielectric cap structures 150. The dielectric cap structures 150 contact a bottom end of a respective one of the vertical semiconductor channels 60. Each dielectric cap structure 150 can comprise a stack of dielectric materials having a same set of dielectric materials, and having the same thickness, as each of the memory films 50.

Figure 36D:
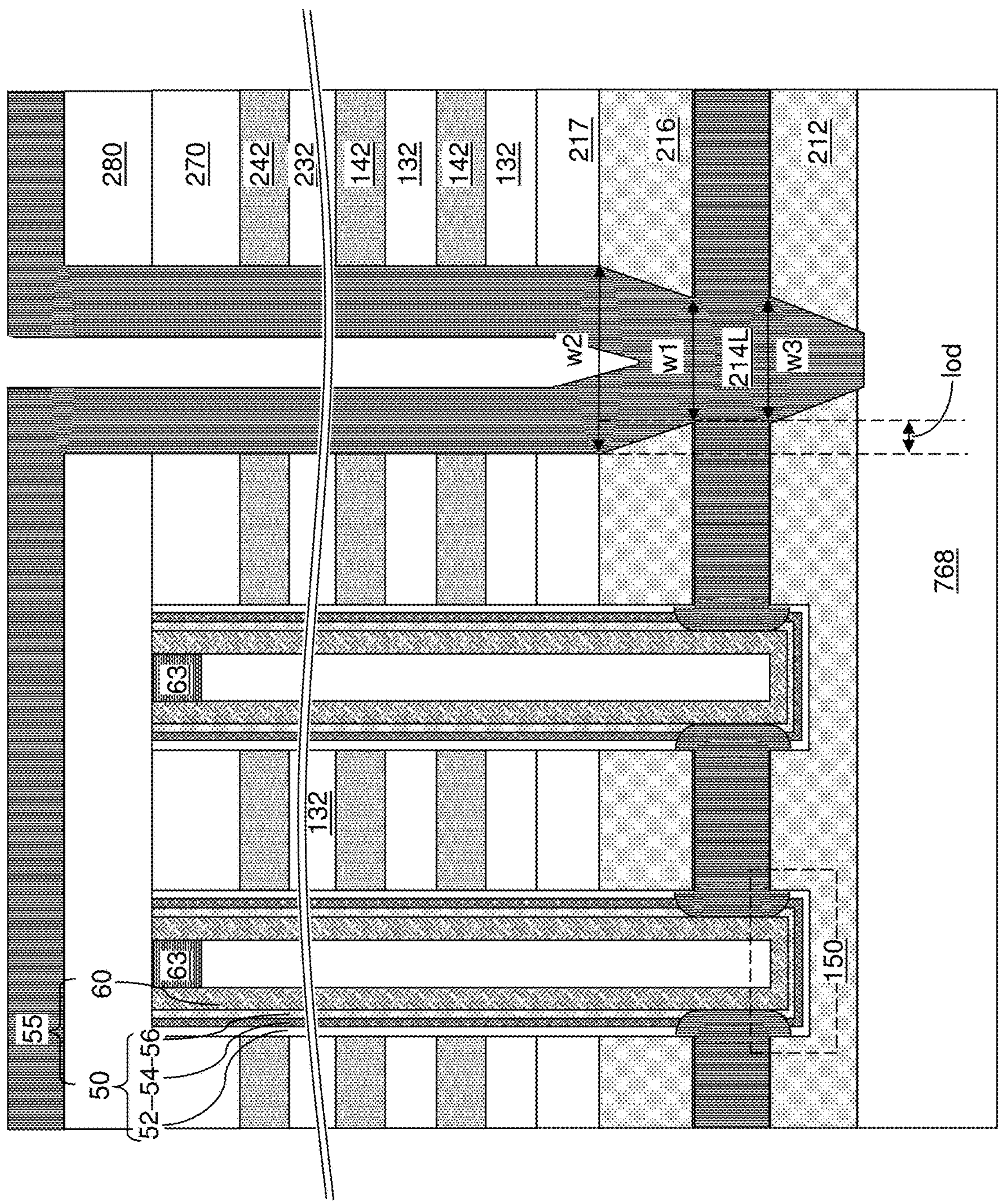

Referring to FIG. 36D, a semiconductor material (e.g., heavily doped polysilicon) having a doping of the second conductivity type (e.g., n-type) may be deposited on the physically exposed semiconductor surfaces around the source cavity 109. The physically exposed semiconductor surfaces include bottom portions of outer sidewalls of the vertical semiconductor channels 60. In one embodiment, the doped semiconductor material of the second conductivity type may be deposited on the physically exposed semiconductor surfaces around the source cavity 109 by a conformal semiconductor deposition process such as a chemical vapor deposition process. A semiconductor precursor gas and a dopant gas may be flowed concurrently into a process chamber including the second exemplary structure during the selective semiconductor deposition process. For example, the semiconductor precursor gas may include silane, disilane, or dichlorosilane for depositing polysilicon, and the dopant gas may include a hydride of a dopant atom such as phosphine, arsine, stibine, or diborane. In this case, the semiconductor deposition process conformally deposits a doped semiconductor material having a doping of the second conductivity type on all physically exposed surfaces. The deposited doped semiconductor material forms a continuous source contact layer 214L which may contact sidewalls of the vertical semiconductor channels 60. The atomic concentration of the dopants of the second conductivity type in the deposited semiconductor material may be in a range from $1.0\times10^{19}/cm^3$ to $2.0\times10^{21}/cm^3$, such as from $2.0\times10^{20}/cm^3$ to $8.0\times10^{20}/cm^3$. The continuous source contact layer 214L as initially formed may consist essentially of semiconductor atoms and dopant atoms of the second conductivity type.

The continuous source contact layer 214L can be formed in the source cavity 109 and in peripheral portions of the backside trenches 79. The continuous source contact layer 214L can be formed on the cylindrical sidewalls of the vertical semiconductor channels 60. The duration of the semiconductor deposition process may be selected such that the source cavity 109 is filled with the continuous source contact layer 214L and portions of the backside trenches 79 that are located underneath the horizontal plane including the bottom surface of the upper source-level dielectric etch-stop layer 216. According to an aspect of the present disclosure, the continuous source contact layer 214L can be deposited by a conformal deposition process with a thickness that is greater than one half of the first width w1 and is less than one half of the second width w2. The bottom portion of each backside trench 79 located below the horizontal plane including the bottom surface of the upper source-level dielectric etch-stop layer 216 can be completely filled with the material of the continuous source contact layer 214L as portions of the semiconductor material merge at seams.

Figure 36E:
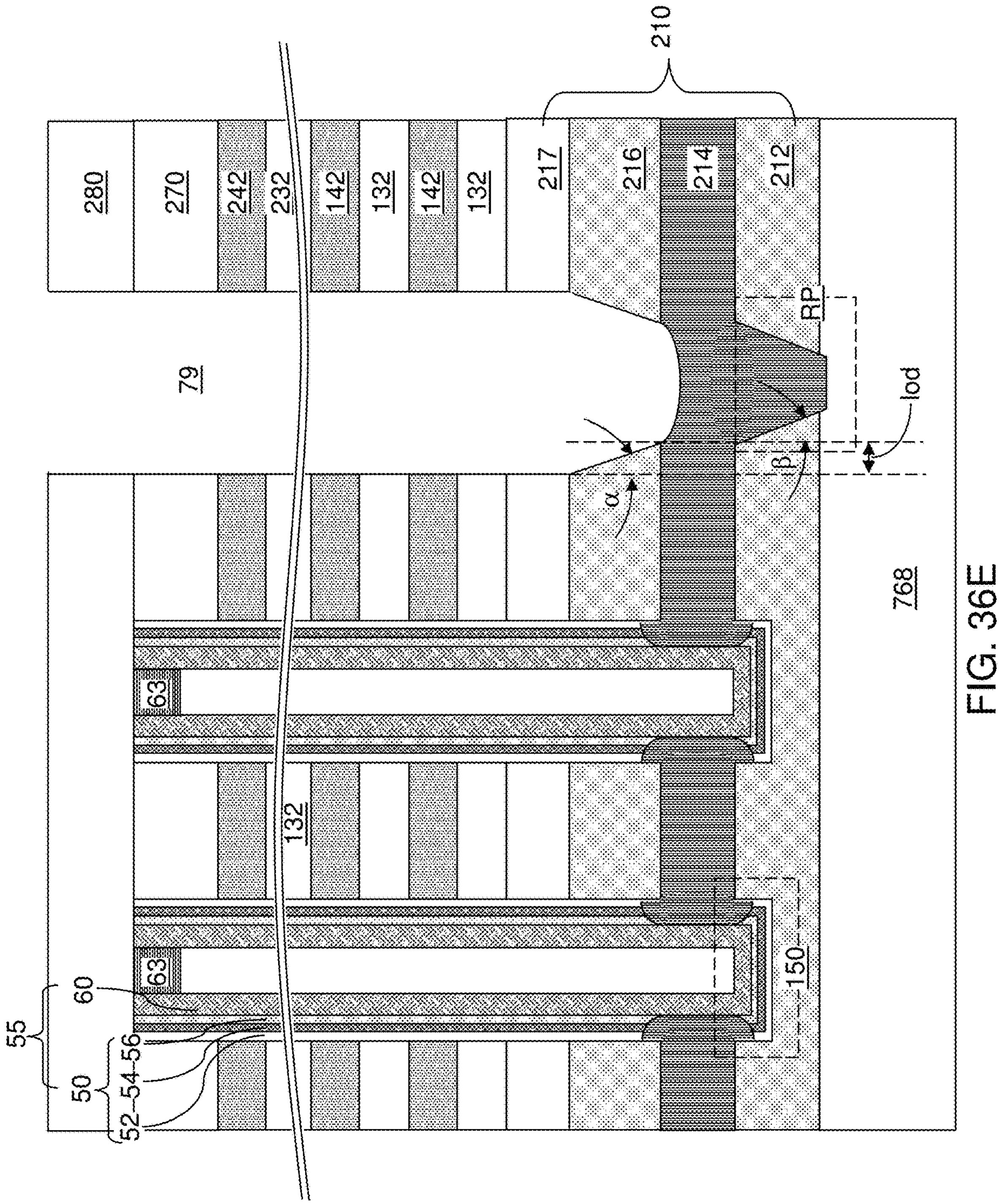

Referring to FIG. 36E, portions of the continuous source contact layer 214L overlying the first tapered surfaces of the upper source-level dielectric etch-stop layer 216 can be removed by performing a selective etch process. For example, a chemical dry etch process or a timed wet etch process can be performed to isotropically recess the continuous source contact layer 214L. The duration of the isotropic etch process can be selected such that the recess distance is in a range from 100% to 120% of the thickness of the continuous source contact layer 214L. The remaining portion of the continuous source contact layer 214L that fill the source cavity 209 comprises a source contact layer 214. The source contact layer 214 comprises planar portions located above a horizontal plane including the top surface of the lower source-level dielectric etch-stop layer 212, and rail portions RP that protrude downward below the horizontal plane including the top surface of the lower source-level dielectric etch-stop layer 212. The rail portions RP of the source contact layer 214 can laterally extend along the first horizontal direction hd1, and can be embedded in the lower source-level dielectric etch-stop layer 212. The source contact layer 214 can be a single contiguous structure that laterally extends underneath the alternating stacks {(132, 142), (232, 242)}.

In one embodiment, each of the rail portions RP of the source contact layer 214 underlies a respective one of the backside trenches 79 (which can be defined by a respective unfilled volume at this processing step), and is located entirely within an area defined by a periphery of the respective one of the backside trenches 79 located within a horizontal plane including bottommost surfaces of the alternating stacks {(132, 142), (232, 242)}. In one embodiment, each of the rail portions RP of the source contact layer 214 comprises an upper periphery that is located within the horizontal plane including the top surface of the lower source-level dielectric etch-stop layer 212 and is laterally offset inward from the periphery of the respective one of the backside trenches 79 (located at the top surface of the upper source-level dielectric etch-stop layer 216) by a uniform lateral offset distance lod. The sidewalls of the rail portions RP of the source contact layer 214 have a second taper angle β that is within a range from 70% to 130% of the first taper angle α.

In one embodiment, the entirety of the source contact layer 214 can be a unitary structure that continuously extends underneath the alternating stacks {(132, 232), (142, 242)} that are laterally spaced apart among one another by the backside trenches 79 and having a homogeneous material composition throughout. In one embodiment, the vertical semiconductor channels 60 comprise a first doped semiconductor material having a doping of a first conductivity type, and the source contact layer 214 comprises a second doped semiconductor material having a doping of a second conductivity type that is the opposite of the first conductivity type. In one embodiment, the memory films 50 comprise outer sidewalls that contact the upper source-level dielectric etch-stop layer 216. In one embodiment, the doped semiconductor material may include doped polysilicon. Thus, the source-level sacrificial layer 204 may be replaced with the source contact layer 214.

The layer stack including the lower source-level dielectric etch-stop layer 212, the source contact layer 214, and the upper source-level dielectric etch-stop layer 216 constitutes source-level material layers 210, which replaces the in-process source-level material layers 210'.

Figure 36F:
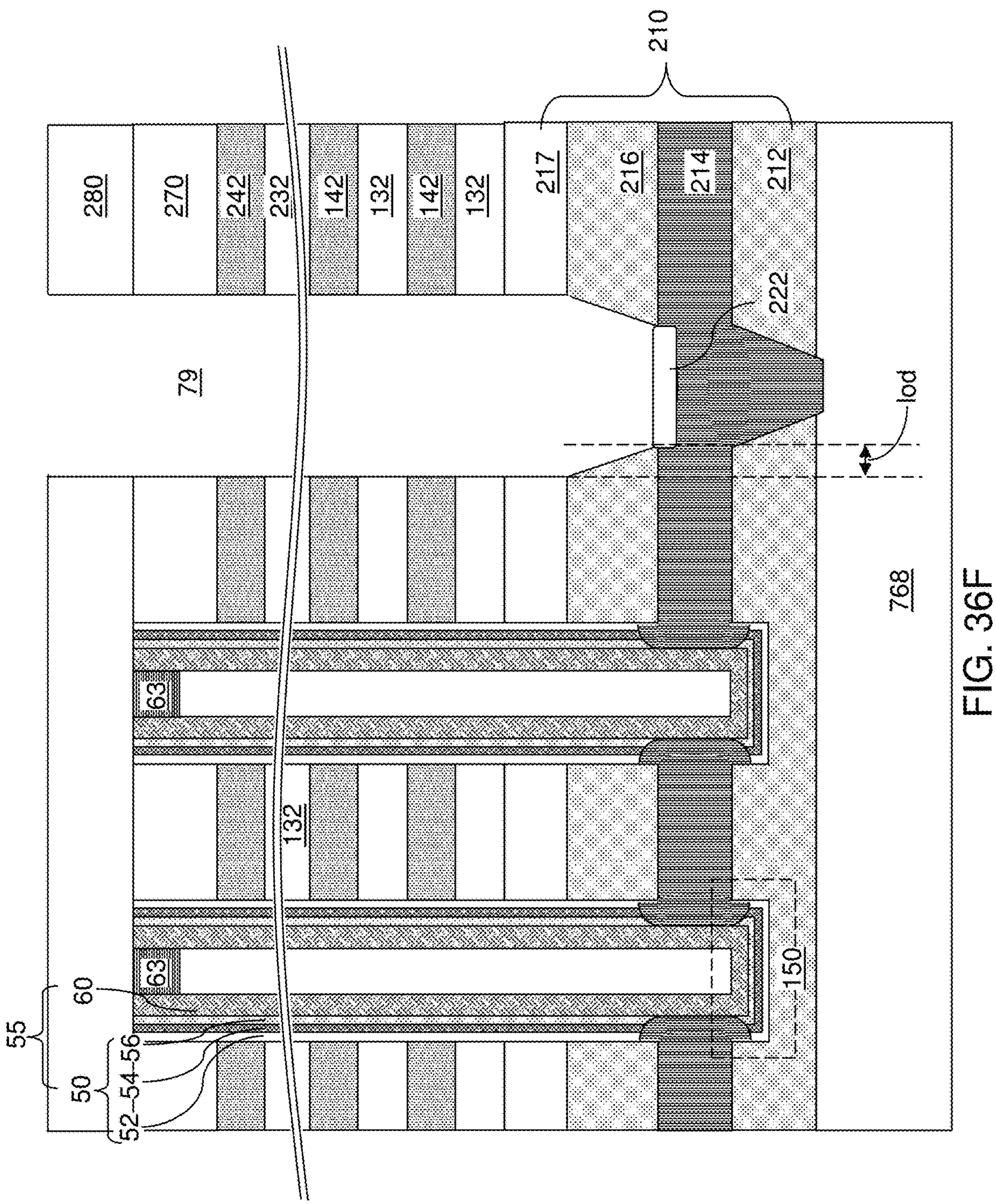
Figure 37:
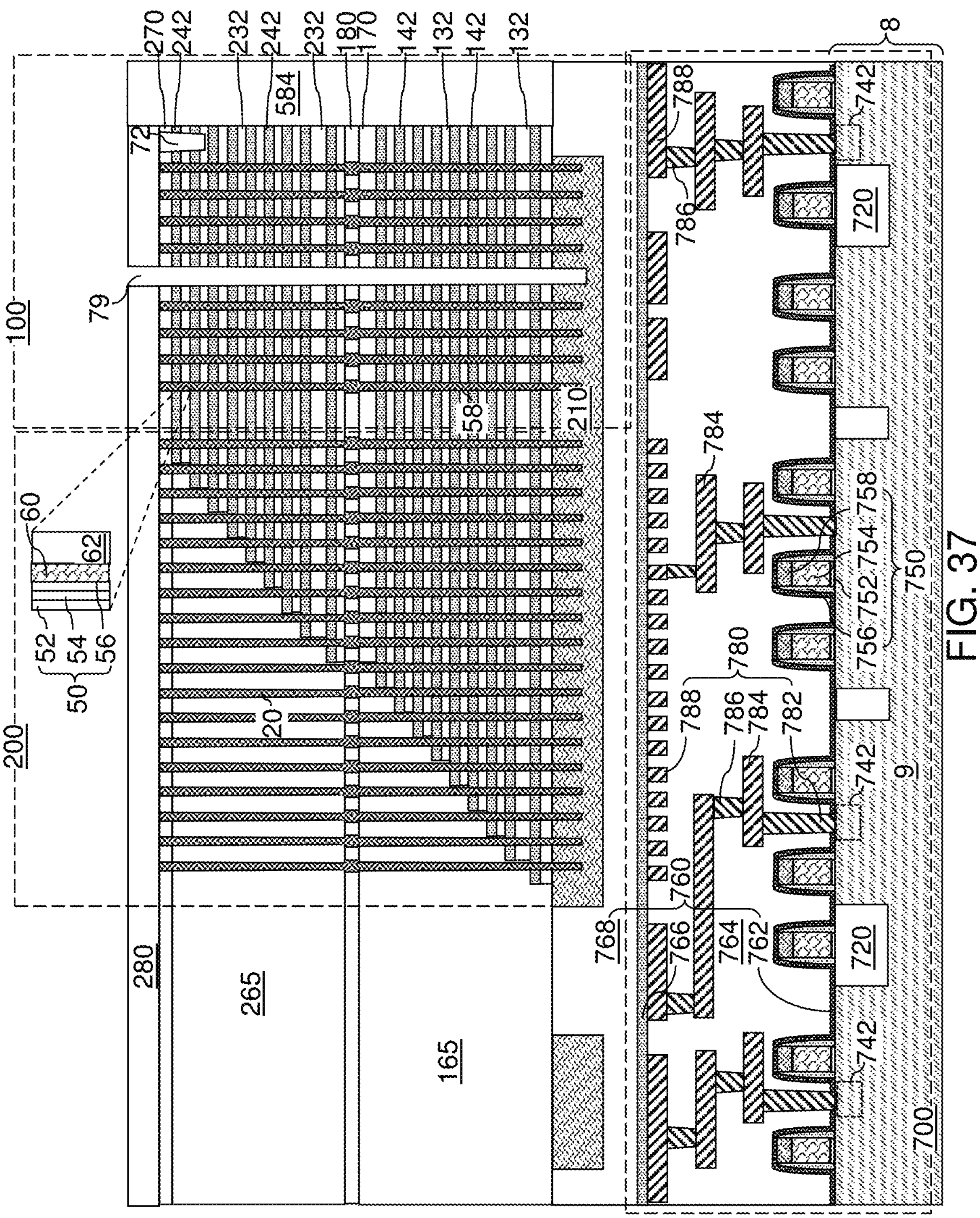
FIG. 37 is a vertical cross-sectional view of the second exemplary structure after formation of source-level material layers according to an embodiment of the present disclosure.

Referring to FIGS. 36F and 37, an oxidation process may be performed to convert physically exposed surface portions of source contact layer 214 into dielectric semiconductor oxide portions such as dielectric semiconductor oxide plates 222. The dielectric semiconductor oxide plates 222 are not illustrated in FIG. 37 for clarity.

Figure 38:
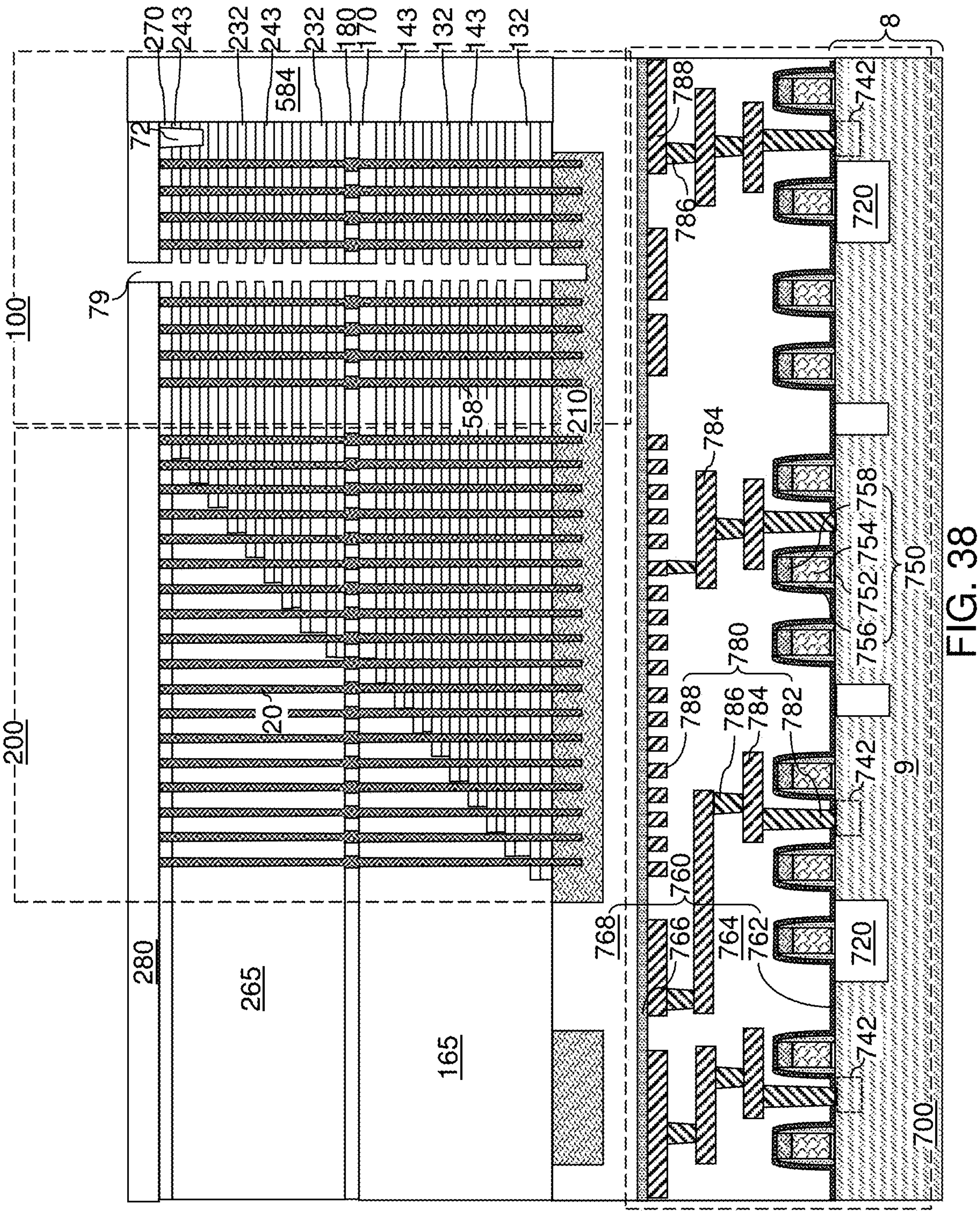
FIG. 38 is a vertical cross-sectional view of the second exemplary structure after formation of backside recesses according to an embodiment of the present disclosure.

Referring to FIG. 38, the sacrificial material layers (142, 242) are removed selective to the insulating layers (132, 232), the first and second insulating cap layers (170, 270), the first contact-level dielectric layer 280, and the source contact layer 214, the dielectric semiconductor oxide plates 122, and the etch stop layers (212, 216). For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the second exemplary structure is immersed within a wet etch tank including phosphoric acid, which etches silicon nitride selective to silicon oxide, silicon, and various other materials used in the art. The backside trenches 79 can be employed as conduits for an etchant that etches the sacrificial material layers (142, 242).

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 39A:
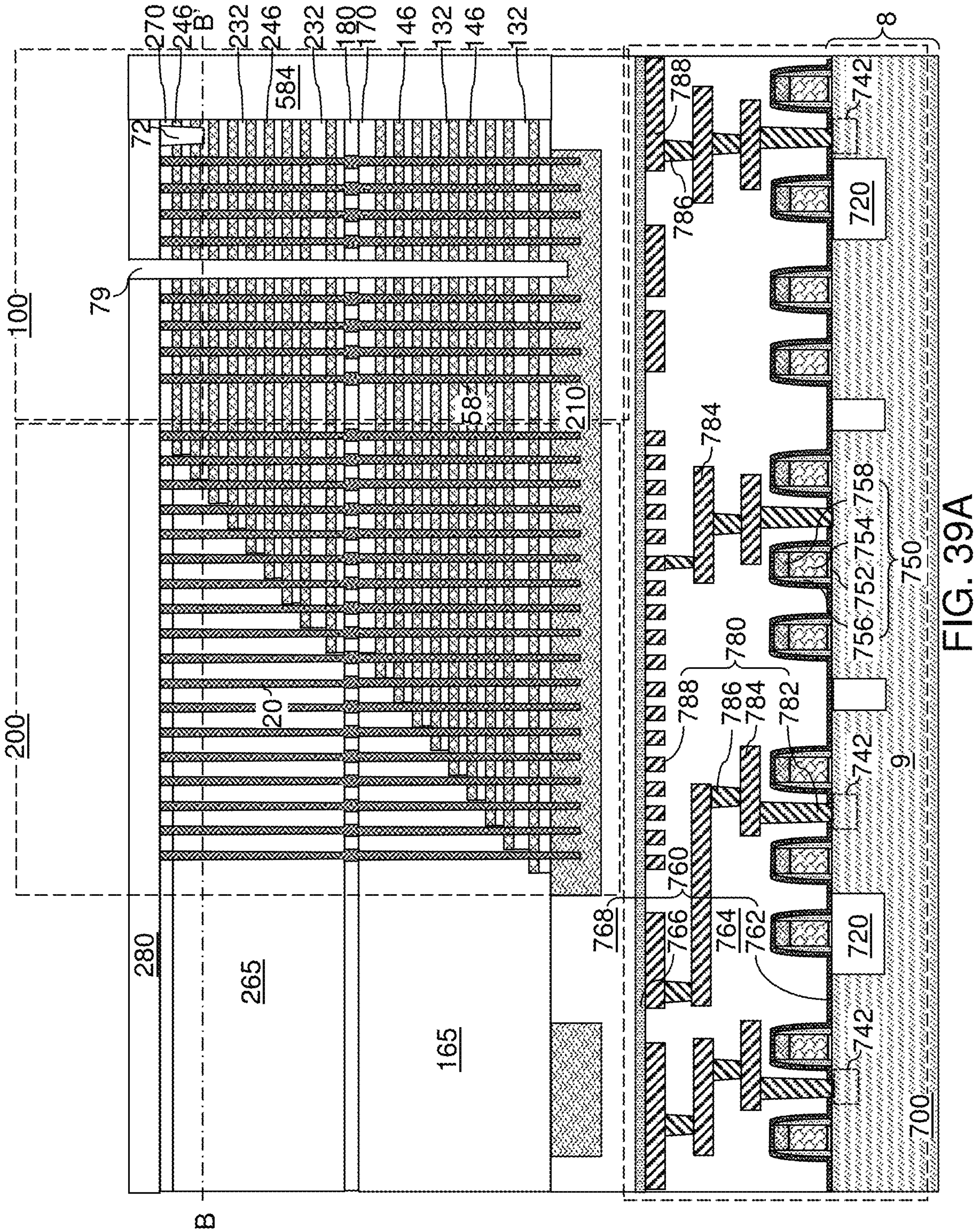
FIG. 39A is a vertical cross-sectional view of the second exemplary structure after formation of electrically conductive layers according to an embodiment of the present disclosure.
Figure 39B:
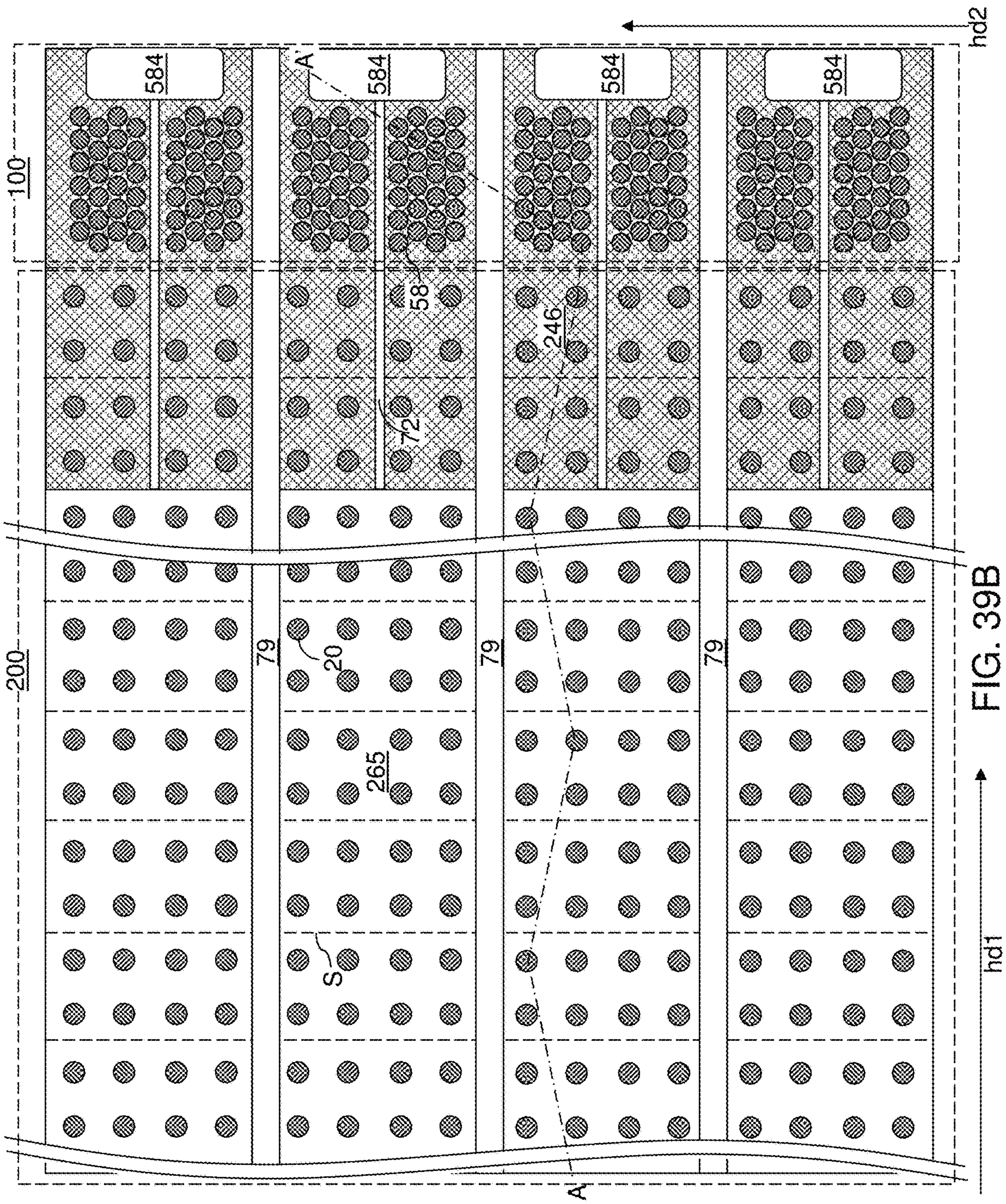
FIG. 39B is a horizontal cross-sectional view of the second exemplary structure along the horizontal plane B-B' of FIG. 39A. The hinged vertical plane A-A' corresponds to the plane of the vertical cross-sectional view of FIG. 39A.
Figure 39C:
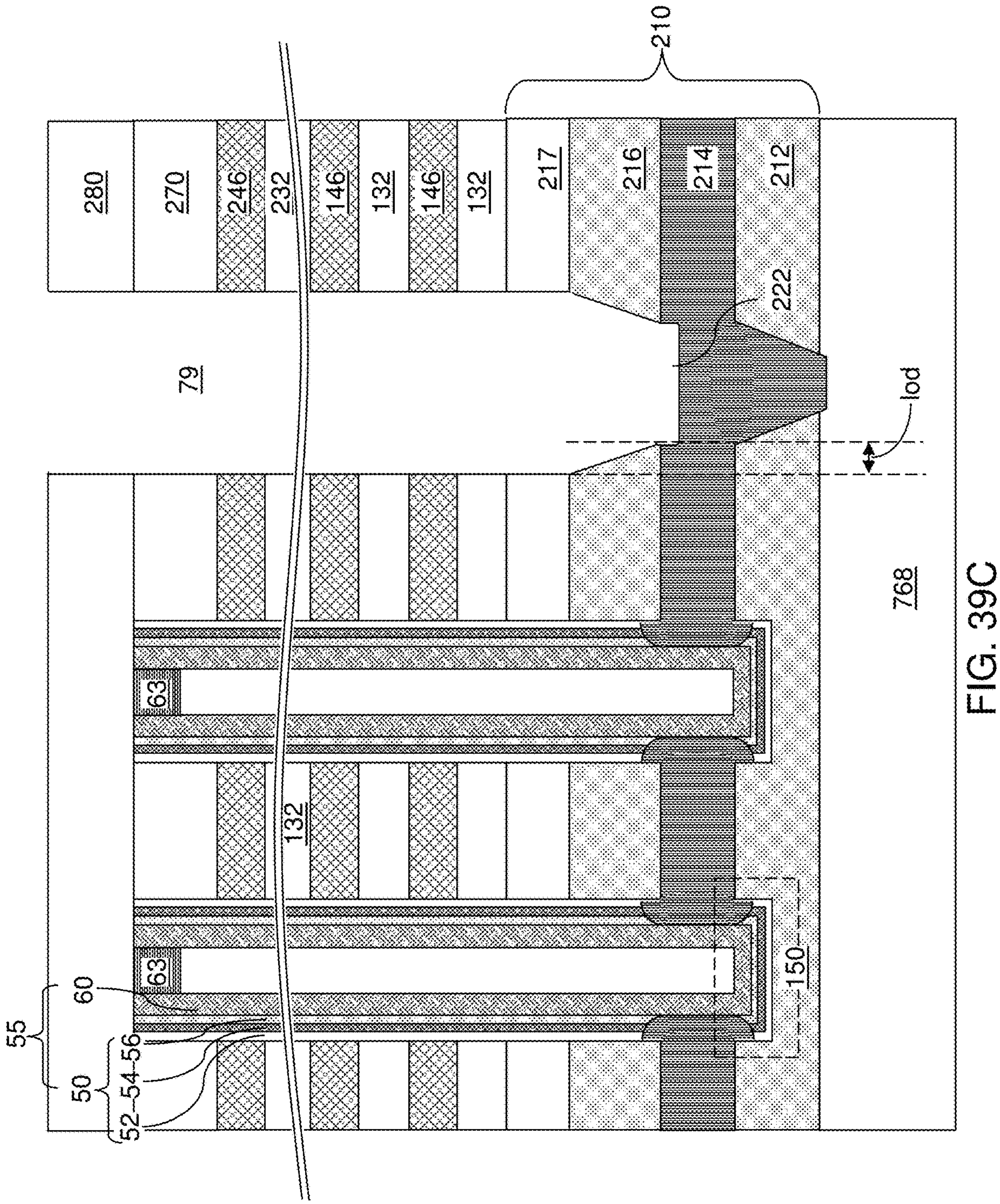
FIG. 39C is a vertical cross-sectional view of a region including memory opening fill structures and a backside trench at the processing steps of FIGS. 39A and 39B.
Figure 40A:
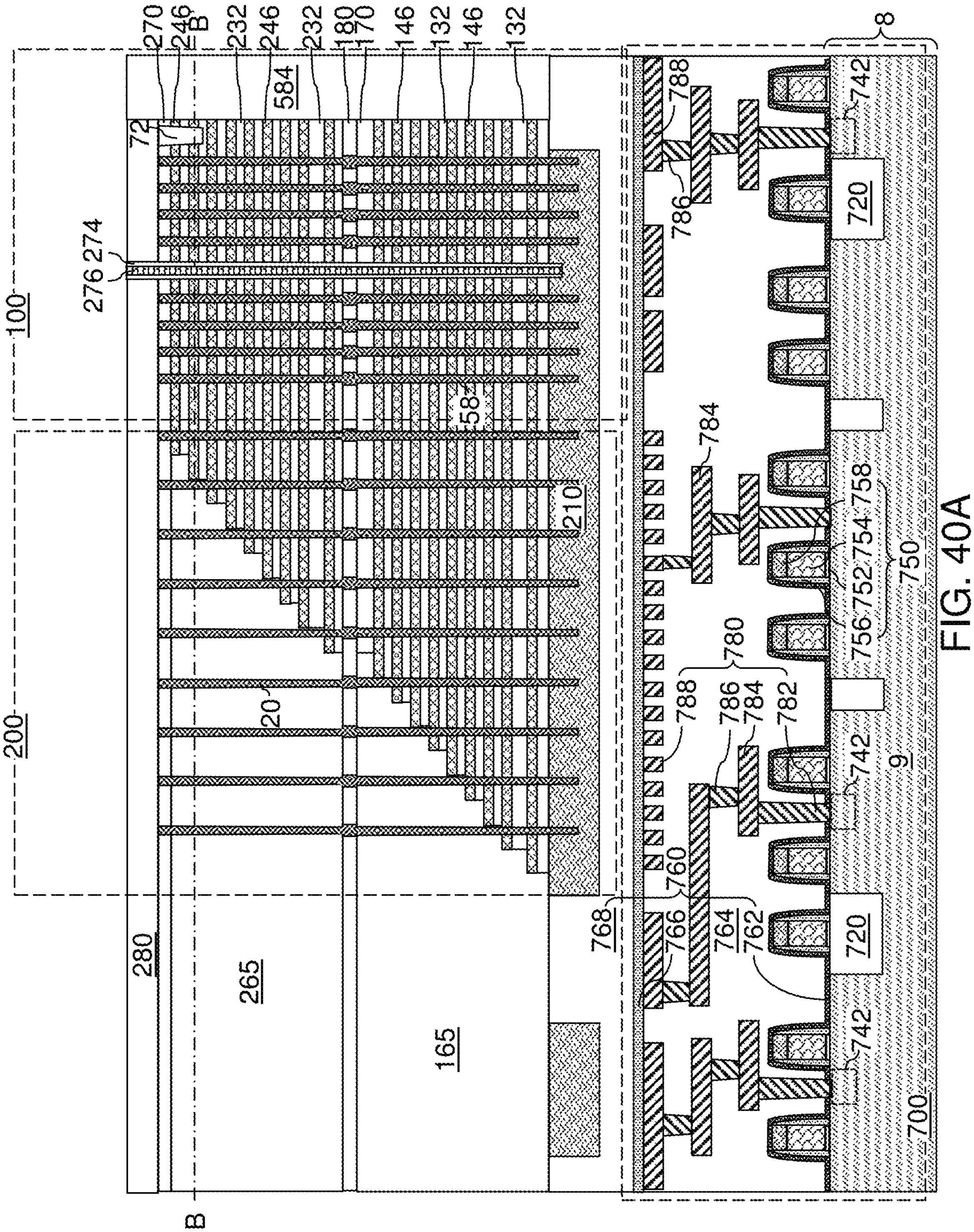
FIG. 40A is a vertical cross-sectional view of the second exemplary structure after formation of backside trench fill structures in the backside trenches according to an embodiment of the present disclosure.
Figure 40B:
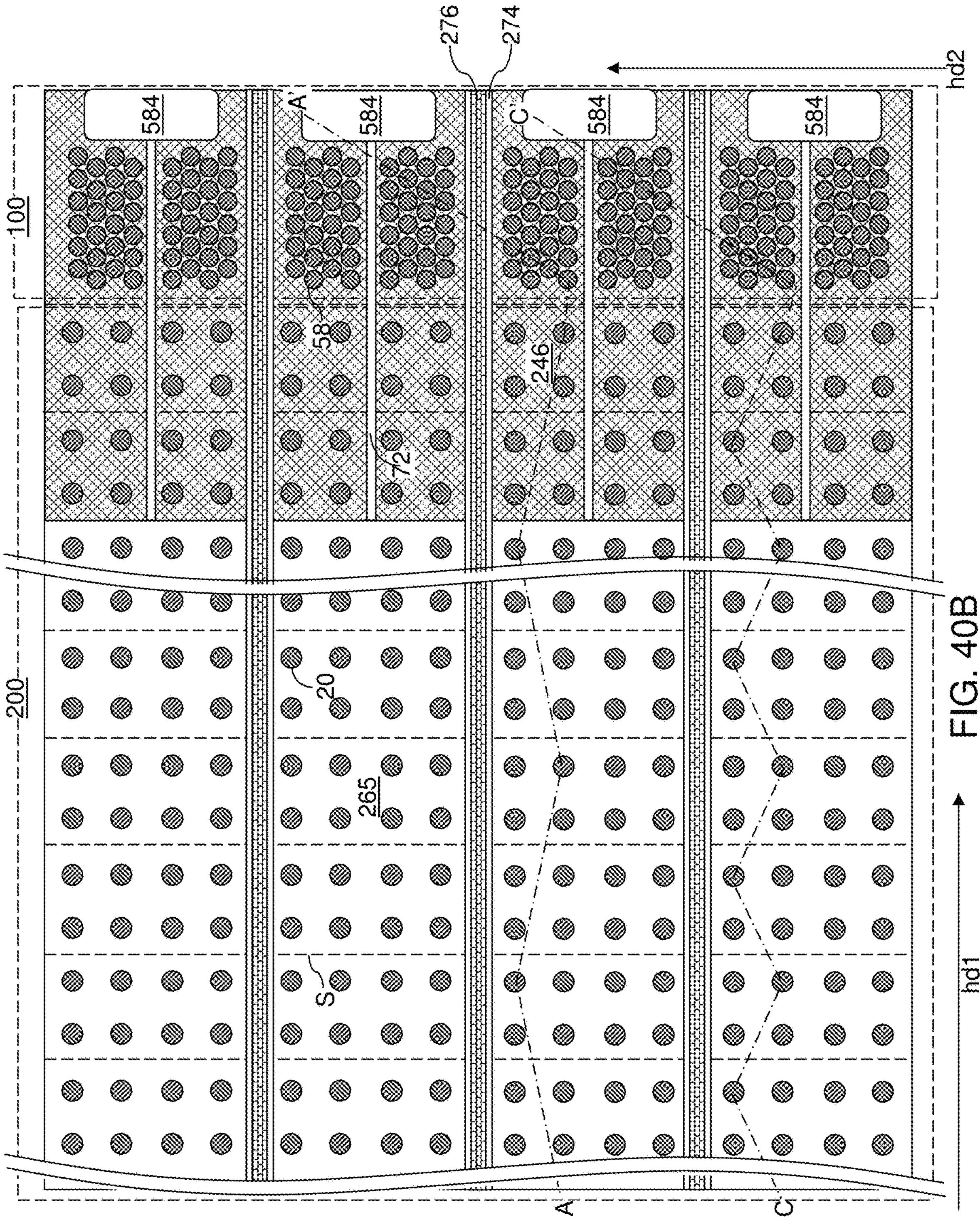
FIG. 40B is a horizontal cross-sectional view of the second exemplary structure along the horizontal plane B-B' of FIG. 40A. The hinged vertical plane A-A' corresponds to the plane of the vertical cross-sectional view of FIG. 40A.
Figure 40C:
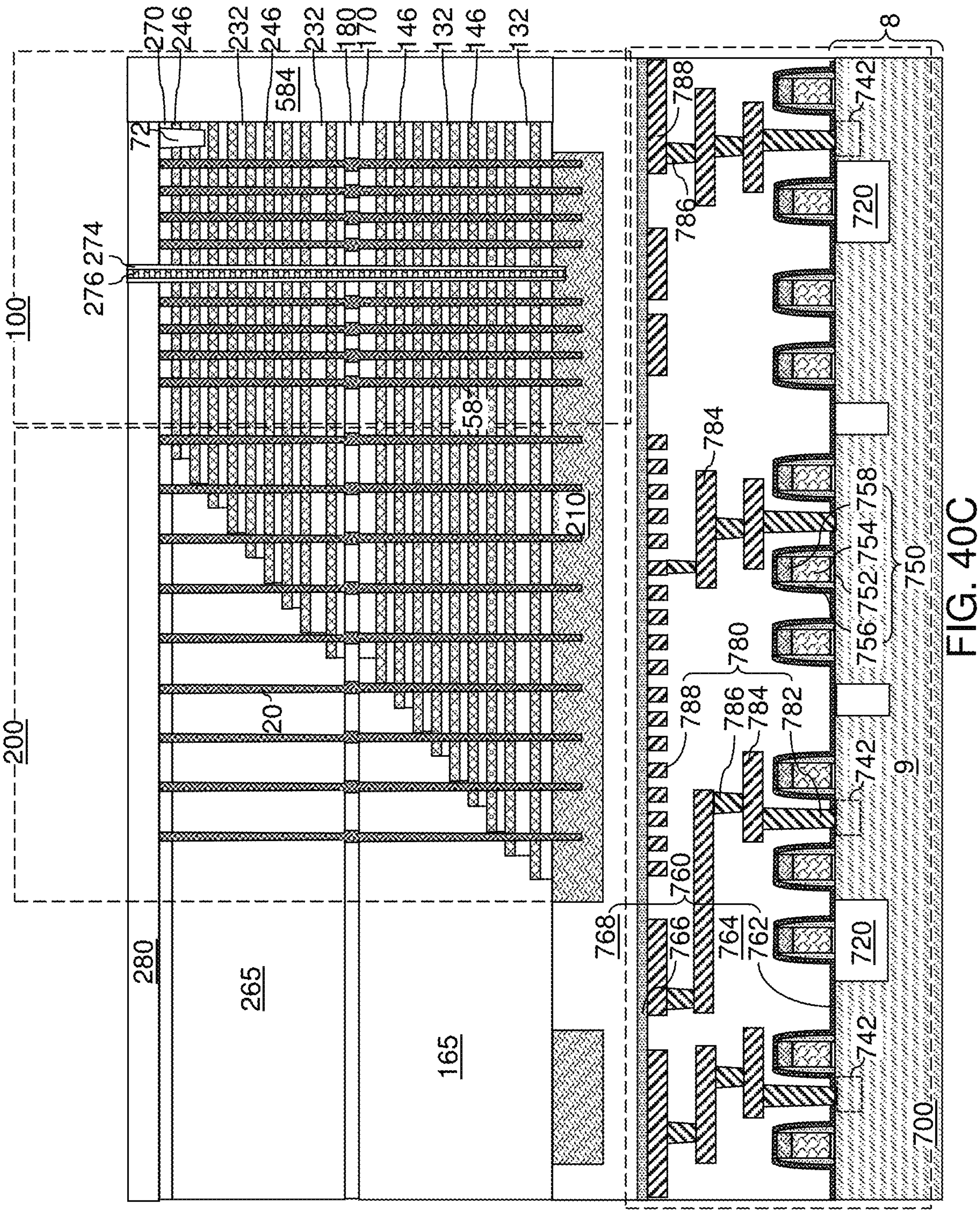
FIG. 40C is a vertical cross-sectional view of the second exemplary structure along the vertical plane C-C' of FIG. 40B.
Figure 40D:
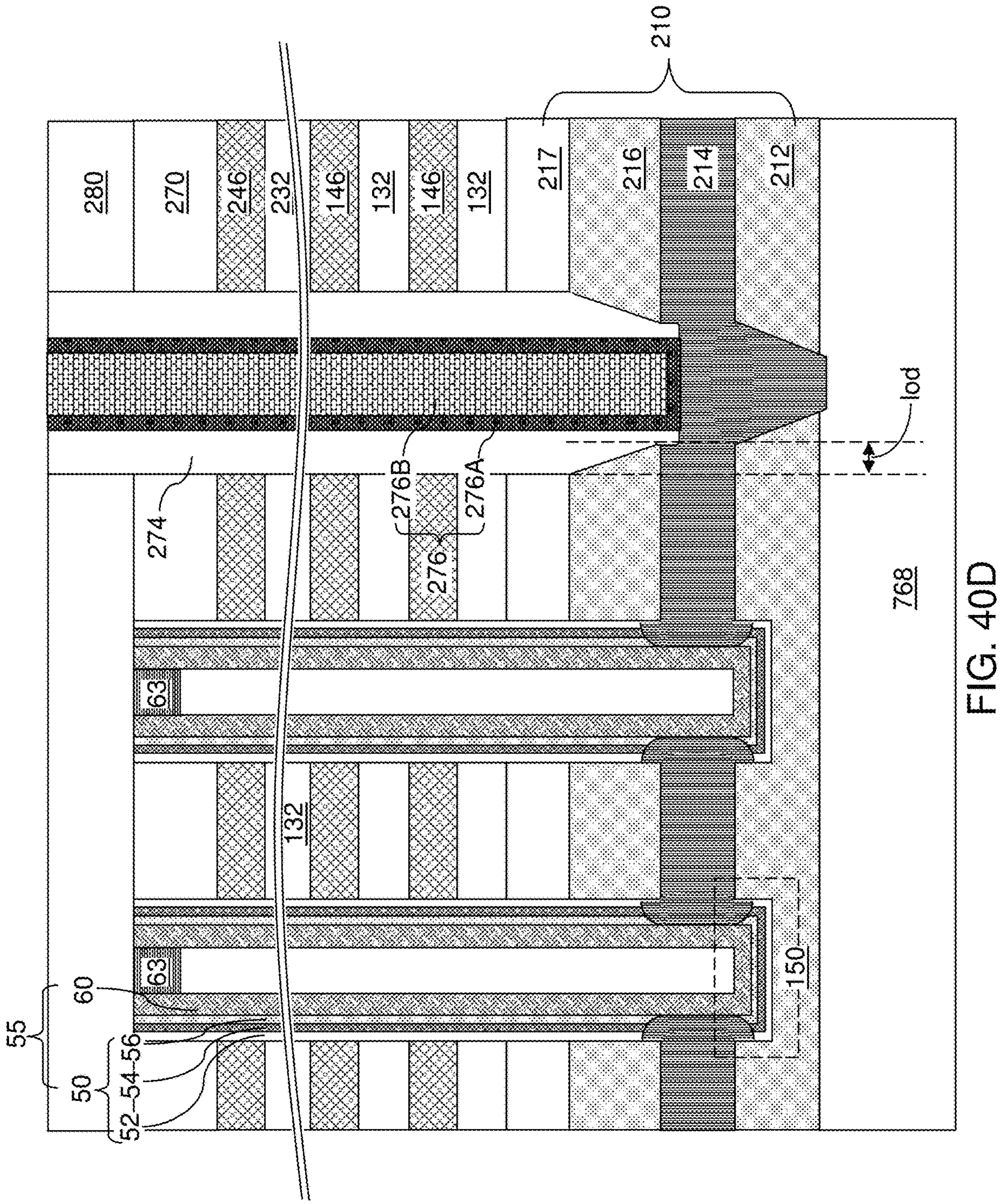
FIG. 40D is a vertical cross-sectional view of a region including memory opening fill structures and a backside trench at the processing steps of FIGS. 40A-40C.

Referring to FIGS. 39A-39C, a backside blocking dielectric layer (not shown) may be optionally deposited in the backside recesses (143, 243) and the backside trenches 79 and over the first contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (143, 243), on the sidewalls of the backside trenches 79, and over the first contact-level dielectric layer 280. Generally, the backside trenches 79 can be employed as conduits for a reactant for deposition of a metallic material in the electrically conductive layers (146, 246)

The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting second exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55. The bottommost one or more electrically conductive layers 146 function as source select gate electrodes.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

Referring to FIGS. 40A-40D, a dielectric material layer may be conformally deposited in the backside trenches 79 by a conformal deposition process, and can be anisotropically etched to form insulating spacers 274. The insulating spacers 274 can include a dielectric material such as silicon oxide. A top surface of the source contact layer 214 can be physically exposed at the bottom of each cavity that is laterally surrounded by a respective insulating spacer 274. Generally, an insulating spacer 274 can be formed in each of the backside trenches 79 after formation of the source contact layer 214.

At least one conductive material can be deposited in the cavities. Excess portions of the at least one conductive material can be removed from above the horizontal plane including the top surface of the first contact-level dielectric layer 280. Each remaining portion of the at least one conductive material filling the cavities forms a source contact via structure 276. Each source contact via structure 276 can comprise a metallic barrier liner 276A including a metallic barrier material (such as TiN, TaN, or WN) and a conductive fill material portion 276B (which may include a metallic fill material and/or a heavily doped semiconductor material).

Figure 41A:
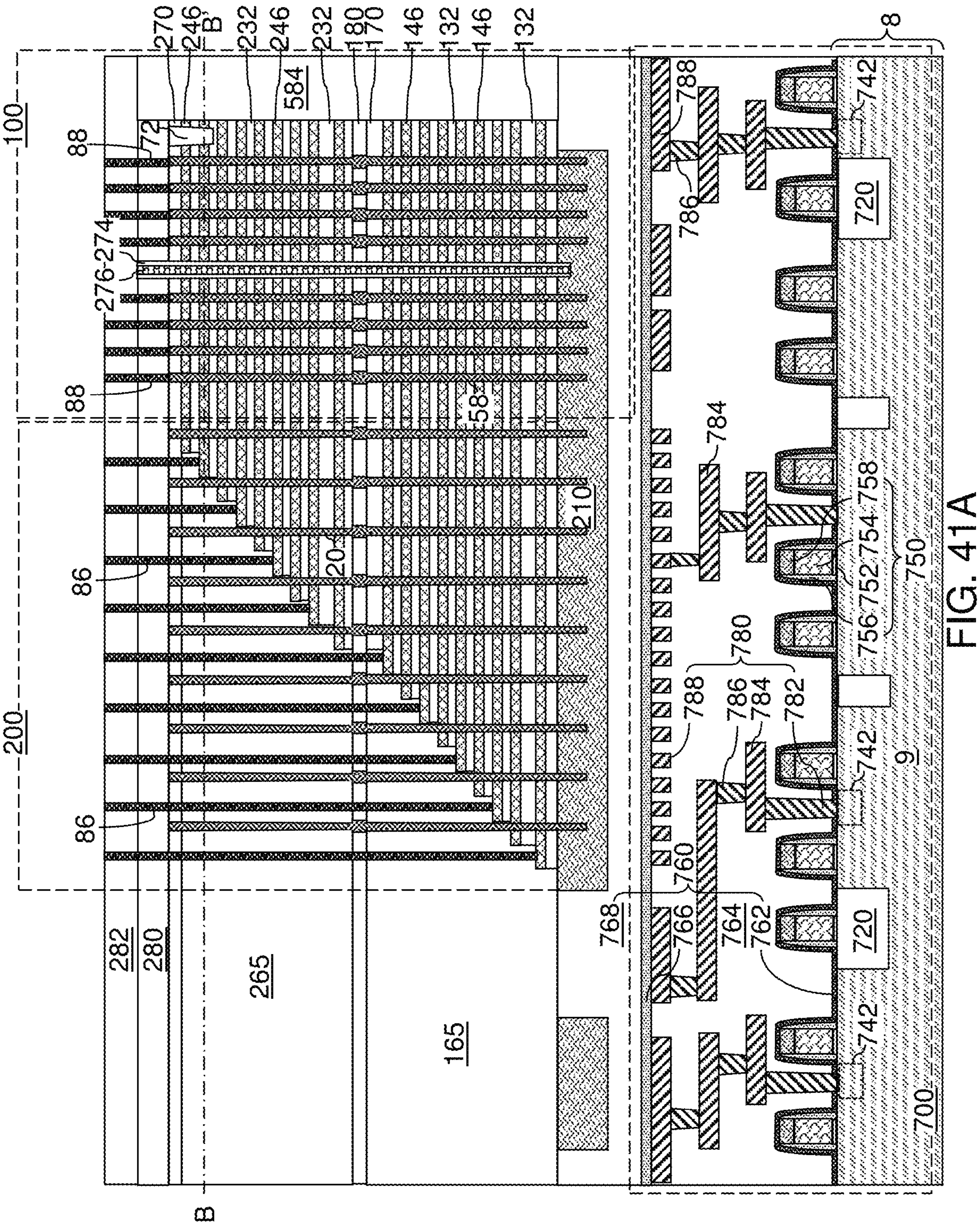
FIG. 41A is a vertical cross-sectional view of the second exemplary structure after formation of a second contact-level dielectric layer and various contact via structures according to an embodiment of the present disclosure.
Figure 41B:
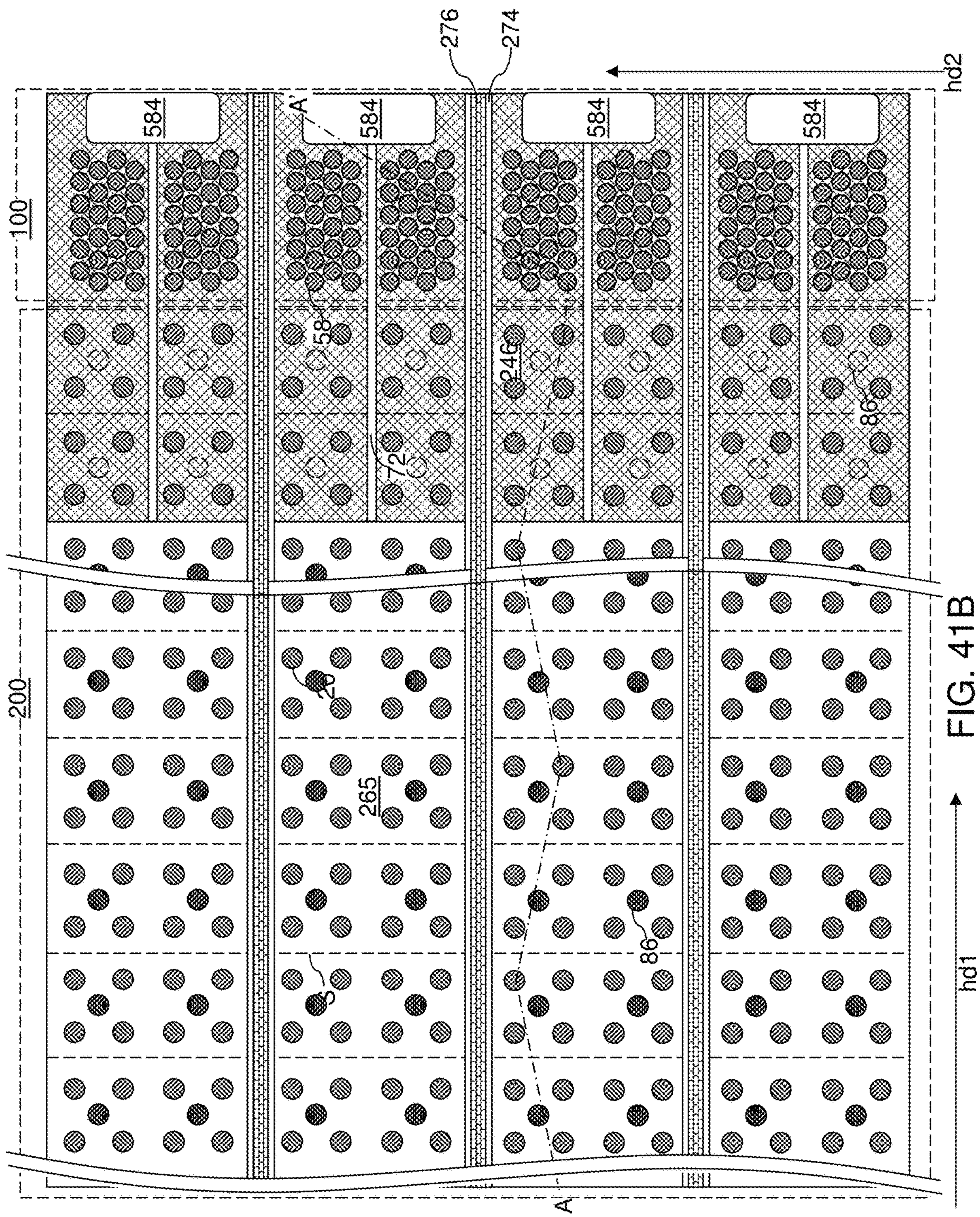
FIG. 41B is a horizontal cross-sectional view of the second exemplary structure along the vertical plane B-B' of FIG. 26A. The hinged vertical plane A-A' corresponds to the plane of the vertical cross-sectional view of FIG. 26A.

Referring to FIGS. 41A and 41B, a second contact-level dielectric layer 282 may be formed over the first contact-level dielectric layer 280. The second contact-level dielectric layer 282 includes a dielectric material such as silicon oxide, and may have a thickness in a range from 100 nm to 600 nm, although lesser and greater thicknesses may also be used.

A photoresist layer (not shown) may be applied over the second contact-level dielectric layer 282, and may be lithographically patterned to form various contact via openings. For example, openings for forming drain contact via structures may be formed in the memory array region 100, and openings for forming staircase region contact via structures may be formed in the staircase region 200. An anisotropic etch process is performed to transfer the pattern in the photoresist layer through the second and first contact-level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Figure 42:
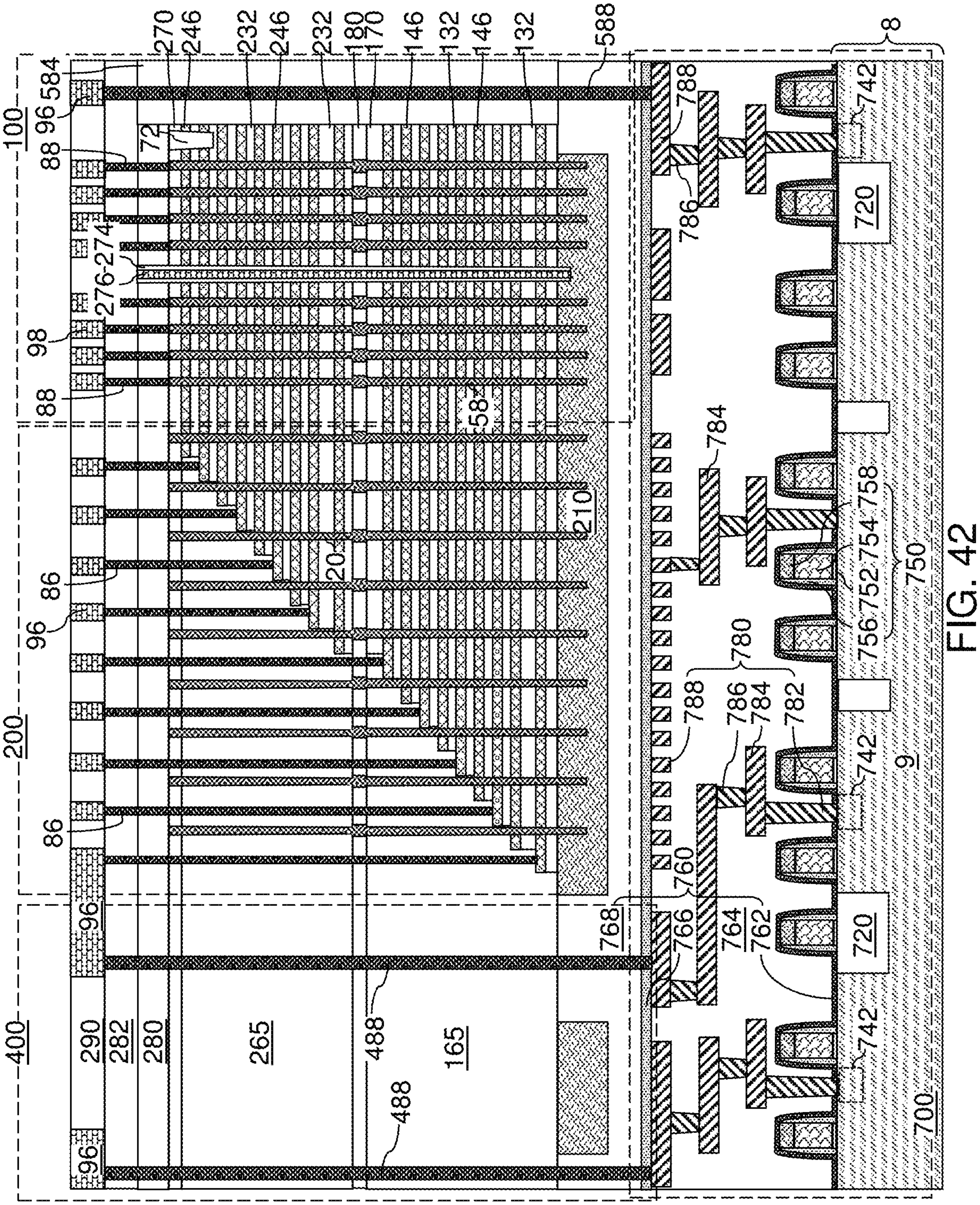
FIG. 42 is a vertical cross-sectional view of the second exemplary structure after formation of through-memory-level via structures and upper metal line structures according to an embodiment of the present disclosure.

Referring to FIG. 42, peripheral-region via cavities may be formed through the second and first contact-level dielectric layers (282, 280), the second and first retro-stepped dielectric material portions (265, 165), and the drain-side dielectric layers 768 to top surfaces of a first subset of the lower-level metal interconnect structure 780 in the peripheral device region 400. Through-memory-region via cavities may be formed through the interconnection region dielectric fill material portions 584 and the drain-side dielectric layers 768 to top surfaces of a second subset of the lower-level metal interconnect structure 780. At least one conductive material may be deposited in the peripheral-region via cavities and in the through-memory-region via cavities. Excess portions of the at least one conductive material may be removed from above the horizontal plane including the top surface of the second contact-level dielectric layer 282. Each remaining portion of the at least one conductive material in a peripheral-region via cavity constitutes a peripheral-region contact via structure 488. Each remaining portion of the at least one conductive material in a through-memory-region via cavity constitutes a through-memory-region via structure 588.

At least one additional dielectric layer may be formed over the contact-level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layers (280, 282). The upper-level metal interconnect structures may include bit lines 98 contacting a respective one of the drain contact via structures 88, and interconnection line structures 96 contacting, and/or electrically connected to, at least one of the staircase-region contact via structures 86 and/or the peripheral-region contact via structures 488 and/or the through-memory-region via structures 588. The word line contact via structures (which are provided as a subset of the staircase-region contact via structures 86) may be electrically connected to the word line driver circuit through a subset of the lower-level metal interconnect structures 780 and through a subset of the peripheral-region contact via structures 488.

FIGS. 43A-43F illustrate the steps in a method of making third exemplary structure according to third embodiment of the present disclosure. In the third embodiment, the memory openings 49 and the backside trenches 79 are formed during the same photolithography and etching steps.

Figure 43A:
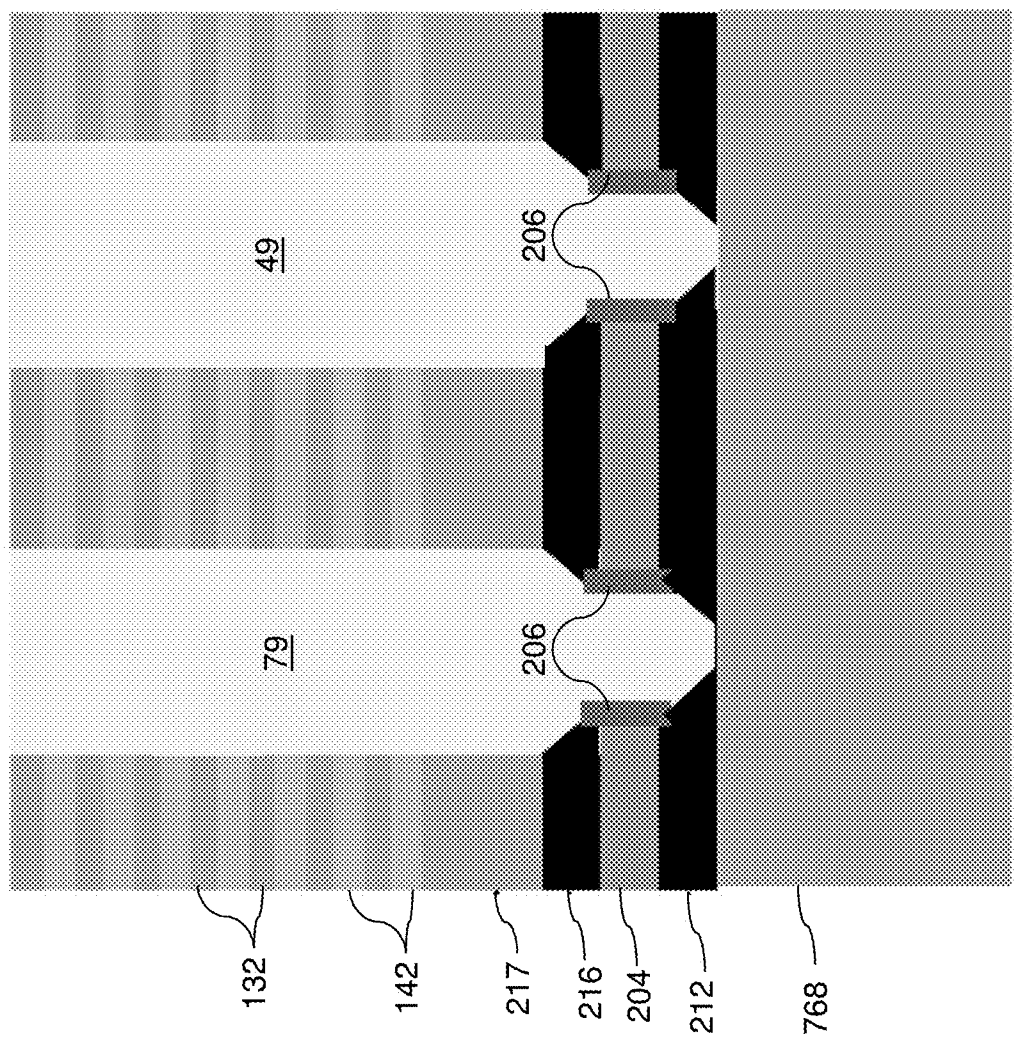
FIGS. 43A-43F illustrate sequential vertical cross-sectional views of a third exemplary structure according to an embodiment of the present disclosure.

Referring to FIG. 43A, the memory openings 49 and the backside trenches 79 are formed during the same anisotropic etching step using the same mask (e.g., patterned photoresist layer and/or hard mask). The side surface of the source-level sacrificial layer 204 exposed in the backside trenches 79 and the memory openings 49 is oxidized to form cover silicon oxide regions 206.

Figure 43B:
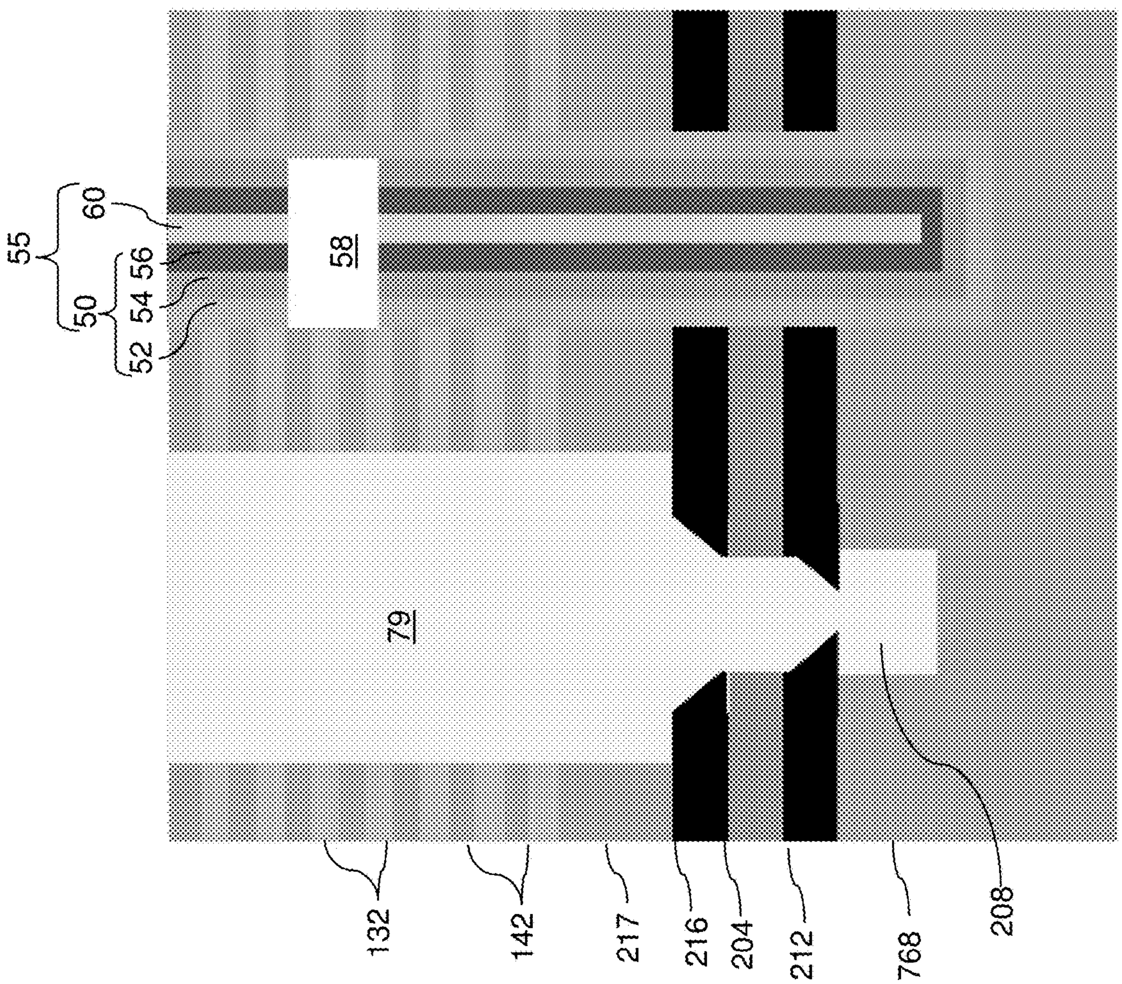

Referring to FIG. 43B, the memory opening fill structures 58 are formed in the memory openings 49 using the steps described above with respect to the first and second embodiments, while the backside trenches 79 are filled with a sacrificial fill material, such as amorphous silicon. In this embodiment, the dielectric cores 62 are optional and may be present or omitted. The sacrificial fill material is then removed from the backside trenches 79 by selective wet etching after formation of the memory opening fill structures 58. The cover silicon oxide regions 206 protect the source-level sacrificial layer 204 during this removal step.

The cover silicon oxide regions 206 are then removed by selective wet etching. The selective etching forms a rail shaped trench 208 in the silicon oxide layer 768 located below the lower source-level dielectric etch-stop layer 212. This selective wet etch may also widen the backside trenches 79, especially at the levels of the insulating layers (132, 232) which may also comprise silicon oxide.

Figure 43C:
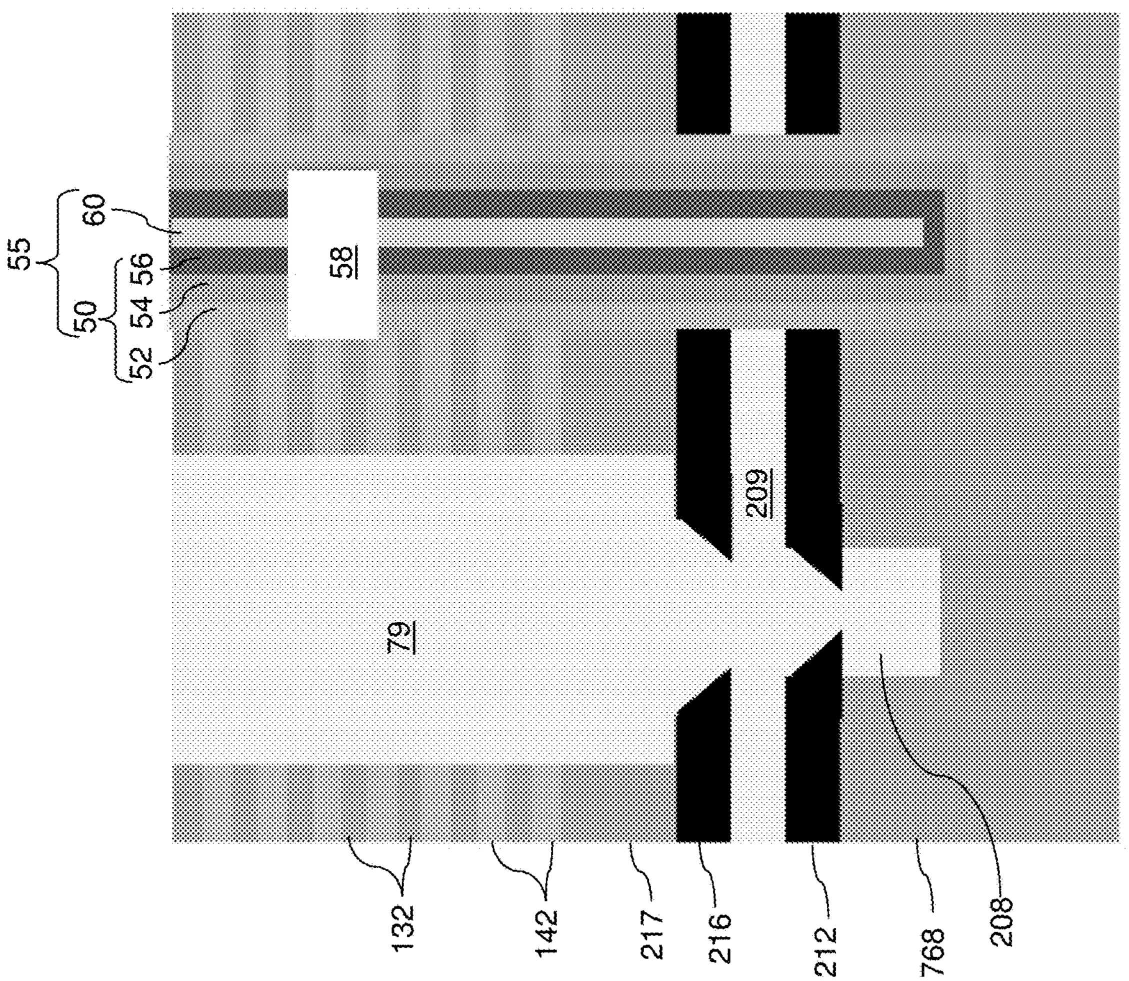

Referring to FIG. 43C, the step described above with respect to FIG. 36B is performed to selectively remove the source-level sacrificial layer 204 to form the source cavity 209 without forming sidewall spacers on the alternating stacks.

Figure 43D:
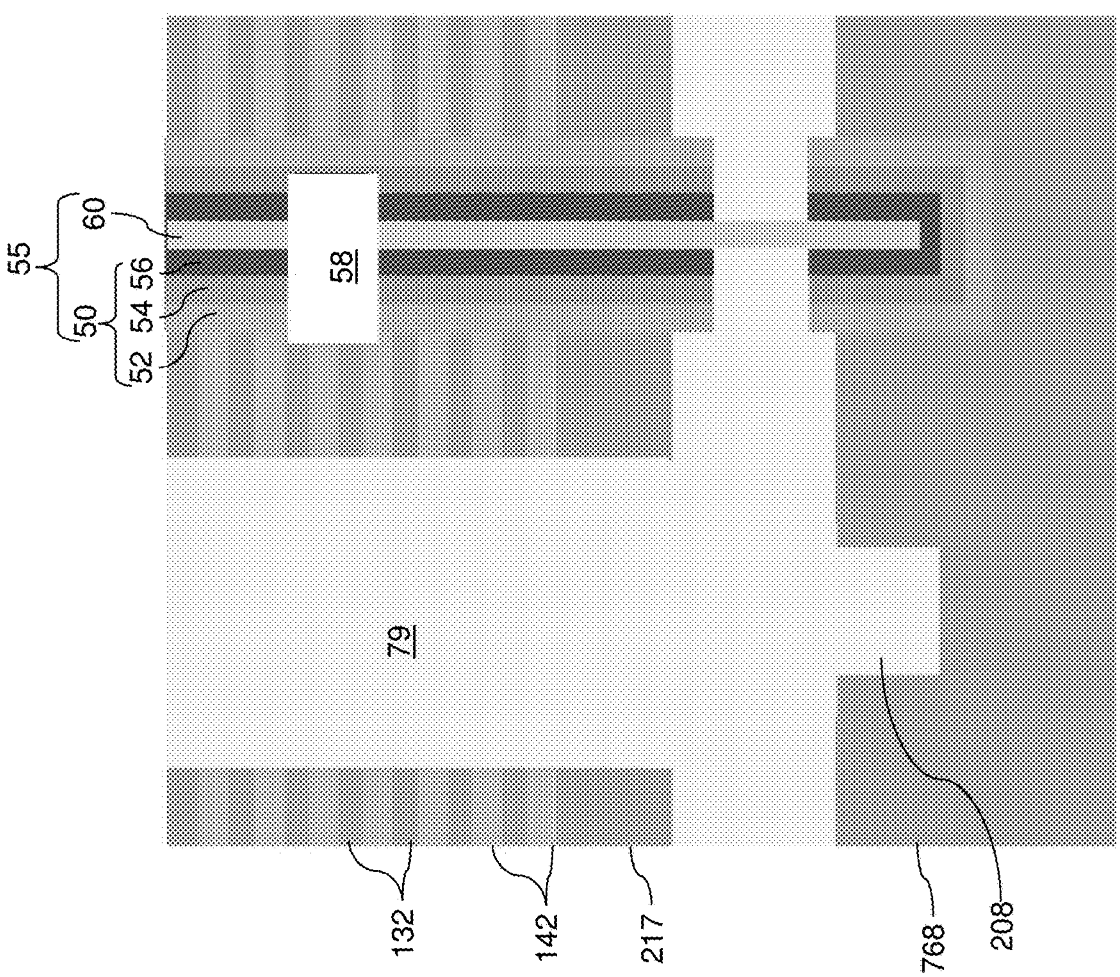

Referring to FIG. 43D, the step described above with respect to FIG. 36C is performed to remove portions of the memory films 50 exposed in the source cavity 209 by selective etching. Since the silicon oxide blocking dielectric layer 52 of the memory film 50 is relatively thin, only a small widening of the backside trench 79 at the levels of the silicon oxide insulating layers (132, 232) occurs during the etching of the blocking dielectric (e.g., during a dilute hydrofluoric acid etching step). Sidewalls of the vertical semiconductor channel 60 are exposed in the source cavity 209.

If desired, the lower and upper silicon oxycarbide source-level dielectric etch-stop layers (212, 216) may also be removed by selective etching or converted to silicon oxide by oxidation before etching of the memory film 50. The silicon oxide of the lower upper source-level dielectric etch-stop layer 212 merges with the underlying silicon oxide layer 768, while the silicon oxide of the upper source-level dielectric etch-stop layer 216 merges with the overlying silicon oxide source-level insulating layer 217. Alternatively, the lower and upper silicon oxycarbide source-level dielectric etch-stop layers (212, 216) may be retained in the completed memory device.

Figure 43E:
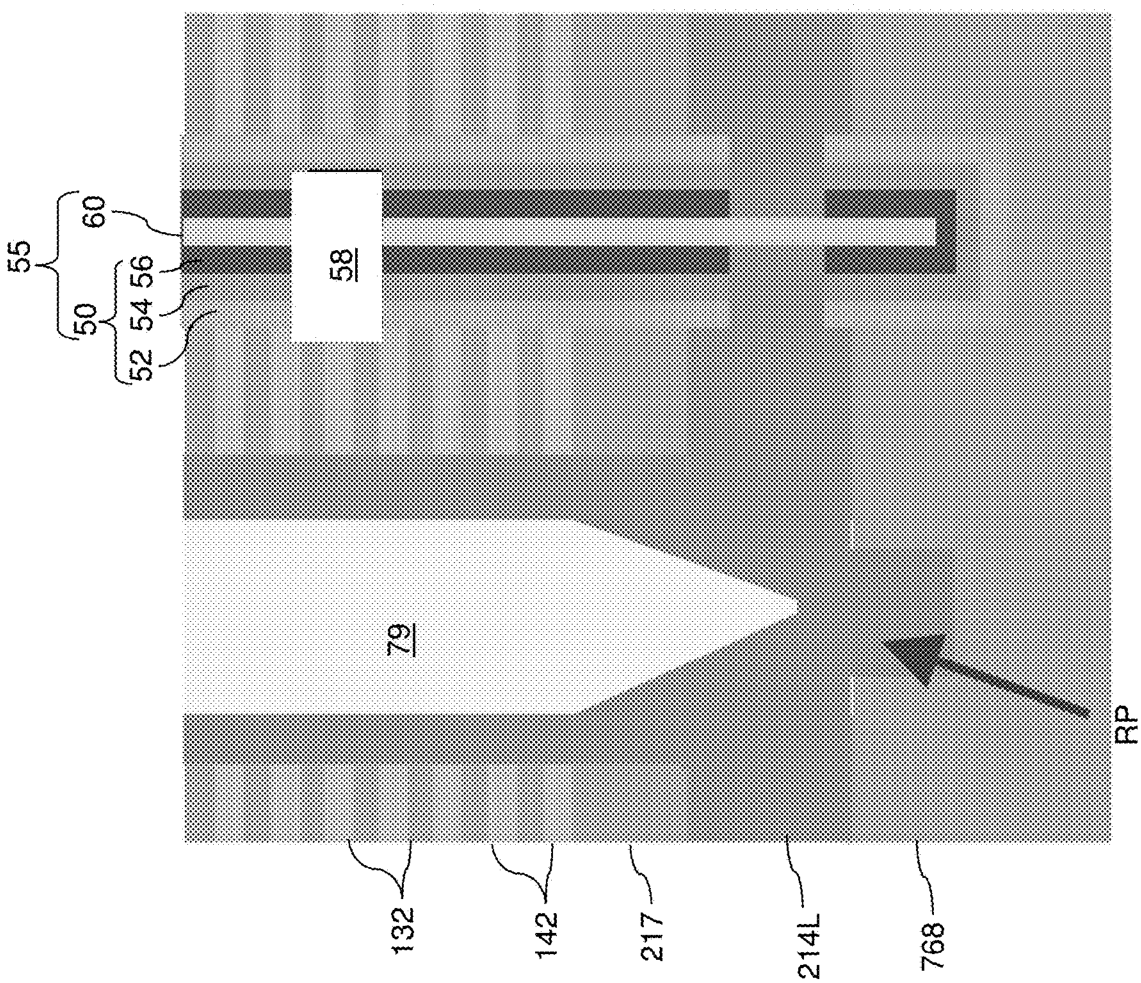

Referring to FIG. 43E, the step described above with respect to FIG. 36D is performed to form the continuous source contact layer 214L in the backside trenches 79 and in the source cavity 209.

Figure 43F:
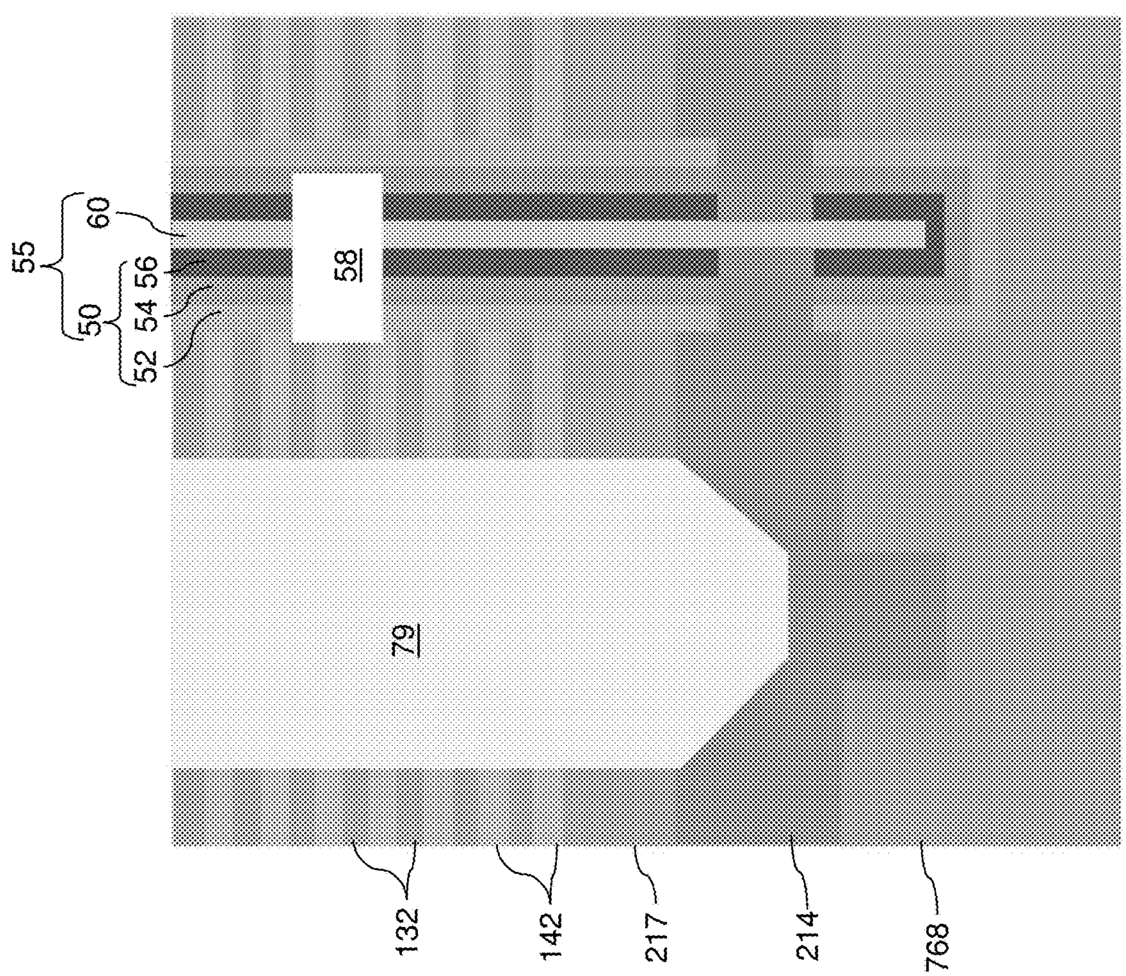

Referring to FIG. 43F, the step described above with respect to FIG. 36E is performed to etch the continuous source contact layer 214L to form the source contact layer 214. The method of the third embodiment then continues to perform the steps described above with respect to FIGS. 36F to 42 of the second embodiment.

The embodiments of the present disclosure form a source contact layer without forming sidewall spacers on the alternating stack during sacrificial layer removal. This simplifies the process and reduces the number of process steps. Since the spacers are omitted, the width of the backside trench may be reduced since there is no concern that the spacers will completely clog the backside trench. Furthermore, the CD bias of the backside trench is reduced because a spacer removal step is omitted. The source contact layer thickness is more uniform and variation in thickness of this layer at different distances from the backside trench is reduced due to the presence of the silicon oxycarbide etch-stop layers, which provide a uniform height source cavity. Furthermore, the backside trench and the memory opening can be formed during the same etching step in the third embodiment to further reduce the number of lithography and etching steps.

Referring to all drawings and according to various embodiments of the present disclosure, a three-dimensional memory device is provided, which comprises: source-level material layers 210 located over a substrate 8 and comprising, from bottom to top, a lower source-level dielectric etch-stop layer 212, a source contact layer 214, and an upper source-level dielectric etch-stop layer 216; alternating stacks {(132, 146), (232, 246)} of insulating layers (131, 232) and electrically conductive layers (146, 246) located over the source-level material layers 210; backside trenches 79 laterally extending along a first horizontal direction hd1 and vertically extending between the alternating stacks {(132, 146), (232, 246)} and through the upper source-level dielectric etch-stop layer 216, wherein segments of sidewalls of the backside trenches 79 located on the upper source-level dielectric etch-stop layer 216 are tapered at a first taper angle α with respect to a vertical direction; memory openings 49 vertically extending through the alternating stacks {(132, 146), (232, 246)}; and memory opening fill structures 58 located in the memory openings 49 and comprising a respective vertical semiconductor channel 60 and a respective memory film 50, wherein the source contact layer 214 laterally surrounds and contacts a bottom end portion of each of the vertical semiconductor channels 60.

In one embodiment, segments of sidewalls of the backside trenches 79 located on the alternating stacks {(132, 146), (232, 246)} are vertical or have a taper angle (which may be in a range from 0 degree to 6 degrees such as from 0 degree to 3 degrees) that is less than the first taper angle α.

In one embodiment, the source contact layer 214 comprises: planar portions located above a horizontal plane including a top surface of the lower source-level dielectric etch-stop layer 212; and rail portions RP that protrude downward below the horizontal plane including the top surface of the lower source-level dielectric etch-stop layer 212. In one embodiment, each of the rail portions RP of the source contact layer 214 underlies a respective one of the backside trenches 79, and is located entirely within an area defined by a periphery of the respective one of the backside trenches 79 located within a horizontal plane including bottommost surfaces of the alternating stack {(132, 146), (232, 246)}. In one embodiment, each of the rail portions RP of the source contact layer 214 comprises an upper periphery that is located within the horizontal plane including the top surface of the lower source-level dielectric etch-stop layer 212 and is laterally offset inward from the periphery of the respective one of the backside trenches 79 by a lateral offset distance lod. In one embodiment, sidewalls of the rail portions RP of the source contact layer have a second taper angle β that is within a range from 70% to 130% of the first taper angle.

In one embodiment, a bottom surface of the upper source-level dielectric etch-stop layer 216 and a top surface of the lower source-level dielectric etch-stop layer 212 have elongated openings that laterally extend along the first horizontal direction hd1; and each elongated opening through the top surface of the lower source-level dielectric etch-stop layer 212 is vertically coincident with or is laterally offset inward from a respective elongated opening through the bottom surface of the upper source-level dielectric etch-stop layer 216 in a plan view.

In one embodiment, the lower source-level dielectric etch-stop layer 212 and the upper source-level dielectric etch-stop layer 216 comprise carbon at an atomic concentration in a range from 2% to 30%. In one embodiment, each of the lower source-level dielectric etch-stop layer 212 and the upper source-level dielectric etch-stop layer 216 comprises silicon oxide carbide.

In one embodiment, the entirety of the source contact layer 214 can be a unitary structure that continuously extends underneath the alternating stacks {(132, 146), (232, 246)} and has a homogeneous material composition throughout.

In one embodiment, the vertical semiconductor channels 60 comprise a first doped semiconductor material having a doping of a first conductivity type; and the source contact layer 214 comprises a second doped semiconductor material having a doping of a second conductivity type that is the opposite of the first conductivity type. In one embodiment, the memory films 50 comprise outer sidewalls that contact the upper source-level dielectric etch-stop layer 216; and the three-dimensional memory device comprises dielectric cap structures 150 embedded in the lower source-level dielectric etch-stop layer 212, contacting a bottom end of a respective one of the vertical semiconductor channels 60, and comprising a stack of dielectric materials having a same set of dielectric materials as each of the memory films 50.

In one embodiment, a three-dimensional memory device comprises: source-level material layers 210 located over a substrate 8 and comprising, from bottom to top, a lower silicon oxide carbide source-level dielectric etch-stop layer 212, a source contact layer 214, and an upper silicon oxide carbide source-level dielectric etch-stop layer 216; alternating stacks {(132, 146), (232, 246)} of insulating layers (131, 232) and electrically conductive layers (146, 246) located over the source-level material layers 210; backside trenches 79 laterally extending along a first horizontal direction hd1 and vertically extending between the alternating stacks {(132, 146), (232, 246)} and through the upper source-level dielectric etch-stop layer 216; memory openings 49 vertically extending through the alternating stacks {(132, 146), (232, 246)}; and memory opening fill structures 58 located in the memory openings 49 and comprising a respective vertical semiconductor channel 60 and a respective memory film 50, wherein the source contact layer 214 laterally surrounds and contacts a bottom end portion of each of the vertical semiconductor channels 60.

In one embodiment, the three-dimensional memory device comprises a monolithic three-dimensional NAND memory device, the electrically conductive strips (146, 246) comprise, or are electrically connected to, a respective word line of the monolithic three-dimensional NAND memory device, the substrate 8 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate may contain an integrated circuit comprising a driver circuit for the memory device located thereon, the electrically conductive strips (146, 246) comprise a plurality of control gate electrodes having a strip shape extending substantially parallel to the top surface of the substrate 8, the plurality of control gate electrodes comprise at least a first control gate electrode located in the first device level and a second control gate electrode located in the second device level. The array of monolithic three-dimensional NAND strings comprises a plurality of semiconductor channels 60, wherein at least one end portion of each of the plurality of semiconductor channels 60 extends substantially perpendicular to a top surface of the substrate 8, and one of the plurality of semiconductor channels including the vertical semiconductor channel 60. The array of monolithic three-dimensional NAND strings comprises a plurality of charge storage elements (comprising portions of the memory films 50), each charge storage element located adjacent to a respective one of the plurality of semiconductor channels 60.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:

source-level material layers located over a substrate and comprising, from bottom to top, a lower source-level dielectric etch-stop layer, a source contact layer, and an upper source-level dielectric etch-stop layer;

alternating stacks of insulating layers and electrically conductive layers located over the source-level material layers;

backside trenches laterally extending along a first horizontal direction and vertically extending between the alternating stacks and through the upper source-level dielectric etch-stop layer, wherein segments of sidewalls of the backside trenches located on the upper source-level dielectric etch-stop layer are tapered at a first taper angle with respect to a vertical direction;

memory openings vertically extending through the alternating stacks; and memory opening fill structures located in the memory openings and comprising a respective vertical semiconductor channel and a respective memory film, wherein the source contact layer laterally surrounds and contacts a bottom end portion of each of the vertical semiconductor channels;

wherein:

a bottom surface of the upper source-level dielectric etch-stop layer and a top surface of the lower source-level dielectric etch-stop layer have elongated openings that laterally extend along the first horizontal direction; and each elongated opening through the top surface of the lower source-level dielectric etch-stop layer is vertically coincident with or is laterally offset inward from a respective elongated opening through the bottom surface of the upper source-level dielectric etch-stop layer in a plan view.

2. The three-dimensional memory device of claim 1, wherein segments of sidewalls of the backside trenches located on the alternating stacks are vertical or have a taper angle that is less than the first taper angle.

3. The three-dimensional memory device of claim 1, wherein the source contact layer comprises:

planar portions located above a horizontal plane including a top surface of the lower source-level dielectric etch-stop layer; and rail portions that protrude downward below the horizontal plane including the top surface of the lower source-level dielectric etch-stop layer.

4. The three-dimensional memory device of claim 3, wherein each of the rail portions of the source contact layer underlies a respective one of the backside trenches, and is located entirely within an area defined by a periphery of the respective one of the backside trenches located within a horizontal plane including bottommost surfaces of the alternating stack.

5. The three-dimensional memory device of claim 4, wherein each of the rail portions of the source contact layer comprises an upper periphery that is located within the horizontal plane including the top surface of the lower source-level dielectric etch-stop layer and is laterally offset inward from the periphery of the respective one of the backside trenches by a lateral offset distance.

6. The three-dimensional memory device of claim 3, wherein sidewalls of the rail portions of the source contact layer have a second taper angle that is within a range from 70% to 130% of the first taper angle.

7. The three-dimensional memory device of claim 1, wherein the lower source-level dielectric etch-stop layer and the upper source-level dielectric etch-stop layer comprise carbon at an atomic concentration in a range from 2% to 30%.

8. The three-dimensional memory device of claim 1, wherein each of the lower source-level dielectric etch-stop layer and the upper source-level dielectric etch-stop layer comprises silicon oxide carbide.

9. The three-dimensional memory device of claim 1, wherein an entirety of the source contact layer is a unitary structure that continuously extends underneath the alternating stacks and has a homogeneous material composition throughout.

10. The three-dimensional memory device of claim 1, wherein:

the vertical semiconductor channels comprise a first doped semiconductor material having a doping of a first conductivity type;

the source contact layer comprises a second doped semiconductor material having a doping of a second conductivity type that is the opposite of the first conductivity type;

the memory films comprise outer sidewalls that contact the upper source-level dielectric etch-stop layer; and the three-dimensional memory device comprises dielectric cap structures embedded in the lower source-level dielectric etch-stop layer, contacting a bottom end of a respective one of the vertical semiconductor channels, and comprising a stack of dielectric materials having a same set of dielectric materials as each of the memory films.

11. A method of forming a three-dimensional memory device, comprising:

forming in-process source-level material layers comprising, from bottom to top, a lower source-level dielectric etch-stop layer, a source-level sacrificial layer, and an upper source-level dielectric etch-stop layer over a substrate;

forming an alternating stack of insulating layers and sacrificial material layers over the in-process source-level material layers;

forming memory openings through the alternating stack and into the in-process source-level material layers;

forming memory opening fill structures in the memory openings, wherein each of the memory opening fill structures comprises a respective vertical semiconductor channel and a respective memory film;

forming backside openings through the alternating stack and into the in-process source-level material layers;

forming a source cavity by removing the source-level sacrificial layer selective to materials of the alternating stack, the upper source-level dielectric etch-stop layer, and the lower source-level dielectric etch-stop layer through the backside openings without sidewall spacers being located on the alternating stack in the backside openings;

forming a continuous source contact layer in the source cavity and in peripheral portions of the backside openings;

removing portions of the continuous source contact layer overlying the first tapered surfaces by performing an isotropic etch process, wherein remaining portions of the continuous source contact layer comprise a source contact layer; and replacing the sacrificial material layers with electrically conductive layers through the backside openings.

12. The method of claim 11, wherein:

the backside openings comprise backside trenches;

the backside trenches are formed by performing an anisotropic etch process employing an etchant gas; and each of the upper source-level dielectric etch-stop layer and the lower source-level dielectric etch-stop layer has a higher etch resistance to the etchant gas than materials of the alternating stack, such that first tapered surfaces having a first taper angle are formed through the upper source-level dielectric etch-stop layer and second tapered surfaces having a second taper angle are formed through the lower source-level dielectric etch-stop layer.

13. The method of claim 12, wherein the lower source-level dielectric etch-stop layer and the upper source-level dielectric etch-stop layer comprise carbon at an atomic concentration in a range from 2% to 30%.

14. The method of claim 13, wherein each of the lower source-level dielectric etch-stop layer and the upper source-level dielectric etch-stop layer comprise silicon oxide carbide.

15. The method of claim 12, further comprising isotropically etching physically exposed portions of the memory films after formation of the source cavity, wherein:

cylindrical sidewalls of the vertical semiconductor channels are physically exposed; and the continuous source contact layer is formed on the cylindrical sidewalls of the vertical semiconductor channels.

16. The method of claim 12, further comprising:

forming an insulating spacer in each of the backside trenches after formation of the source contact layer; and forming source contact via structures within cavities that are laterally surrounded by a respective one of the insulating spacers directly on the source contact layer.

17. The method of claim 12, further comprising forming a dielectric material layer over the substrate, wherein:

the in-process source-level material layers are formed over the dielectric material layer;

the source-level sacrificial layer comprises a semiconductor material;

the vertical semiconductor channel comprise a doped semiconductor material having a doping of a first conductivity type; and the continuous source contact layer comprises a doped semiconductor material having a doping of a second conductivity type that is the opposite of the first conductivity type.

18. The method of claim 12, wherein the memory openings and the backside trenches are formed during a same etching step.

19. A three-dimensional memory device, comprising:

source-level material layers located over a substrate and comprising, from bottom to top, a lower source-level dielectric etch-stop layer, a source contact layer, and an upper source-level dielectric etch-stop layer;

alternating stacks of insulating layers and electrically conductive layers located over the source-level material layers;

backside trenches laterally extending along a first horizontal direction and vertically extending between the alternating stacks and through the upper source-level dielectric etch-stop layer, wherein segments of sidewalls of the backside trenches located on the upper source-level dielectric etch-stop layer are tapered at a first taper angle with respect to a vertical direction;

memory openings vertically extending through the alternating stacks; and memory opening fill structures located in the memory openings and comprising a respective vertical semiconductor channel and a respective memory film, wherein the source contact layer laterally surrounds and contacts a bottom end portion of each of the vertical semiconductor channels;

wherein the source contact layer comprises:

planar portions located above a horizontal plane including a top surface of the lower source-level dielectric etch-stop layer; and rail portions that protrude downward below the horizontal plane including the top surface of the lower source-level dielectric etch-stop layer; and wherein each of the rail portions of the source contact layer underlies a respective one of the backside trenches, and is located entirely within an area defined by a periphery of the respective one of the backside trenches located within a horizontal plane including bottommost surfaces of the alternating stack.

20. A three-dimensional memory device, comprising:

source-level material layers located over a substrate and comprising, from bottom to top, a lower source-level dielectric etch-stop layer, a source contact layer, and an upper source-level dielectric etch-stop layer;

alternating stacks of insulating layers and electrically conductive layers located over the source-level material layers;

backside trenches laterally extending along a first horizontal direction and vertically extending between the alternating stacks and through the upper source-level dielectric etch-stop layer, wherein segments of sidewalls of the backside trenches located on the upper source-level dielectric etch-stop layer are tapered at a first taper angle with respect to a vertical direction;

memory openings vertically extending through the alternating stacks; and memory opening fill structures located in the memory openings and comprising a respective vertical semiconductor channel and a respective memory film, wherein the source contact layer laterally surrounds and contacts a bottom end portion of each of the vertical semiconductor channels;

wherein the source contact layer comprises:

planar portions located above a horizontal plane including a top surface of the lower source-level dielectric etch-stop layer; and rail portions that protrude downward below the horizontal plane including the top surface of the lower source-level dielectric etch-stop layer; and wherein sidewalls of the rail portions of the source contact layer have a second taper angle that is within a range from 70% to 130% of the first taper angle.

21. A three-dimensional memory device, comprising:

source-level material layers located over a substrate and comprising, from bottom to top, a lower source-level dielectric etch-stop layer, a source contact layer, and an upper source-level dielectric etch-stop layer;

alternating stacks of insulating layers and electrically conductive layers located over the source-level material layers;

backside trenches laterally extending along a first horizontal direction and vertically extending between the alternating stacks and through the upper source-level dielectric etch-stop layer, wherein segments of sidewalls of the backside trenches located on the upper source-level dielectric etch-stop layer are tapered at a first taper angle with respect to a vertical direction;

memory openings vertically extending through the alternating stacks; and memory opening fill structures located in the memory openings and comprising a respective vertical semiconductor channel and a respective memory film, wherein the source contact layer laterally surrounds and contacts a bottom end portion of each of the vertical semiconductor channels;

wherein:

the vertical semiconductor channels comprise a first doped semiconductor material having a doping of a first conductivity type;

the source contact layer comprises a second doped semiconductor material having a doping of a second conductivity type that is the opposite of the first conductivity type;

the memory films comprise outer sidewalls that contact the upper source-level dielectric etch-stop layer; and the three-dimensional memory device comprises dielectric cap structures embedded in the lower source-level dielectric etch-stop layer, contacting a bottom end of a respective one of the vertical semiconductor channels, and comprising a stack of dielectric materials having a same set of dielectric materials as each of the memory films.

* * * * *